United States Patent [19]
Hatakoshi et al.

[11] Patent Number: 6,031,858
[45] Date of Patent: Feb. 29, 2000

[54] SEMICONDUCTOR LASER AND METHOD OF FABRICATING SAME

[75] Inventors: Genichi Hatakoshi, Yokohama; Masaaki Onomura, Kawasaki; John Rennie, Tokyo; Masayuki Ishikawa, Yokohama; Shinya Nunoue, Ichikawa; Mariko Suzuki, Yokohama, all of Japan

[73] Assignee: Kabushiki Kaisha Toshiba, Kawasaki, Japan

[21] Appl. No.: 08/925,764

[22] Filed: Sep. 9, 1997

[30] Foreign Application Priority Data

Sep. 9, 1996 [JP] Japan .................................. 8-237695
Feb. 20, 1997 [JP] Japan .................................. 9-036010

[51] Int. Cl.[7] ............................................ H01S 3/19
[52] U.S. Cl. .............................. 372/46; 372/44; 372/45; 372/26; 372/29
[58] Field of Search ............................ 372/46, 26, 44, 372/29, 45

[56] References Cited

FOREIGN PATENT DOCUMENTS

| 7-183576 | 7/1995 | Japan . |
| 8-111558 | 4/1996 | Japan . |
| 8-88441 | 4/1996 | Japan . |

*Primary Examiner*—Rodney Bovernick
*Assistant Examiner*—Sung T. Kim
*Attorney, Agent, or Firm*—Oblon, Spivak, McClelland, Maier & Neustadt, P.C.

[57] ABSTRACT

A semiconductor laser is disclosed, which realizes a continuous oscillation in a fundamental transverse mode at a low operating voltage by a transverse mode control. This semiconductor laser is fabricated by forming successively the following layers on a sapphire substrate 10 in the order an n-type GaN contact layer, an n-type GaAlN cladding layer 13, an MQW active layer 16, a p-type GaAlN cladding layer 19, wherein the laser comprises a double heterostructure including a ridge in the shape of a stripe formed in the cladding layer 19 and a light confining layer 20 formed in a region except the ridge portion of the cladding layer 19 on the double heterostructure, wherein a refractive index of the light confining layer 20 is larger than that of a p-type GaAlN cladding layer.

11 Claims, 41 Drawing Sheets

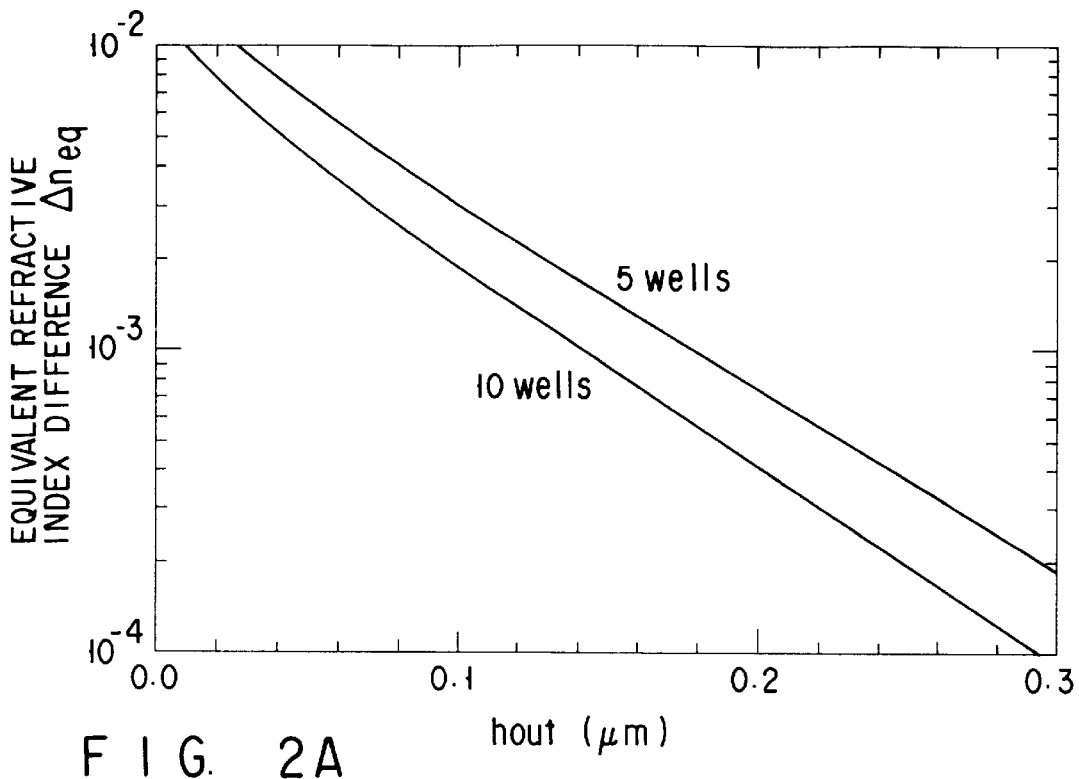
F I G. 2A
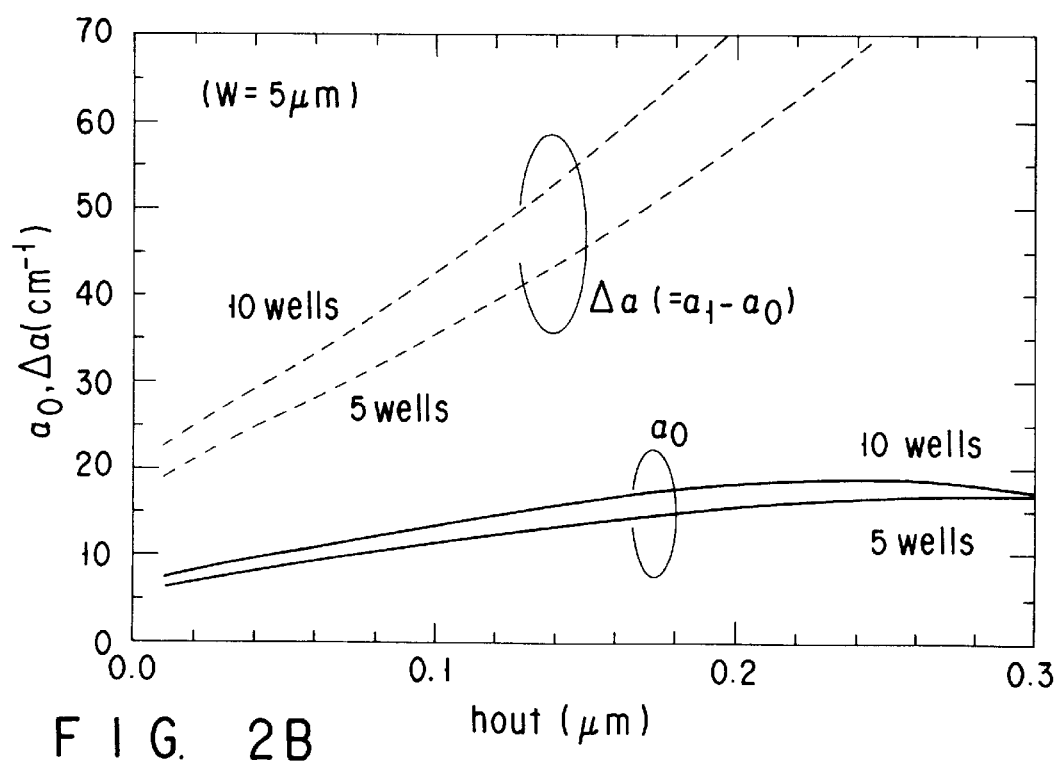
F I G. 2B

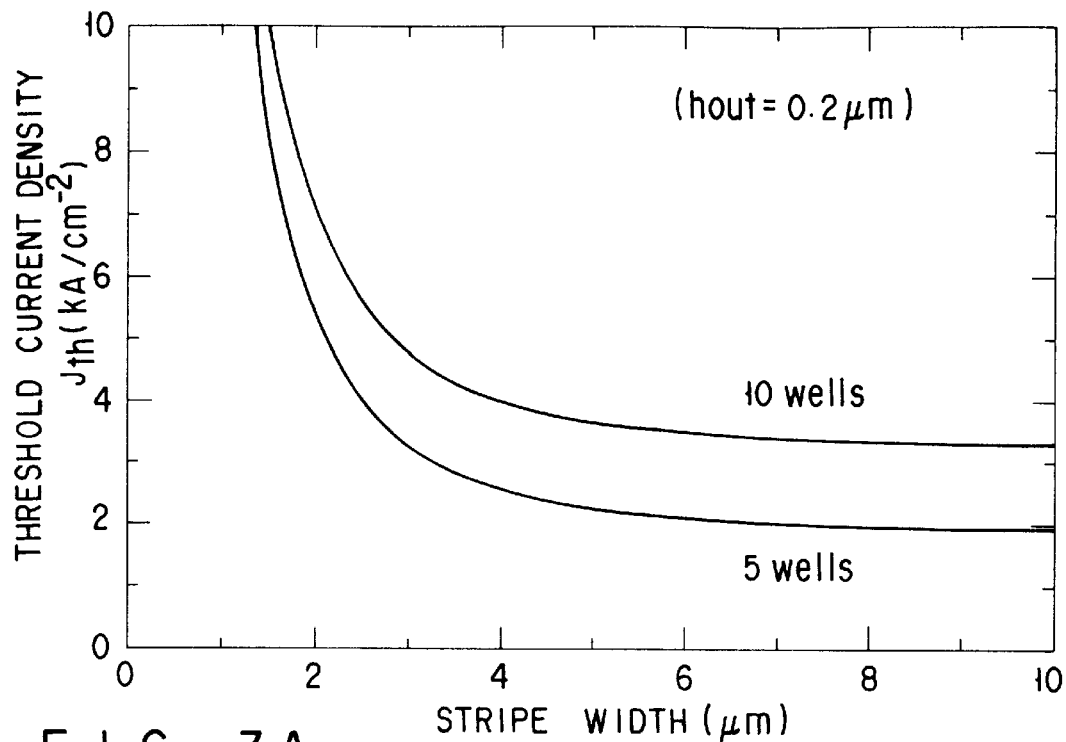
F I G. 3A
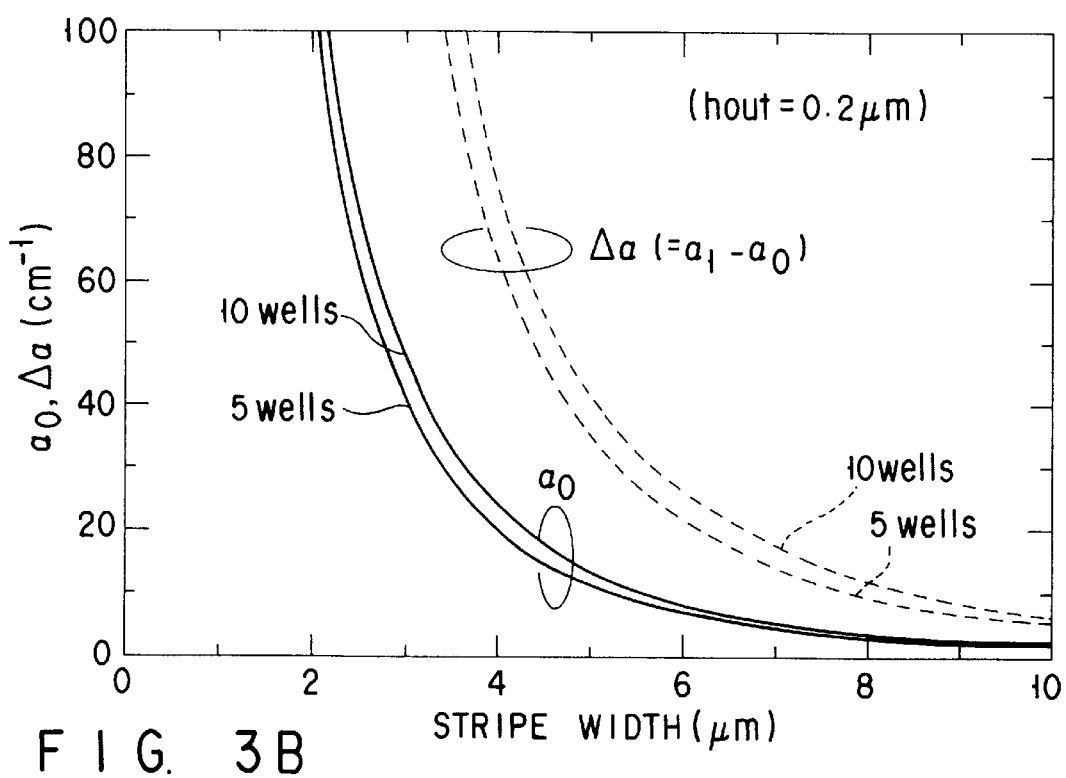
F I G. 3B

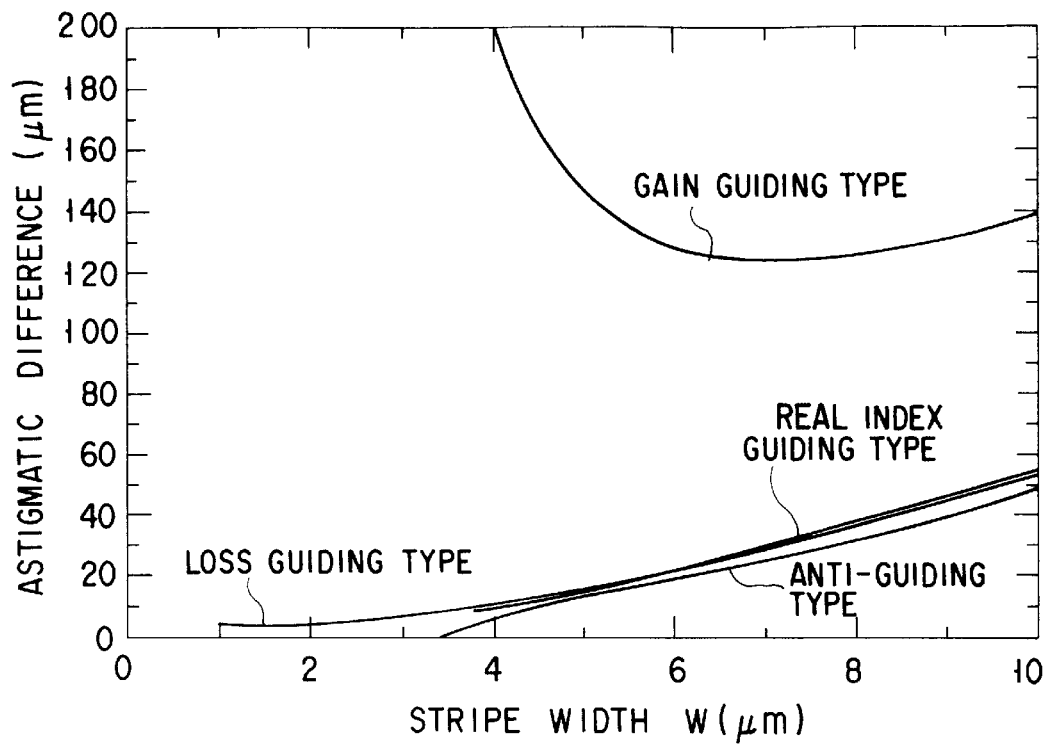
F I G. 5A
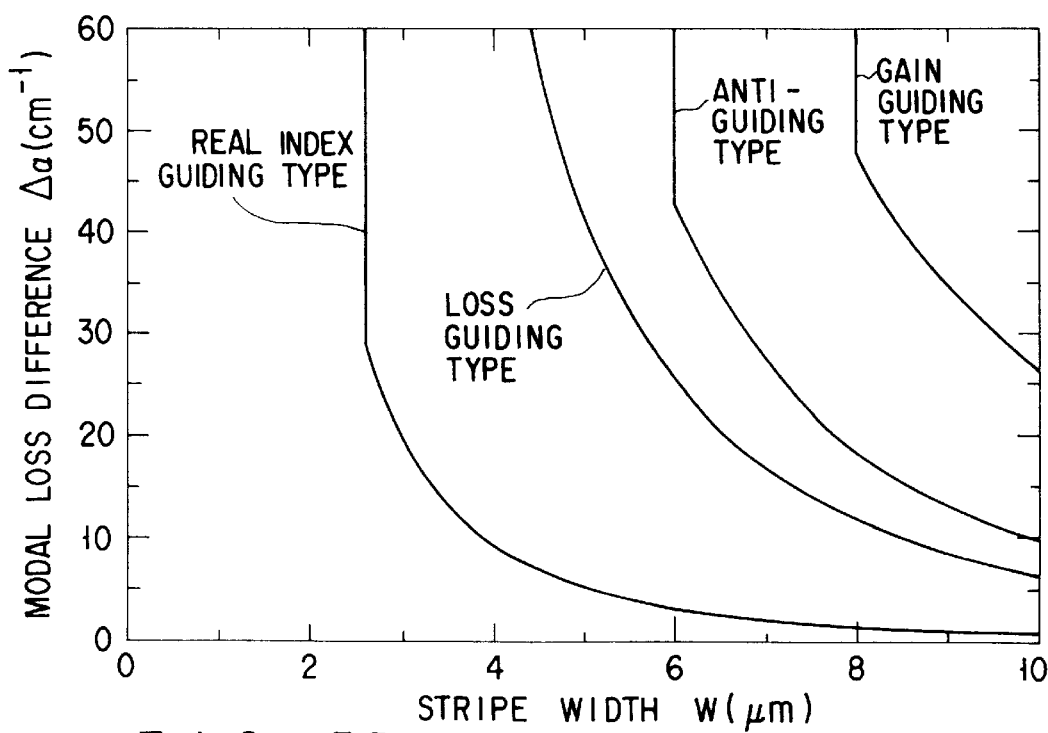
F I G. 5B

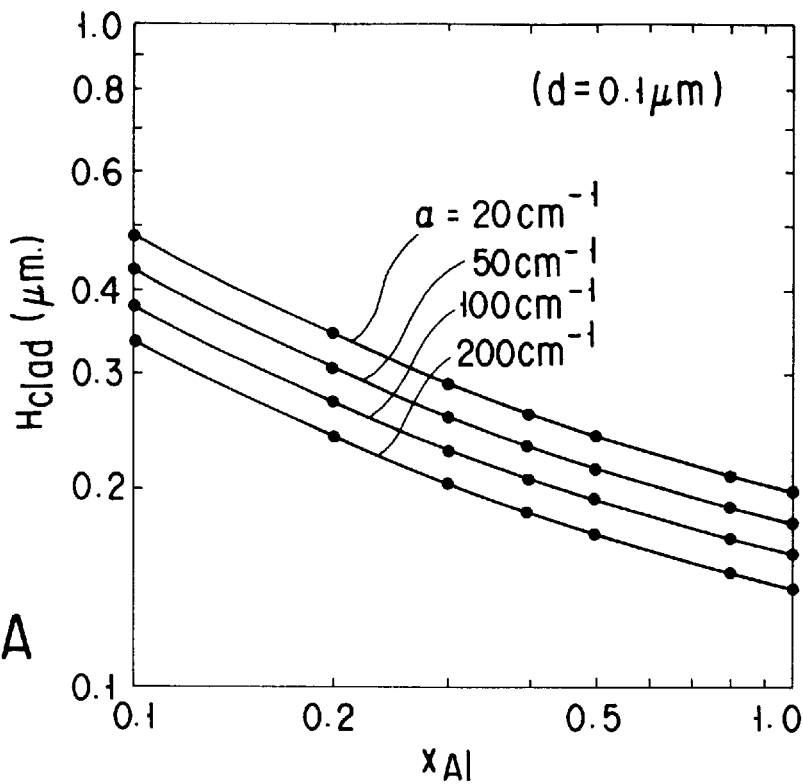
F I G. 6A
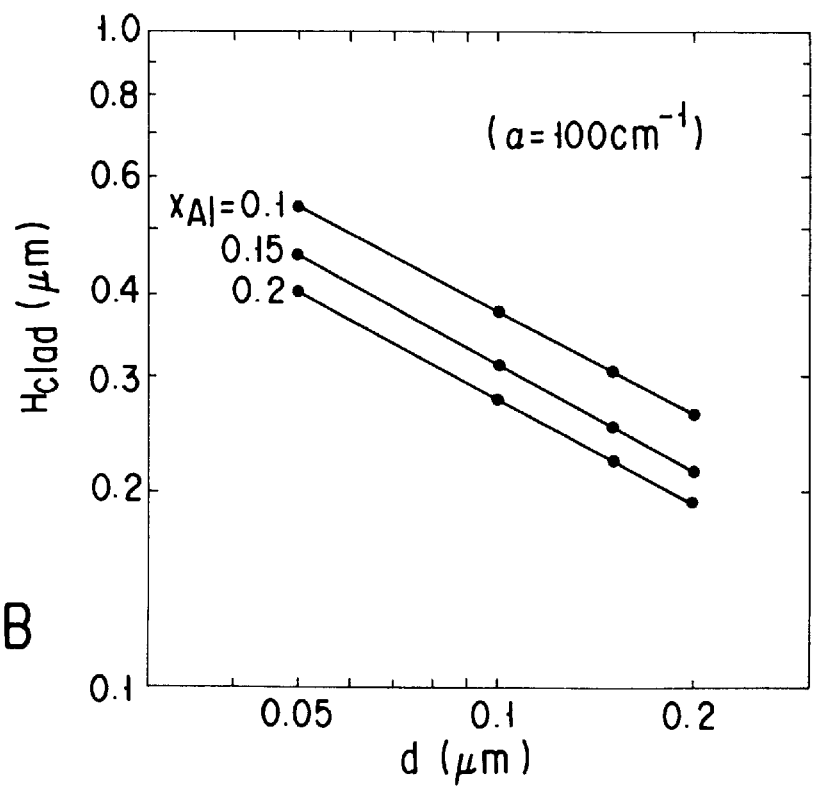
F I G. 6B

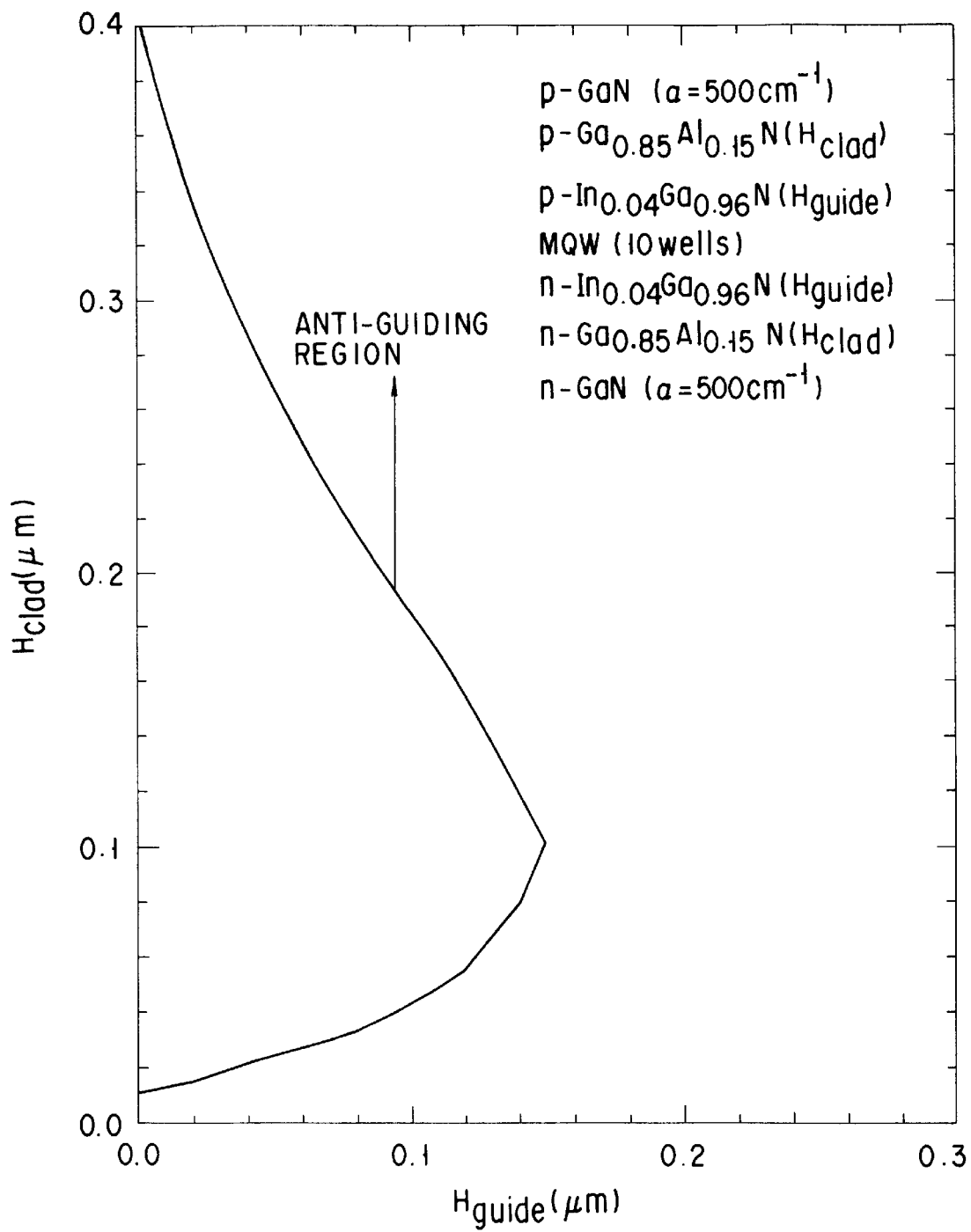
F I G. 7

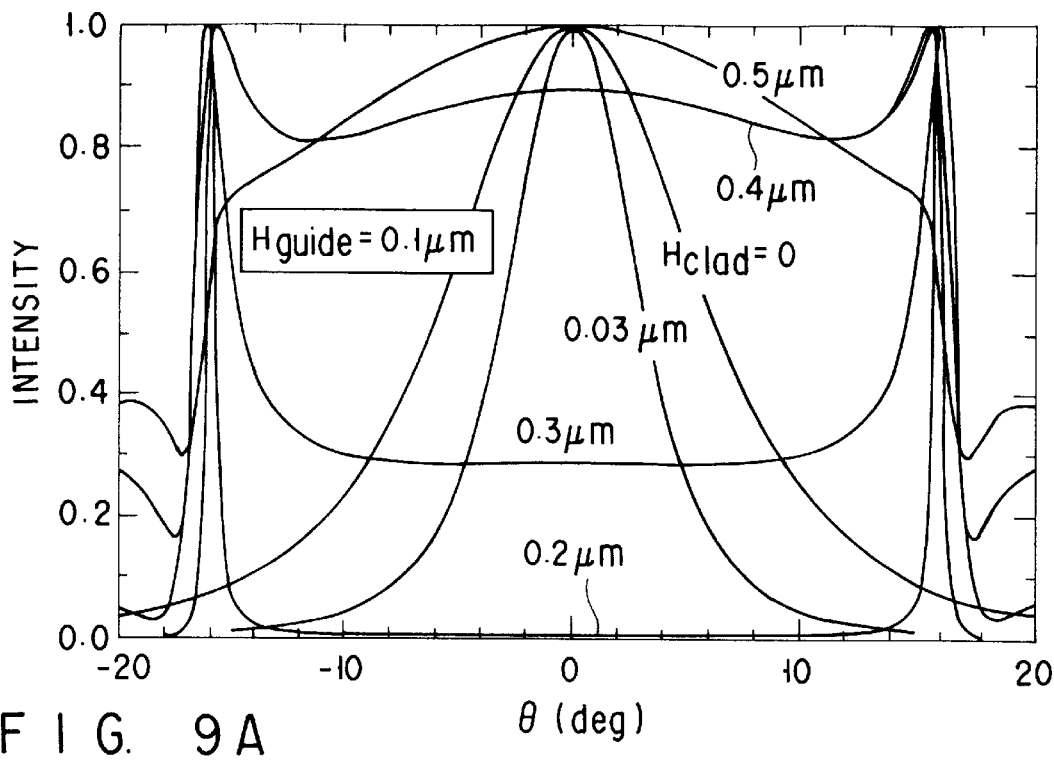
F I G. 9A
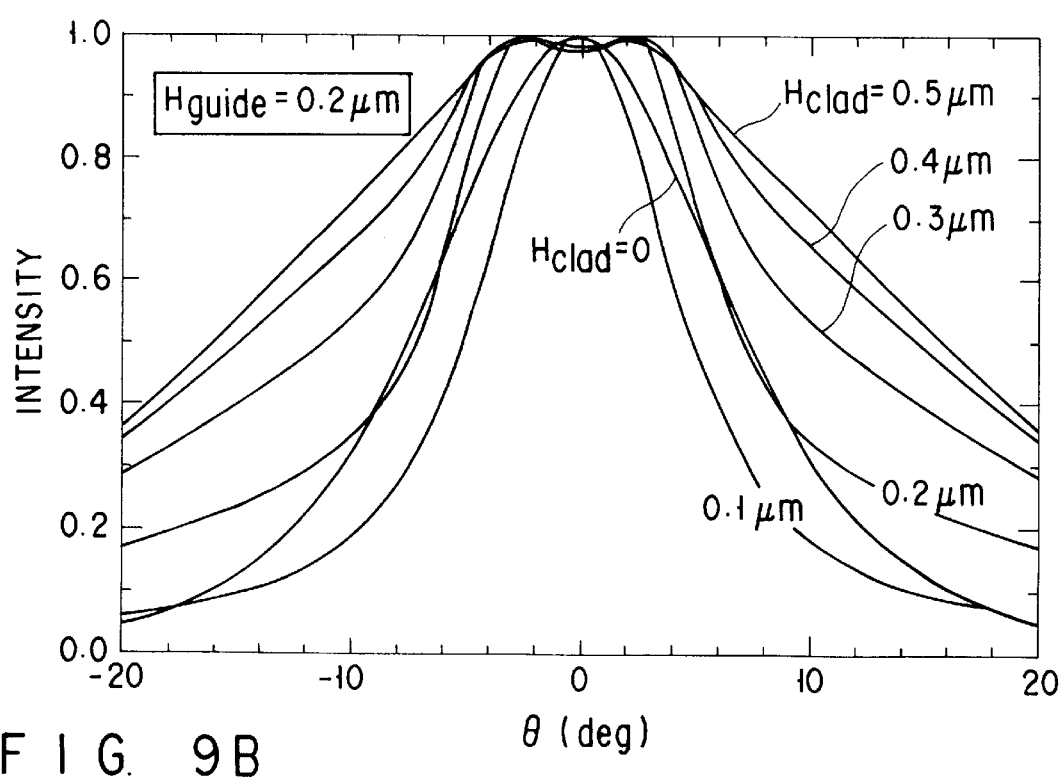
F I G. 9B

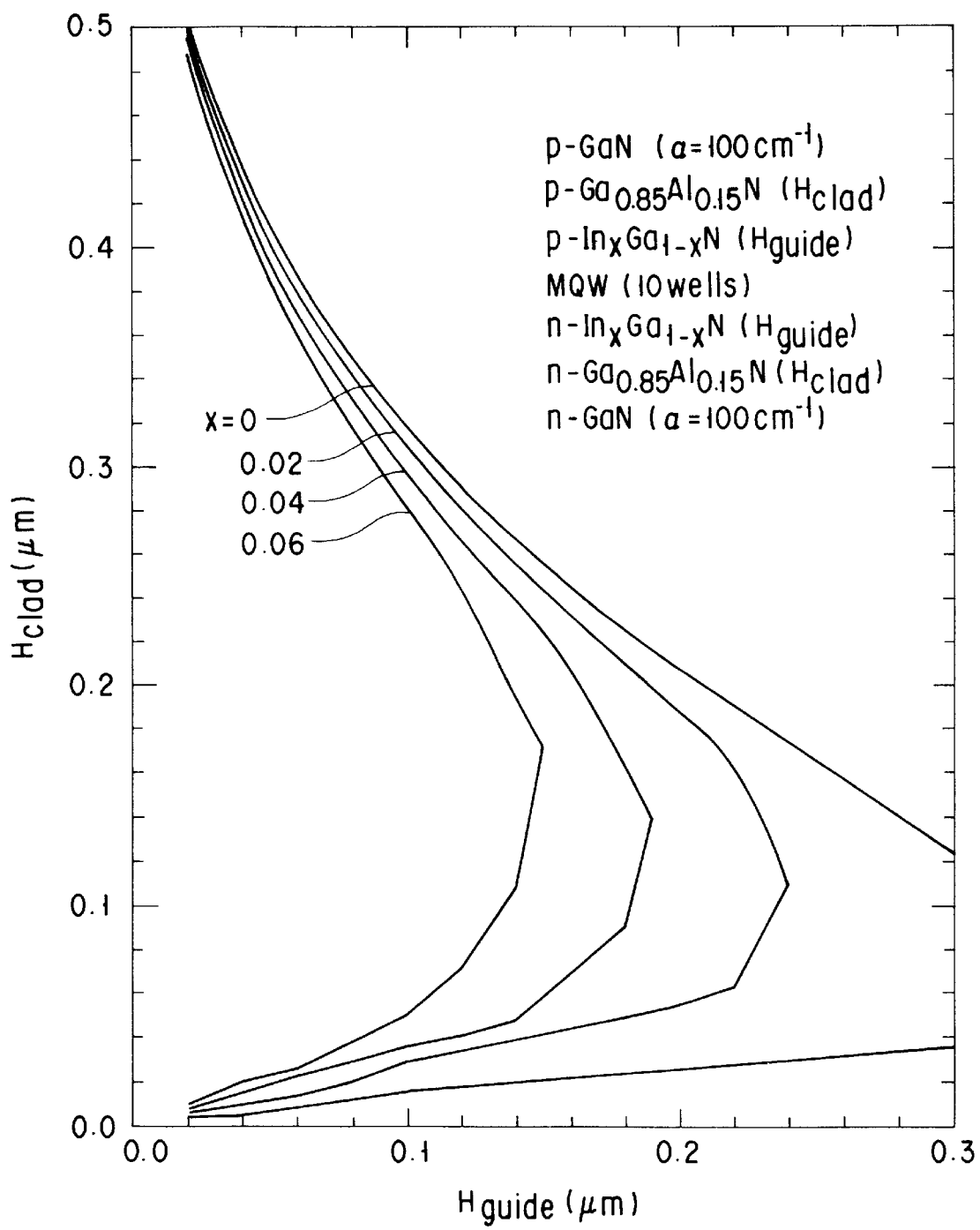
F I G. 11

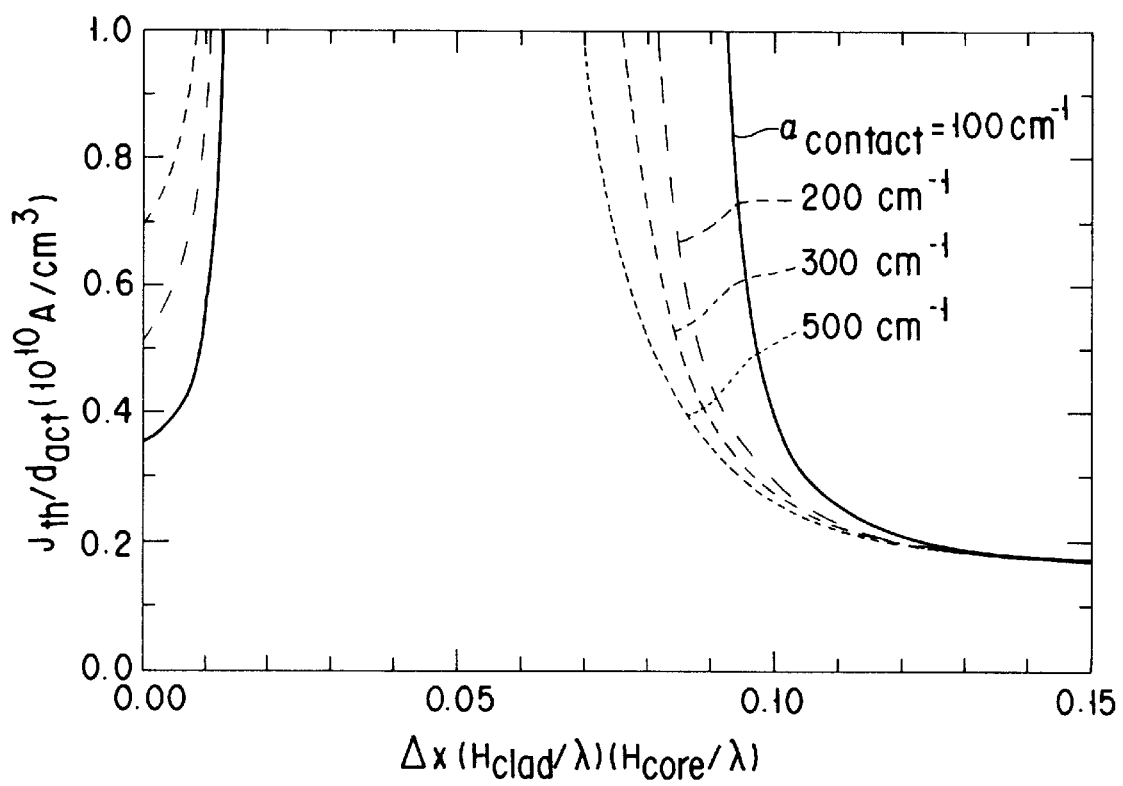
F I G. 12

FIG. 13

| | [1] | | [2] | | [3] | | [4] | |
|---|---|---|---|---|---|---|---|---|
| | COMPOSITIONS | FILM THICKNESS | COMPOSITIONS | FILM THICKNESS | COMPOSITIONS | FILM THICKNESS | COMPOSITIONS | FILM THICKNESS |
| p-CONTACT LAYER | p-GaN | | p-GaN | | p-GaN | | p-GaN | |
| p-CLADDING LAYER | p-Ga$_{0.85}$Al$_{0.15}$N | 0.25μm | p-Ga$_{0.85}$Al$_{0.15}$N | 0.3μm | p-Ga$_{0.85}$Al$_{0.15}$N | 0.27μm | p-Ga$_{0.85}$Al$_{0.15}$N | 0.3μm |
| n-WAVEGUIDE LAYER | p-In$_{0.06}$Ga$_{0.94}$N | 0.15μm | p-In$_{0.05}$Ga$_{0.95}$N | 0.1μm | p-In$_{0.05}$Ga$_{0.95}$N | 0.12μm | p-In$_{0.05}$Ga$_{0.95}$N | 0.15μm |
| MQW | 10 well | | 10 well | | 5 well | | 5 well | |
| n-WAVEGUIDE LAYER | n-In$_{0.06}$Ga$_{0.94}$N | 0.15μm | n-In$_{0.05}$Ga$_{0.95}$N | 0.1μm | n-In$_{0.05}$Ga$_{0.95}$N | 0.12μm | n-In$_{0.05}$Ga$_{0.95}$N | 0.15μm |
| p-CLADDING LAYER | n-Ga$_{0.85}$Al$_{0.15}$N | 0.25μm | n-Ga$_{0.85}$Al$_{0.15}$N | 0.3μm | n-Ga$_{0.85}$Al$_{0.15}$N | 0.27μm | n-Ga$_{0.85}$Al$_{0.15}$N | 0.3μm |
| p-CONTACT LAYER | n-GaN | | n-GaN | | n-GaN | | n-GaN | |

| | [5] | | [6] | | [7] | | [8] | |
|---|---|---|---|---|---|---|---|---|
| | COMPOSITIONS | FILM THICKNESS | COMPOSITIONS | FILM THICKNESS | COMPOSITIONS | FILM THICKNESS | COMPOSITIONS | FILM THICKNESS |
| p-CONTACT LAYER | p-GaN | | p-GaN | | p-GaN | | p-GaN | |
| p-CLADDING LAYER | p-Ga$_{0.85}$Al$_{0.15}$N | 0.35μm | p-Ga$_{0.85}$Al$_{0.15}$N | 0.3μm | p-Ga$_{0.85}$Al$_{0.15}$N | 0.3μm | p-Ga$_{0.85}$Al$_{0.15}$N | 0.3μm |
| n-WAVEGUIDE LAYER | p-In$_{0.05}$Ga$_{0.95}$N | 0.12μm | p-GaN | 0.15μm | p-GaN | 0.15μm | p-GaN | 0.15μm |
| MQW | 5 well | | 10 well | | 10 well | | 5 well | |
| n-WAVEGUIDE LAYER | n-In$_{0.05}$Ga$_{0.95}$N | 0.12μm | n-In$_{0.05}$Ga$_{0.95}$N | 0.15μm | n-In$_{0.05}$Ga$_{0.95}$N | 0.12μm | n-In$_{0.05}$Ga$_{0.95}$N | 0.15μm |
| p-CLADDING LAYER | n-Ga$_{0.85}$Al$_{0.15}$N | 0.35μm | n-Ga$_{0.85}$Al$_{0.15}$N | 0.3μm | n-Ga$_{0.85}$Al$_{0.15}$N | 0.3μm | n-Ga$_{0.85}$Al$_{0.15}$N | 0.3μm |
| p-CONTACT LAYER | n-GaN | | n-GaN | | n-GaN | | n-GaN | |

*1 CYCLE OF MQW IS In$_{0.2}$Ga$_{0.8}$N WELL LAYER (2nm) / In$_{0.05}$Ga$_{0.95}$N BARRIER LAYER (4nm)

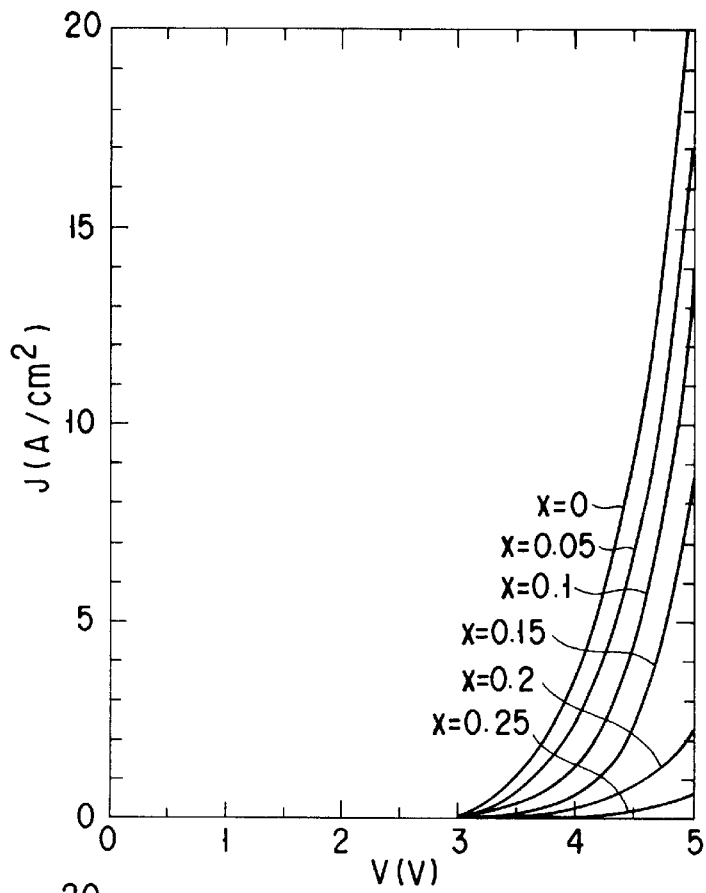
F I G. 21
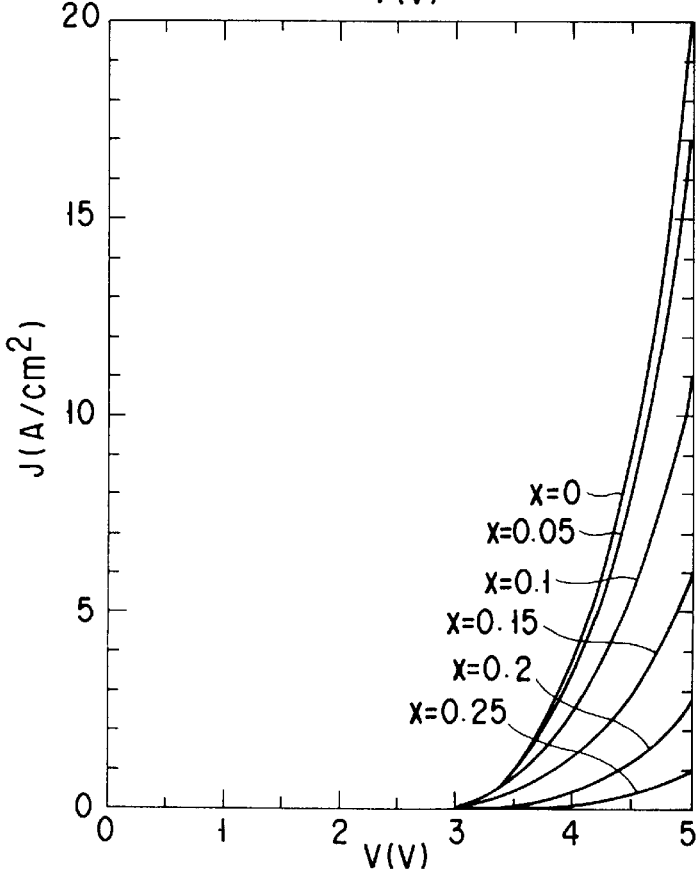
F I G. 22

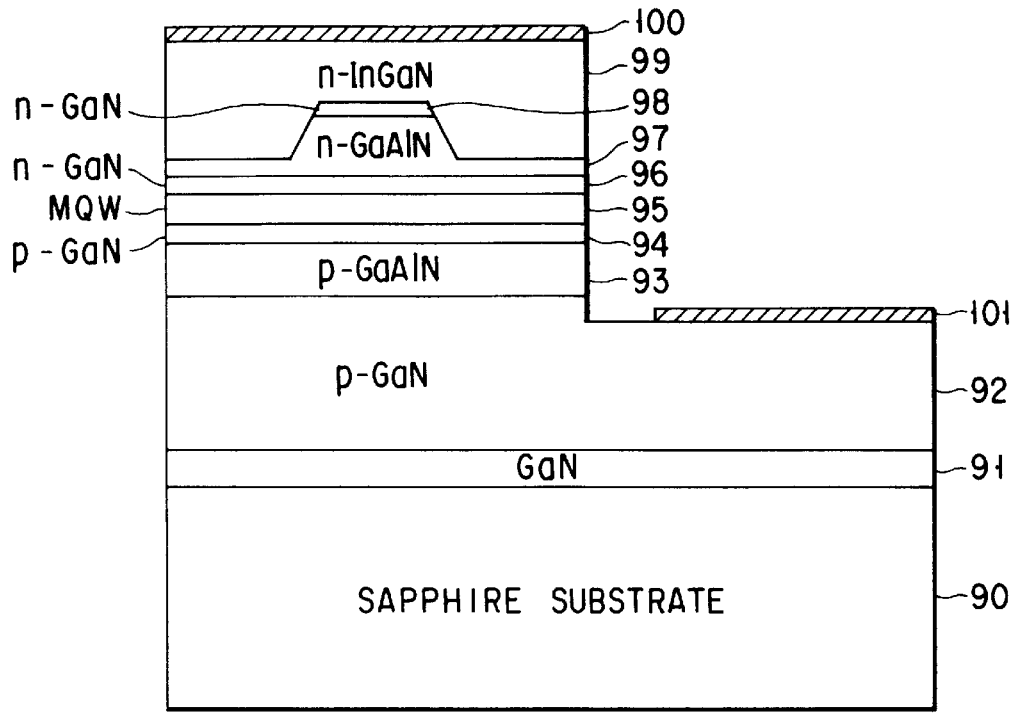
F I G. 23
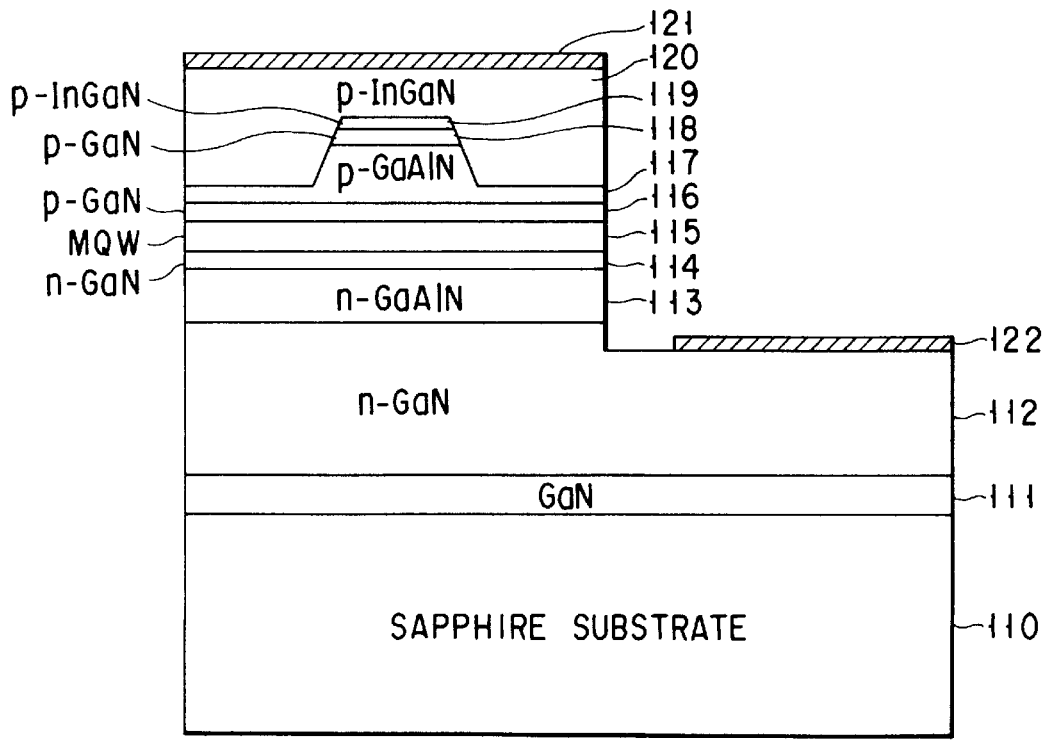
F I G. 24

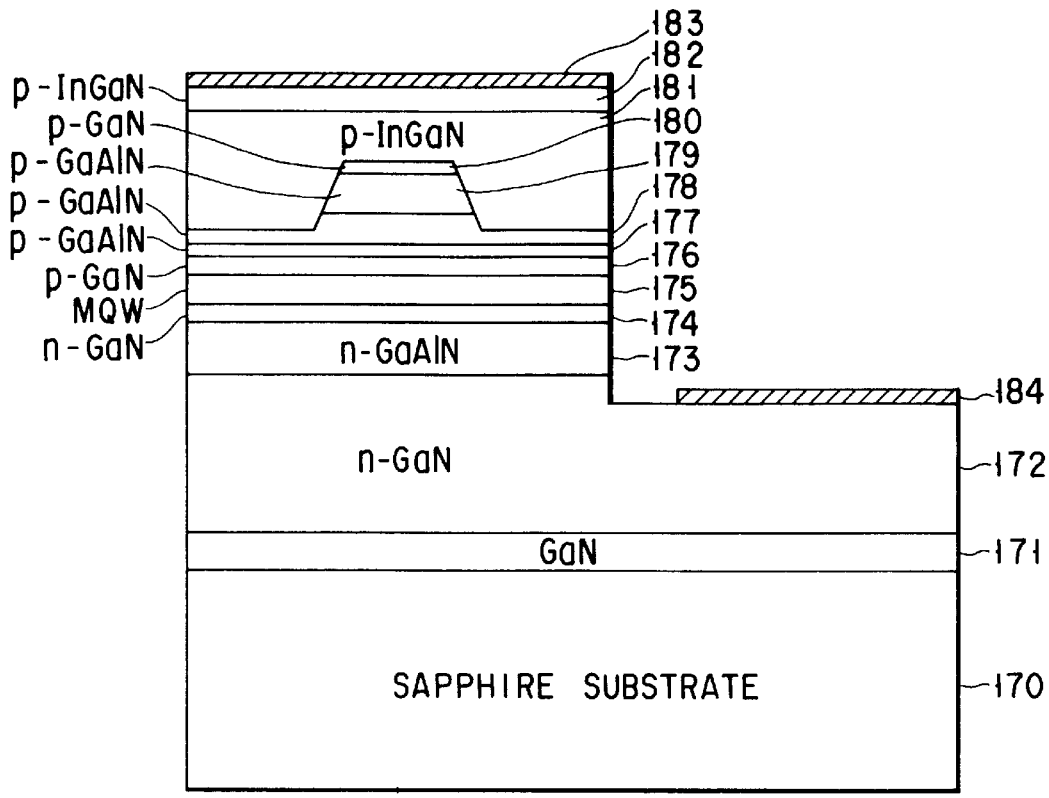
F I G. 27
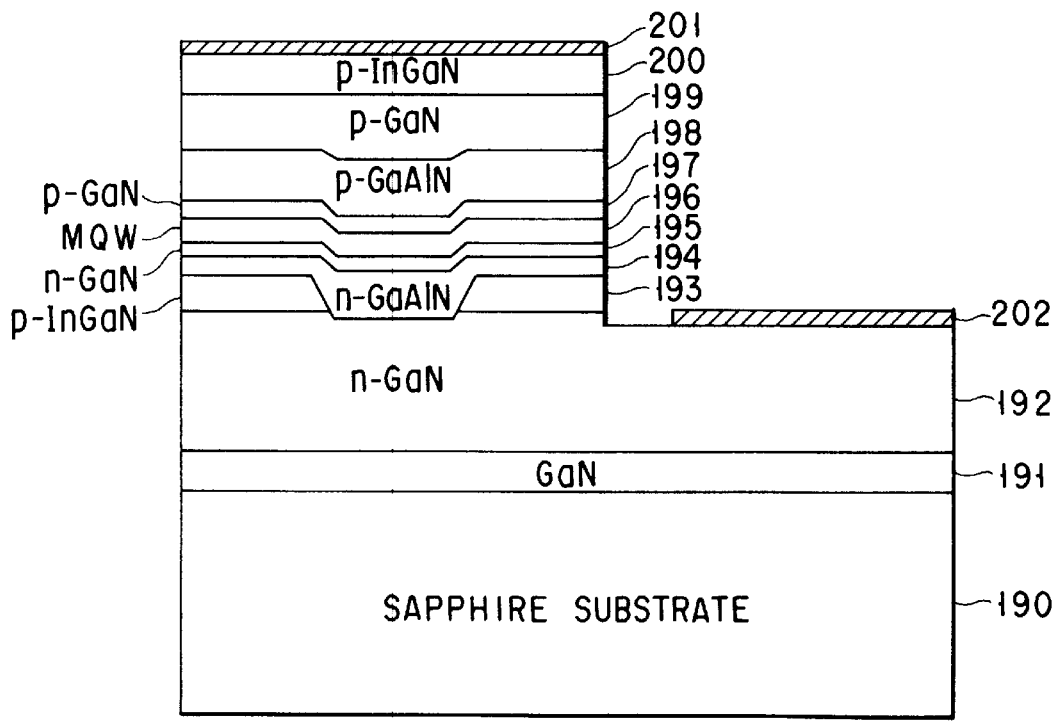
F I G. 28

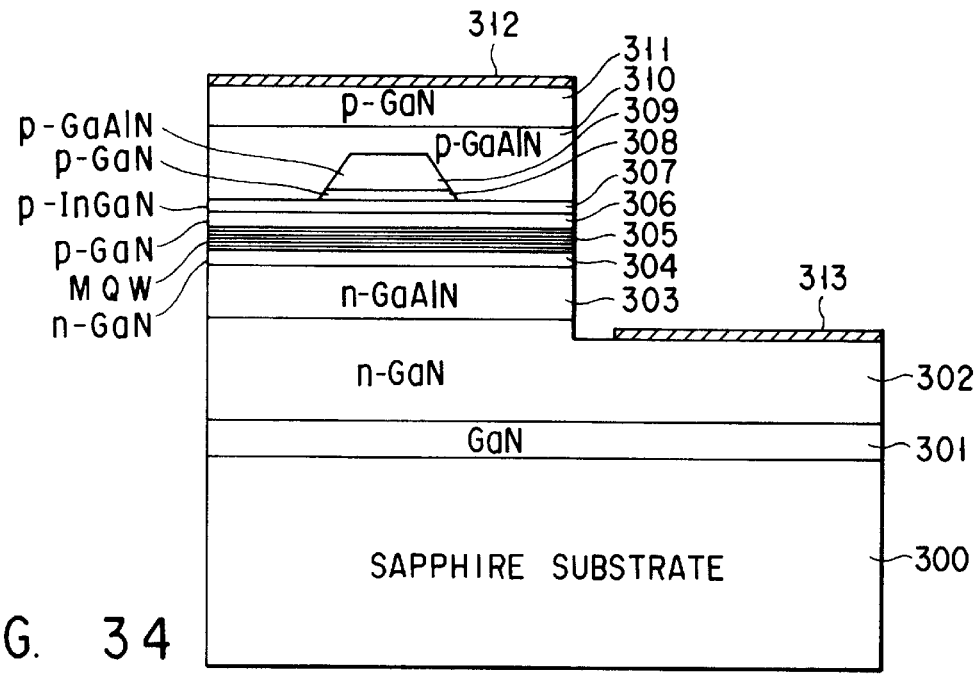
F I G. 34
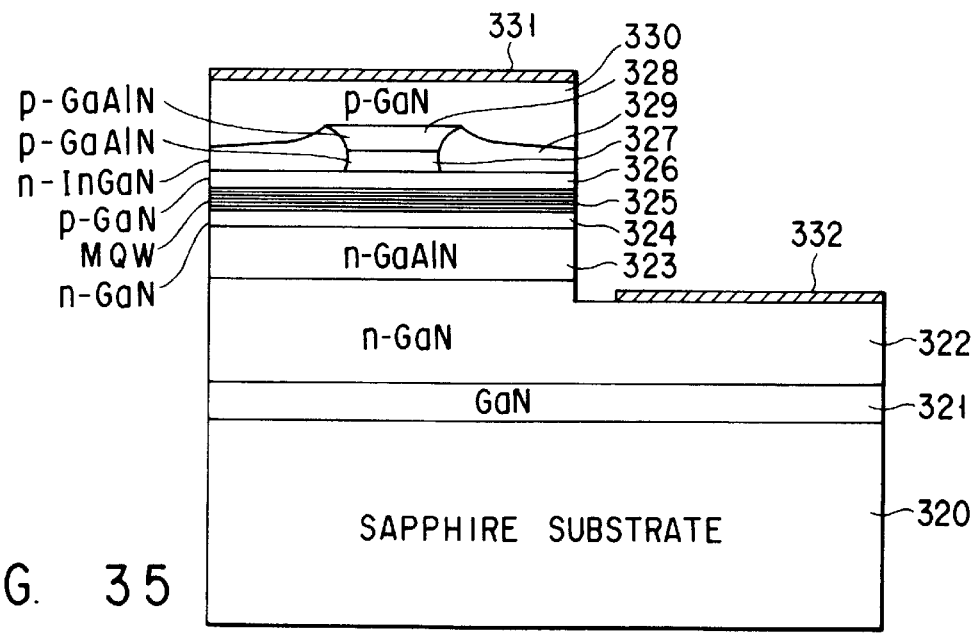
F I G. 35

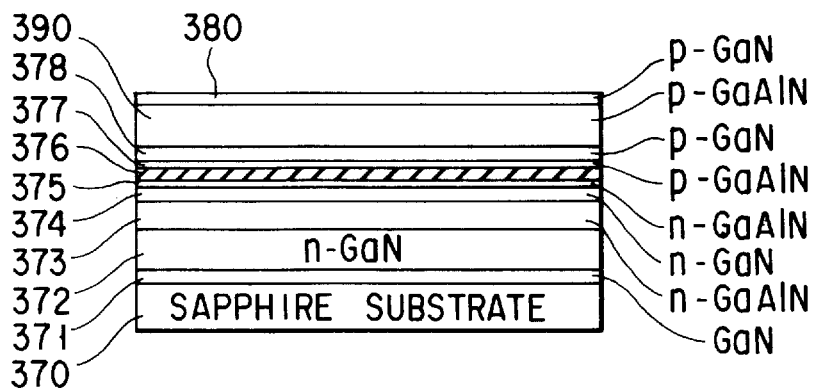
F I G. 42A
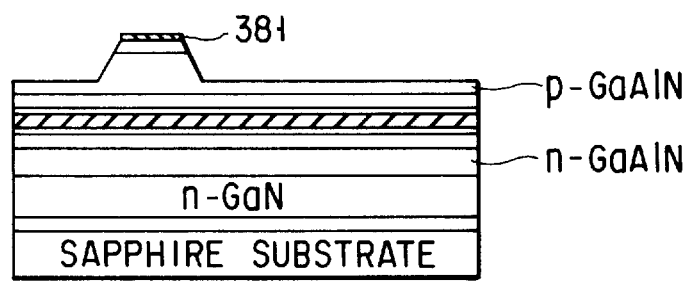
F I G. 42B
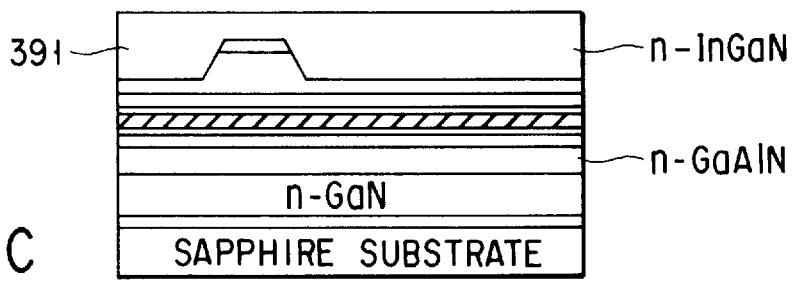
F I G. 42C
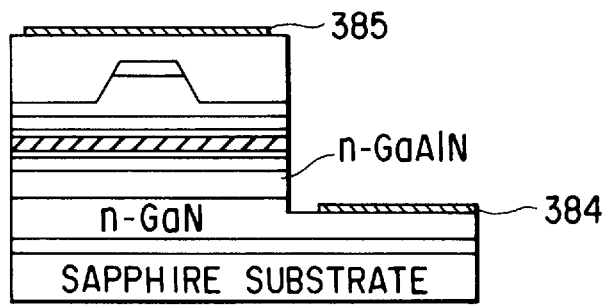
F I G. 42D

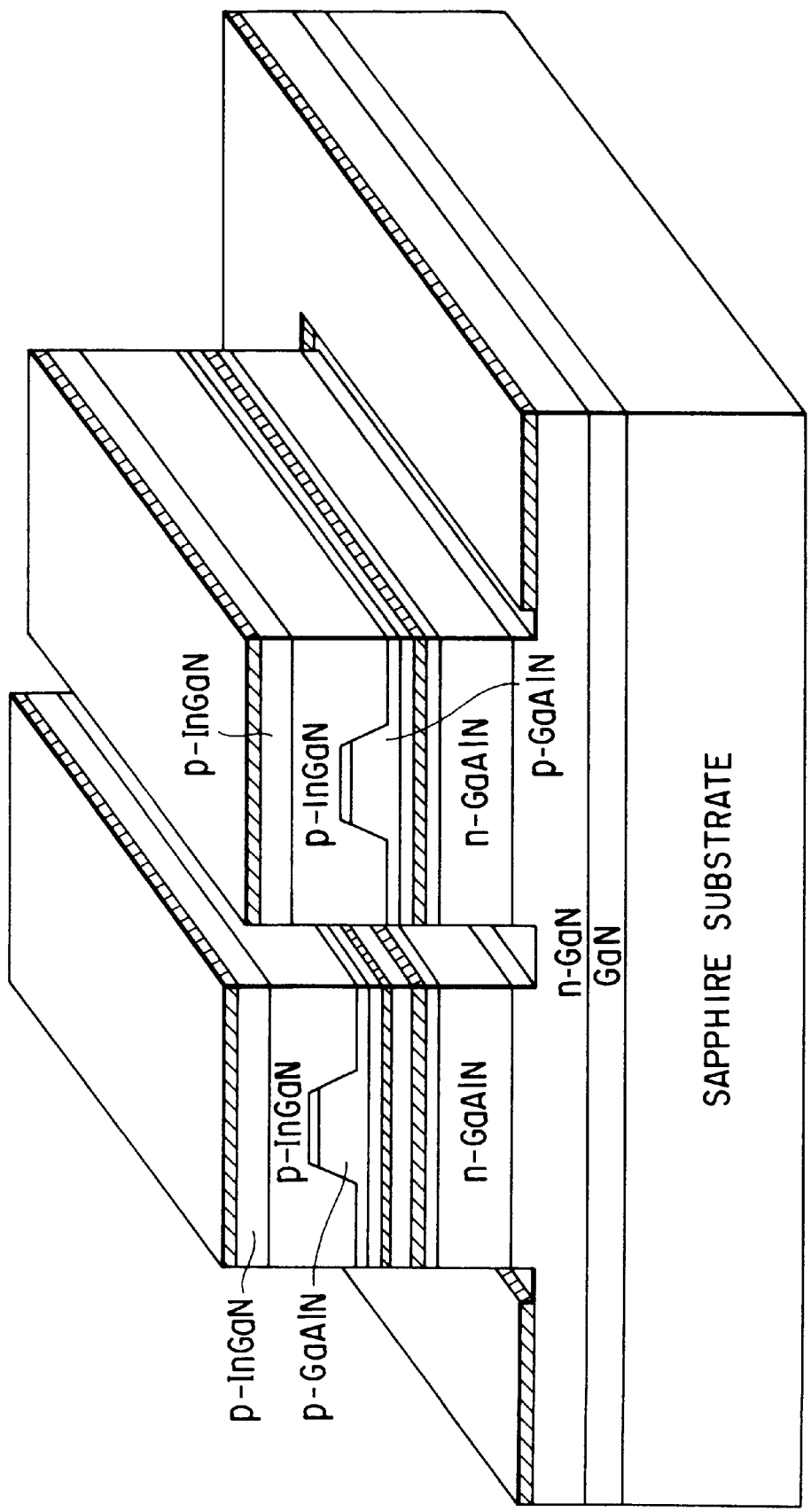
F I G. 47

SEMICONDUCTOR LASER AND METHOD OF FABRICATING SAME

BACKGROUND OF THE INVENTION

The present invention relates to a semiconductor laser and a method of fabricating the same. More particularly, the present invention relates to a semiconductor laser using an InGaAlBN based material and a method of fabricating the same.

Recently, development of a semiconductor laser using an InGaAlBN based material has been driven as a short wavelength light source, which is required for an optical disc with a higher recording density or the like. A semiconductor laser made of this kind of material can emit a beam having a small diameter in its adaptation to a short wavelength and therefore it is hoped that the laser is put into practice as a light source for high-density information processing such as an optical disc. A semiconductor laser using a multi-quantum-well-structure, as a structure realizing oscillation by current injection in this material system, has been reported, for example, in the following articles:

1) S. Nakamura, M. Senoh, S. Nagahama, N. Iwasa, T. Yamada, T. Matsushita, H. Kiyoku and Y. Sugimoto: "InGaN-based multi-quantum-well-structure laser diodes", Jpn. J. Appl. Phys., 35 (1996) pp. L74–L76.

2) S. Nakamura, M. Senoh, S. Nagahama, N. Iwasa, T. Yamada, T. Matsushita, H. Kiyoku and Y. Sugimoto: "InGaN multi-quantum-well-structure laser diodes with cleaved mirror facets", Jpn. J. Appl. Phys., 35 (1996) pp. L217–L220.

It is known that a multi-quantum-well-structure using a thin film active layer can reduce a threshold value much, as compared with the case of a bulk active layer. In an InGaAlN based material, however, a threshold current density is still high and an operating voltage are also high and, therefore, there remain many problems to realize a continuous oscillation.

One of causes by which the operating voltage in the InGaAlN based material is high is that a contact resistance in the case of p-type is extremely high. In a stripe geometry of an electrode, which has been already reported, a voltage drop in a p-type electrode stripe is large and not only the operating voltage becomes high but also heat generation in the region cannot be neglected. In order to reduce a contact resistance, it is simply considered to expand an electrode area, but in such a broad stripe geometry a magnitude of a threshold current becomes larger and a fundamental transverse-mode oscillation can not be available because a current injection region is large.

In application to an optical disc and the like, an output beam from a semiconductor laser is necessarily focused to a very small spot and therefore a fundamental transverse-mode oscillation is indispensable. However, in the InGaAlN based laser, a structure for a fundamental transverse mode stabilization has not been realized. In a conventional material system, for example an InGaAlP based system, only an SBR laser of a ridge stripe type has been reported in the following article:

3) M. Ishikawa et al., Extended Abstracts, 19th Conf. Solid State Devices and Materials, Tokyo (1987) pp. 115–118.

In an InGaAlN based laser, however, the structure used in the SBR laser cannot be applied without any change due to a difference in material system. As to a current confining structure in an InGaAlN based laser, a structure using GaN as a current confining layer is disclosed in the following application:

4) Jpn. Pat. Appln. KOKAI Publication No. 8-111558 (a semiconductor laser).

This structure works for current confinement but does not show a function of optical confinement and, thereby, there is difficulty producing an good quality output beam with small astigmatism and the like.

Generally, a composition, a thickness, a distance from an active layer and the like are necessarily set at respective designed values in order that a current confining layer formed in a cladding layer additionally works as a light confining layer. Especially in an InGaAlN based laser, even with the same composition, a completely different guiding mechanism is resulted in a laser according to a thickness and a position used because of a short wavelength. For this reason, an stable fundamental transverse mode oscillation is not provided only with incorporation of a current confining layer therein.

Also, if an Al containing layer is grown thick during a crystal growth process of an InGaAlN based materials, cracks are sometimes generated in the Al containing layer such as GaAlN layer, since there is a difference in lattice constant between an underlying GaN and the Al containing layer. For this reason, the transverse-mode confining in the direction of a layer (a vertical direction) does not work well so that a threshold value becomes extremately large or no guided mode is present.

On the other hand, a semiconductor laser used for an optical disc system, various specifications are specially required. Especially in write-once and rewritable types, a low power semiconductor laser for read and a high power semiconductor laser for erase/record are required and specifications for both are different from each other. Generally, a ultra thin film active layer is used for the high power semiconductor laser, but this structure is not necessarily suitable for a read laser. The reason why is that a low noise characteristic is required for the read laser and therefore, for example, a self-pulsation type structure is used, but the self-pulsation is hard to be obtained in the ultra thin active layer structure.

Under such circumstances, a high frequency superposition method or a combination of two kinds of laser has been adopted, but both are complicated in constitution. Besides, there has been reported a method, wherein two kinds of laser are formed using an active layer with variation of thickness according to positions, but in this method there arises a problem that controlling of thickness of the active layer is extremely difficult.

As described above, there have been proposed a variety of structures of and various methods of producing this kind of semiconductor laser, but no satisfactory characteristics have not been obtained in any cases, since crystal growth of a GaN based compound semiconductor layer is difficult. That is, the GaN based compound semiconductor layer cannot be grown as a good quality crystal and, therefore, carrier injection to an active layer cannot be effectively performed due to a poor crystal quality. In a structure wherein a stripe opening is formed in a current confining layer, a regrown layer after etching for formation of the stripe opening is degraded in crystal quality, which is an adverse factor for inviting a voltage drop in an electrode contact or the like.

To sum up, in order to realize a blue semiconductor laser with high reliability which works with a low threshold and a low voltage, and which is practically used for application of an optical disc and the like, effective current injection to an active layer and suppression of a voltage drop in a electrode contact or the like are important. However, in the current state of the art, a satisfactory structure with regard to the above points have not been obtained.

Moreover, semiconductor lasers of different wavelengths will be used more as an optical disc is progressed toward a higher density. In this trend, lasers of both wavelengths are sometimes in parallel needs, since interchangeability or compatibility is required between new and old optical systems. This situation will arise especially in the case where lasers have wavelengths of a large difference, such as in the case of a combination of red and blue in wavelength. The reason why is that a depth of a pit of an optical disc is optimized according to a wavelength of light source and, therefore, if a wavelength for read is greatly different, an SN ratio of a signal of reflection from a pit is reduced.

In such a way, in a conventional InGaAlN based semiconductor laser, a transverse-mode-stabilized structure is difficult to be produced and a laser which continuously oscillates in a fundamental transverse mode has difficulty being put to practical use.

For example, in an InGaAlN based semiconductor laser, it is difficult to produce a high-quality crystal layer because crystal growth thereof is difficult. A regrown layer after the etching for formation of a stripe opening has a further degraded crystallinity. For this reason, an efficiency in carrier injection to an active layer is reduced and, in addition, a voltage drop is caused by an electrode contact or the like. Accordingly, a device with high reliability which operates at a low threshold and a low voltage, and which is to be practically used for an optical disc and the like has difficulty being produced.

Moreover, degradation in crystallinity of a regrown layer on a GaN based compound semiconductor layer after the etching is held true to various semiconductor devices using a GaN based compound semiconductor.

Laser performances required for both cases of read and erase/record in an optical disc system are hard to be simultaneously realized.

There is difficulty in realization of a semiconductor laser which meet a need for compatibility between optical systems having different wavelengths of light sources and different recording densities.

BRIEF SUMMARY OF THE INVENTION

It is an object of the present invention to provide an InGaAlBN based semiconductor laser, which can continuously oscillate in a fundamental transverse mode, and with which a good quality output beam with small astigmatism, and suitable for a light source in an optical disc system and the like, and a method of fabricating the same.

It is another object of the present invention to provide a semiconductor laser, which does not require a difficult process such as thickness control of an active layer, and which realizes a laser performance required in both operations of read and erase/record.

It is a further object of the present invention to provide a semiconductor laser which is required for maintaining compatibility between two optical systems designed to use respective different wavelengths of light sources, and which can be used in both optical systems.

It is a still another object of the present invention to provide a method of fabricating a semiconductor laser with high reliability, in which carrier injection to an active layer can be effectively conducted, in which a voltage drop in an electrode contact can be reduced, and which operates at a low threshold value and a low voltage for practical application in an optical disc and the like.

It is a still further object of the present invention to provide a method of fabricating a semiconductor laser in which regrowth after etching of a GaN based compound semiconductor layer can be performed in a satisfactory manner, and which contributes to improvements on characteristics of various kinds of semiconductor devices.

In order to achieve the above mentioned objects, in a semiconductor laser of the present invention, a light confining layer having a larger refractive index than that of a cladding layer is incorporated and a transverse mode is controlled with a loss or an anti-guiding effect in order to make possible a continuous oscillation in a stable fundamental transverse mode at a low operating voltage.

That is, the present invention is a semiconductor laser which is made of a III–V compound semiconductor including nitrogen, comprising: a first-conductivity-type cladding layer; a second-conductivity-type cladding layer having a ridge in the shape of a stripe; an active layer; a double heterostructure, in which the active layer lies between the first- and second-conductivity-type cladding layers; and a light confining layer formed adjoining the second-conductivity-type cladding layer side of the double heterostructure and at least in a region other than the ridge portion, wherein the light confining layer is made of a III–V compound semiconductor including nitrogen and a refractive index of the light confining layer is larger than that of the second-conductivity-type cladding layer.

The present invention is directed a semiconductor laser comprising: a first-conductivity-type cladding layer made of $In_xGa_yAl_zB_{1-x-y-z}N$ ($0 \leq x$, y, z, $x+y+z \leq 1$); a second-conductivity-type cladding layer made of $In_uGa_vAl_wB_{1-u-v-w}N$ ($0 \leq u$, v, w, $u+v+w \leq 1$) having a ridge in the shape of a stripe; an active layer; a double heterostructure, in which an active layer lies between the cladding layers; and a light confining layer formed on a surface of the second-conductivity-type cladding layer side of the double heterostructure and in a region thereof, which excludes at least a ridge portion, wherein the light confining layer is made of $In_pGa_qAl_rB_{1-p-q-r}N$ ($0 \leq p < 1$, $0 \leq q < 1$, $0 \leq r \leq 1$, $0 < p+r \leq 1$, $0 < p+q+r \leq 1$) and a refractive index thereof is larger than that of the second-conductivity-type cladding layer.

Here, preferred embodiments of the present invention will be described below:

(1) The active layer portion has a single-quantum-well-structure or multi-quantum-well-structure at least composed of a well layer made of $In_aGa_bAl_cB_{1-a-b-c}N$ ($0 \leq a$, b, c, $a+b+c \leq 1$) and a barrier layer made of $In_eGa_fAl_gB_{1-e-f-g}N$ ($0 \leq e$, f, g, $e+f+g \leq 1$).

(2) A thickness H1 of the first-conductivity-type cladding layer and a thickness H2 of the second-conductivity-type cladding layer are set, with respect to a total thickness d of a core region and an oscillating wavelength $\lambda$ of the laser, in ranges which satisfy the following relations;

$$0.18 \, (zd/\lambda)^{-\frac{1}{2}} \leq H1/\lambda \leq 0.27 \, (zd/\lambda)^{-\frac{1}{2}}$$

$$0.18 \, (wd/\lambda)^{-\frac{1}{2}} \leq H2/\lambda \leq 0.27 \, (wd/\lambda)^{-\frac{1}{2}}$$

(3) A total thickness $d_{act}$ of active layers is less than 0.05 $\mu$m.

(4) A total thickness $d_{act}$ of active layers is equal to 0.045 $\mu$m or less.

(5) An Al compositional ratio $x_{Al}$ of each of the cladding layers, an average compositional ratio $y_{In}$ of the core region, a sum of the compositional ratios $\Delta x$ ($=x_{Al}+y_{In}$), a total thickness $H_{core}$ of a core region and a thickness $H_{clad}$ of each of the cladding layers satisfy the following relation in reference to an oscillation wavelength $\lambda$:

$$\Delta x \cdot (H_{core}/\lambda) \cdot (H_{clad}/\lambda) \geq 0.08$$

(6) Further, the above parameters satisfy the following relation;

$$\Delta x \cdot (H_{core}/\lambda) \cdot (H_{clad}/\lambda) \geq 0.1$$

(7) The above parameters satisfy the following relation;

$$\Delta x \cdot (H_{core}/\lambda) \cdot (H_{clad}/\lambda) \leq 0.2$$

(8) Further, the above parameters satisfy the following relation;

$$\Delta x \cdot (H_{core}/\lambda) \cdot (H_{clad}/\lambda) \leq 0.15$$

(9) An Al compositional ratio $x_{Al}$ and a thickness $H_{clad}$ of each of cladding layers satisfy the following relation;

$$x_{Al} \cdot H_{clad} \leq 0.1 \ \mu m$$

(10) An Al compositional ratio $x_{Al}$ and a thickness $H_{clad}$ of each of cladding layers satisfy the following relation;

$$x_{Al} \cdot H_{clad} \leq 0.06 \ \mu m$$

(11) The core region includes a plurality of waveguide layers made of $In_uGa_vAl_wB_{1-u-v-w}N$ ($0<u\leq1$, $0\leq v<1$, $0\leq w<1$) formed in such a manner that the active region lies between the waveguide layers, wherein a total thickness $H_{core}$ of the core region and an In average compositional ratio $y_{In}$ of the core region satisfy, in reference to an oscillation wavelength $\lambda$, the following relation;

$$(y_{In})^{1/2} \cdot (H_{core}/\lambda) \geq 0.15$$

(12) Further, the above parameters satisfy the following relation;

$$(y_{In})^{1/2} \cdot (H_{core}/\lambda) \geq 0.2$$

(13) A light confining layer has the same conductivity type as that of the second-conductivity-type cladding layer.

(14) A bandgap energy of the light confining layer is smaller than that of a bandgap of the active layer.

(15) A material of a contact layer on the second-conductivity-type cladding layer and the light confining layer are same and the cap layer having a bandgap between those of the second-conductivity-type cladding layer in a stripe region and the contact layer physically lies between both layers.

(16) Waveguide layers each having a refractive index smaller than that of an average refractive index of quantum-wells and larger than that of each of the cladding layers are disposed between the quantum-wells and the cladding layers and at least one carrier overflow blocking layer made of $In_sGa_tAl_hB_{1-s-t-h}N$ ($0\leq s$, $t$, $h$, $s+t+h\leq1$) and having a bandgap energy larger than that of each of the waveguide layers, is disposed in a waveguide layer on at least one side or between a waveguide layer and a quantum-well.

(17) An Al compositional ratio h of the at least one carrier overflow blocking layer is defined in the following relation;

$$0<h<0.2$$

(18) Each of the first-conductivity-type and second-conductivity-type cladding layers are made of GaAlN and the light confining layer is made of InGaN or GaAlN, an Al compositional ratio of which is smaller than that of each of the cladding layers.

For example, the light confining layer can be formed a structure as shown in one of the following conditions (i) to (iii).

(i) The light confining layer is made of $In_pGa_qAl_rB_{1-p-q-r}N$ ($0.2\leq p\leq0.3$, $0\leq q\leq0.8$, $0\leq r\leq0.8$, $0.2\leq p+q+r\leq1$).

(ii) The light confining layer is made of $In_pGa_qAl_rB_{1-p-q-r}N$ ($0\leq p\leq0.95$, $0\leq q\leq0.95$, $0.05\leq r\leq0.3$, $0.05\leq p+q+r\leq1$).

(iii) The light confining layer is made of $In_pGa_qAl_rB^{1-p-q-r}N$ ($0\leq p\leq0.95$, $0\leq q\leq0.95$, $0.05\leq r\leq0.1$, $0.05\leq p+q+r\leq1$).

(19) A sapphire or SiC substrate is used as a substrate.

(20) A ridge portion of the second-conductivity-type cladding layer is formed concave downwardly or toward the substrate or in a reverse direction.

(21) An absorption coefficient of the contact layer is 100 $cm^{-1}$ or more.

(22) An absorption coefficient of the contact layer is 500 $cm^{-1}$ or more.

A semiconductor laser of the present invention, which emits two kinds of laser light, has a feature that it comprises: a first region, the first region having a double heterostructure portion including active layers of two kinds formed in a layered structure on a substrate; and a second region, the second region having a double heterostructure portion including one of the active layers, which is arranged on the side of the substrate, formed in a layered structure on the substrate, wherein the one of the active layers closer to the substrate has a bandgap larger than that of the other of the active layers farther away from the substrate.

In the above semiconductor laser, it is preferred that each double heterostructure portion comprises: a first-conductivity-type cladding layer made of $In_xGa_yAl_zB_{1-x-y-z}N$ ($0\leq x$, $y$, $z$, $x+y+z\leq1$), and a second-conductivity-type cladding layer made of $In_uGa_vAl_wB_{1-u-v-w}N$ ($0\leq u$, $v$, $w$, $u+v+w\leq1$) having a ridge in the shape of a stripe; an active layer sandwiched between the first- and second-conductivity-type cladding layers, wherein, in an region other than the ridge in the second-conductivity-type cladding layer, a light confining layer made of $In_pGa_qAl_rB_{1-p-q-r}N$ ($0\leq p\leq1$, $0\leq q<1$, $0\leq r\leq1$, $0<p+r\leq1$, $0<p+q+r\leq1$) with a refractive index larger than that of the second-conductivity-type cladding layer is formed.

A semiconductor laser of the present invention has another feature that the semiconductor laser is a semiconductor laser made of a GaN based compound semiconductor ($In_xGa_yAl_zN$: $x+y+z=1$, $0\leq x$, $y$, $z\leq1$) having a double heterostructure in which an active layer is sandwiched between cladding layers, wherein a ridge in the shape of a stripe made of a first-conductivity-type cladding layer and a first, first-conductivity-type contact layer is formed on at least one side of the cladding layer, a current blocking layer made of a second-conductivity-type GaN based compound semiconductor layer is formed in a region other than the ridge and adjoining the ridge, the current blocking layer and the ridge are buried in a second, first-conductivity-type contact layer to provide an electrode contact broader than a ridge width.

A method of fabricating a semiconductor laser of the present invention comprises at least: growing the first contact layer mentioned above in the state of crystal, forming $SiO_2$, applying resist, forming a pattern having a stripe, forming a ridge by selective dry etching, forming a light confining layer (a current blocking layer) by selective growth using the $SiO_2$ as a mask; removing the $SiO_2$ mask on the ridges; and growing the second contact layer on the light confining layer (the current blocking layer) and on the ridges.

The method of the present invention has a feature that, in the dry etching step for the GaN based compound semiconductor($In_xGa_yAl_zN$: x+y+z=1, $0 \leq x, y, z \leq 1$), a mixture of a first gas including at least chlorine as ingredient and a second gas including at least fluorine or oxygen as ingredient is used.

In this method, as to the first gas, $Cl_2$, $BCl_3$ or can be used and as to the second gas, $CF_4$, $C_2F_4$, $SF_6$, $O_2$, CO or $CO_2$ can be used. Dry etching with a mixture of these gases may be used in fabrication of semiconductor devices other than a laser.

According to an InGaAlBN based semiconductor laser of the present invention, a ridge is formed in a cladding layer of one side of a double heterostructure and in a region other than the ridge a light confining layer made of $In_pGa_qAl_rB_{1-p-q-r}N$ ($0 \leq p \leq 1$, $0 \leq q < 1$, $0 \leq r \leq 1$, $0 < p+r \leq 1$, $0 < p+q+r \leq 1$) with a refractive index larger than that of the cladding layer is formed. With the light confining layer, current confining is effected and at the same time optical confinement by a refractive index distribution is formed to control a transverse mode and, thereby, a threshold current density is reduced, which makes a continuous oscillation in a fundamental transverse mode possible.

Here, the light confining layer as mentioned above has been considered to be difficult to be selectively grown, since a lattice constant is much different from that of the double heterostructure. Therefore, in a conventional InGaAlN based semiconductor laser, no technical concept has been present that a light confining layer is formed in a region other than a ridge in a cladding layer. However, the inventors of the present invention has optimized various growth conditions in a metalorganic chemical vapor deposition method (MOCVD) or a molecular beam epitaxy method (MBE) through experiments in their serious research to make it clear for selective growth of the light confining layer to be practically possible.

In addition, it has been also made clear that in a structure having an InGaAlBN based light confining layer with an In compositional ratio of 0 or more, a carrier density in a cladding layer on the lower side of the light confining layer is increased. The reason why has been found to be that inactivation of a Mg acceptor by hydrogen and the like is suppressed and thereby carrier overflow is much reduced, as compared with a structure without a light confining layer. Moreover, by disposing a light confining layer of the present invention, more reduction in a threshold current density than conventionally possible and a continuous oscillation in a fundamental transverse mode has become a reality in a practical sense.

According to a semiconductor laser of the present invention, a low power laser of a thick film active layer and a high power laser of a thin film active layer are formed on the same substrate and therefore a laser performance which is required for both of read and erase/record in an optical disc system is realized in the semiconductor laser without any complicated process such as a thickness control of an active layer or the like.

Moreover, according to a semiconductor laser of the present invention, lasers of different wavelengths are formed on the same substrate and therefore a problem of non-compatibility originating from a difference in wavelength can be solved.

There will be described the relation between the thickness $t_B$ of the barrier layer and the thickness $t_w$ of the well layer in the core region. If the thickness $t_B$ is larger than the thickness $t_w$, the light confining effect is increased and the guided mode loss is decreased. If the thickness $t_B$ is not larger than the thickness $t_w$, the carriers are uniformly injected into the well layer, as a result, the threshold current can be reduced.

According to a method of the present invention, even with a thin contact layer, an opening of a current confining layer can be buried in it in a planar structure. That is, since the contact layer can be made thin, a device resistance in the contact layer is kept low and, since an electrode contact is fabricated planar, a crystallinity is good. A voltage drop at the electrode contact is suppressed and current injection is uniformly effected, so that improvements toward a low threshold and on reliability are achieved.

The above and other objects, and features and advantages of the present invention will be more apparent from the following detailed description taken in connection with the accompanying drawings, wherein, in the drawings, reference marks similar to each other show parts equivalent to each other.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A is a graph showing dependency of the equivalent refractive index difference $\Delta n_{eq}$ between inside and outside a stripe on the distance $h_{out}$ between a light confining layer and a core region;

FIG. 2B is a graph showing dependency of the loss a in a fundamental mode and the difference in loss $\Delta \alpha$ on the distance $h_{out}$ between a light confining layer and a core region;

FIG. 3A is a graph showing dependency of the threshold current density $J_{th}$ on the width of a stripe;

FIG. 3B is a graph showing dependency of the loss $\alpha_0$ and the difference in loss $\Delta \alpha$ on the width of a stripe;

FIG. 5A is a graph showing dependency of the astigmatic difference in each guided mode on the width of a stripe;

FIG. 5B is a graph of dependency of difference in loss $\Delta\alpha$ in each guided mode on the width of a stripe;

FIG. 6A is a graph showing a relationship of the loss a in a guided mode with the thickness $H_{clad}$ of a cladding layer and the difference $X_{Al}$ in Al compositional ratio between cladding and active layers;

FIG. 6B is a graph showing a relationship of the difference $X_{Al}$ in Al compositional ratio between cladding and active layers with the total thickness d of the active layer and the thickness $H_{clad}$ of a cladding layer;

FIG. 7 is a graph showing a relationship of the guided mode with the thickness $H_{clad}$ of a cladding layer in a SCH-MQW structure and the thickness $H_{guide}$ of a guide layer;

FIGS. 9A and 9B are graphs showing dependency of the intensity distribution of a far-field pattern on the thickness of a cladding layer;

FIGS. 10 and 11 are graphs showing a relationship of the boundary of a guided mode with the thickness $H_{clad}$ of a cladding layer in a SCH-MQW structure and the thickness $H_{guide}$ of a guide layer;

FIG. 12 is a graph showing dependency of the threshold current density per a unit thickness $J_{th}/d_{act}$ of a well layer on the magnitude of an optical confinement $\Delta x \cdot (H_{core}/\lambda) \cdot (H_{clad}/\lambda)$;

FIG. 13 is design examples of semiconductor laser structures in embodiments in the preceding figures;

FIG. 21 a graph showing the current density vs. voltage characteristic in a structure having an interface of p-GaAlN/p-InGaN;

FIG. 22 a graph showing the current density vs. voltage characteristic in a structure having an interface of n-GaAlN/n-InGaN;

FIG. 23 is a sectional view showing a structure of a semiconductor laser according to a fifth embodiment;

FIG. 24 is a sectional view showing a structure of a semiconductor laser according to a sixth embodiment;

FIG. 27 is a sectional view showing a structure of a semiconductor laser according to a ninth embodiment;

FIG. 28 is a sectional view showing a structure of a semiconductor laser according to a tenth embodiment;

FIG. 34 is a sectional view showing a structure of a semiconductor laser according to a sixteenth embodiment;

FIG. 35 is a sectional view showing a structure of a semiconductor laser according to a seventeenth embodiment;

FIGS. 42A to 42D are sectional views of a semiconductor laser in successive steps of fabrication thereof according to a twenty-first embodiment of the present invention;

FIG. 47 is a perspective view in section showing a configuration of electrodes of a laser according to the embodiment shown in FIG. 46;

DETAILED DESCRIPTION OF THE INVENTION

The present invention will be in detail described in reference to embodiments shown in the accompanying drawings below:

The First Embodiment

Figure 1:
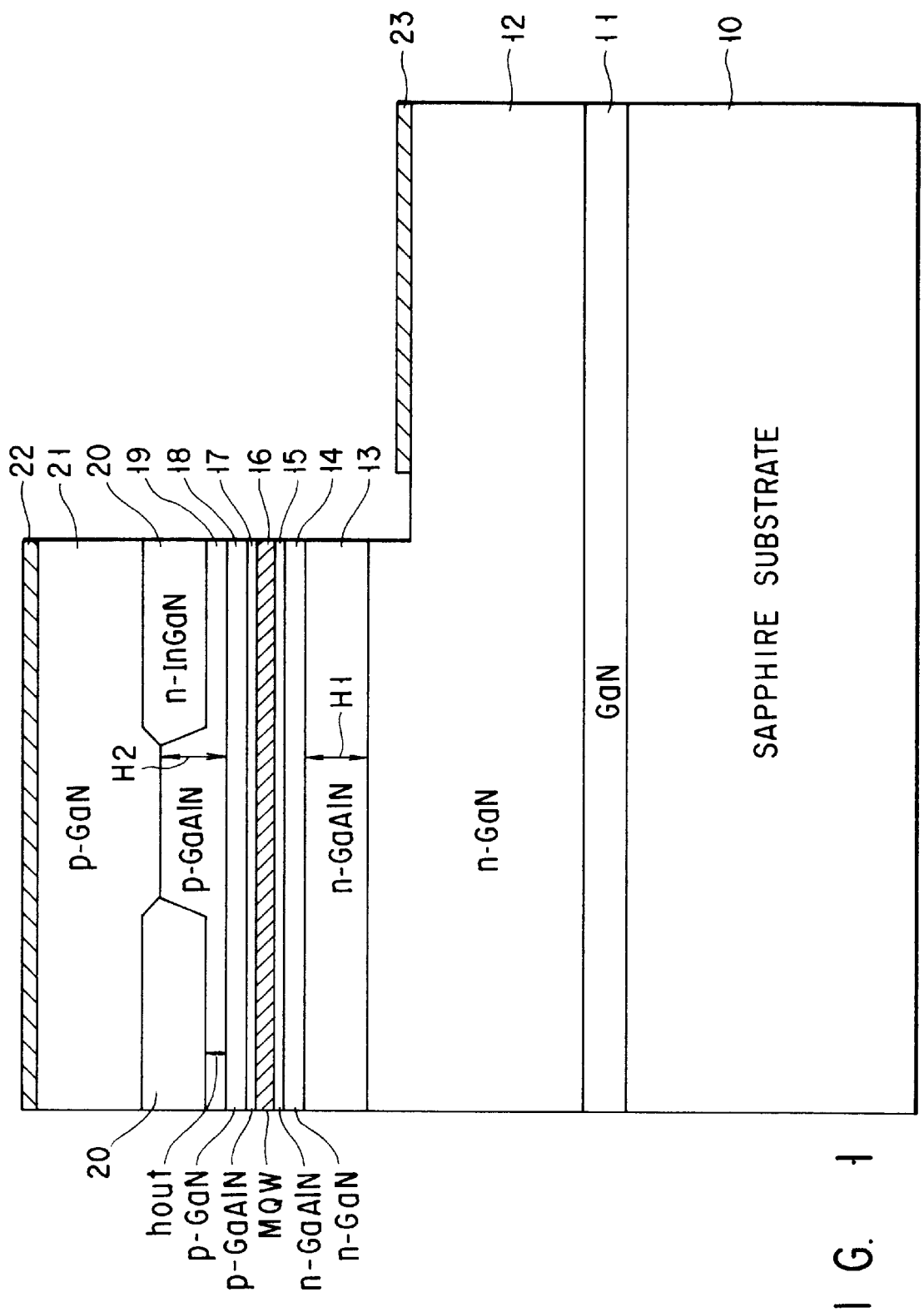
FIG. 1 is a sectional view showing a structure of a semiconductor laser according to a first embodiment of the present invention.

FIG. 1 is a sectional view showing a structure of a semiconductor laser according to the first embodiment of the present invention.

In the figure, 10 indicates a sapphire substrate and on the substrate the following layers are grown, in a layered structure, in the order: a GaN buffer layer 11, an n-type GaN contact layer 12, an n-type GaAlN cladding layer 13, an n-type GaN waveguide layer 14, an n-type GaAlN overflow blocking layer 15, an InGaN multi-quantum-well (MQW) active layer 16, a p-type GaAlN overflow blocking layer 17, a p-type GaN waveguide layer 18 and a p-type GaAlN cladding layer 19. The growth is conducted by means of an MOCVD method or an MBE method.

The p-type GaAlN cladding layer 19 is removed half way except for a stripe portion to form a ridge in the shape of a stripe in the cladding layer 19. An n-type InGaN light confining layer 20 is formed selectively in a region other than the ridge of the p-type GaAlN cladding layer 19 in a buried manner and a p-type GaN contact layer 21 is formed on the cladding and light confining layers 19, 20. The crystal growth is also conducted by means of an MOCVD method or an MBE method.

The layers from the p-type GaN contact layer 21 to the n-type GaAlN cladding layer 13 are partly removed by etching to expose a part of the n-type GaN contact layer 12. A p side electrode 22 is formed on the p-type GaN contact layer 21 and an n side electrode 23 is formed on the exposed portion of the n-type GaN contact layer 12.

An active layer portion of a laser in the embodiments (hereinafter sometimes referred to as a core region) has a SCH (separate-confinement heterostructure) structure in which the GaAlN overflow blocking layer 15, 17 and the GaN waveguide layers 14, 18 are arranged on both sides of the active layer 16 of a multi-quantum-well (MQW) composed of an $In_aGa_{1-a}N$ well layer/an $In_eGa_{1-e}N$ barrier layer ($a \geq e$). The core region in the present specification has a multi-layered structure located between both cladding layers and, in a concrete manner, it includes at least an active layer and, if desired, a waveguide layer and/or a carrier overflow blocking layer.

Moreover, in this embodiment, an n-type cladding layer 13 made of an $In_xGa_yAl_zB_{1-x-y-z}N$ ($0 \leq x, y, z; x+y+z \leq 1$) based material includes neither In nor B and, therefore, it is expressed $Ga_{1-z}Al_zN$. The active layer 16 does not include Al and, therefore, the well layer and barrier layer composing MQW are respectively expressed $In_aGa_{1-a}N$ and $In_eGa_{1-e}N$. In a similar way, a p-type cladding layer 19 made of an $In_uGa_vAl_wB_{1-u-v-w}N$ ($0 \leq u, v, w, u+v+w \leq 1$) based material includes neither In nor B and, therefore, it is expressed $Ga_{1-w}Al_wN$.

Next, functions of the semiconductor laser having the above structure will be described. The descriptions are made in the order of a transverse mode control, reduction in threshold value and carrier overflow blocking.

The Transverse Mode Control in a Horizontal Direction

In the semiconductor laser of the embodiment, the n-type InGaN light confining layer 20 is disposed close to the core region and, therefore, an equivalent (effective) refractive index of a region other than the stripe portion is decreased to effect a mode confinement by forming a refractive index distribution in a horizontal direction.

Here, an In compositional ratio of the n-type InGaN light confining layer 20 is set at a higher value than that of the $In_aG_{1-a}N$ well layer. Therefore, a refractive index of the light confining layer 20 is larger than that of the well layer. A bandgap energy of the light confining layer 20 is smaller than that of the well layer.

A refractive index of the light confining layer 20 is larger than that of the p-type GaAlN cladding layer 19 of the stripe and a bandgap energy of the light confining layer 20 is smaller than that of the p-type GaAlN cladding layer of the stripe.

In such a manner, despite of the presence of the light confining layer 20 having a refractive index larger than that of the stripe portion, an effective refractive index is decreased. The reason why is as follows: That is, a guided mode in the light confining layer 20 has a large attenuation due to a large absorption loss for an oscillating wavelength, so that a guided mode distribution has a very small share in the light confining layer 20. In other word, since contribution to an effective refractive index by the light confining layer 20 is small, as a result, an effective refractive index of the region outside the stripe is smaller than that of the stripe portion.

To sum up the above description, the semiconductor laser having the structure shown in FIG. 1 has a loss guiding structure wherein the portion outside the stripe has a smaller effective refractive index and a large loss. This loss guiding structure is very effective for stabilization of a fundamental transverse mode. That is, since a loss region is outside the stripe portion, a higher mode having a broad width of distribution has a large loss or cut-off there, as compared with that of a fundamental mode, only the fundamental mode can oscillate in a stable manner.

Such a loss guiding structure can only realized when a material for the light confining layer 20 has a lower bandgap than that of the active layer. As to the light confining layer, for example, InGaN is suitable because of its large absorption loss.

In succession, conditions for a traverse mode control will be described.

FIG. 2A is a graph showing dependency of the difference in effective refractive indexes $\Delta n_{eq}$ between a stripe and outside the stripe on the distance $h_{out}$ between a light confining layer 20 outside the stripe and the core region (a distance up to the p-type GaN waveguide layer 17). FIG. 2B is a graph showing dependency of the loss α in a fundamental mode and the difference in loss Δα between a first-order mode and a fundamental mode on the distance $h_{out}$ between the light confining layer 20 outside the stripe and the core region.

A waveguide mechanism is analyzed in these figures in the case where a layered structure of the stripe portion is an n-type $Ga_{0.85}Al_{0.15}N$/an n-type GaN (0.1 μm)/MQW/a p-type GaN (0.1 μm)/a p-type $Ga_{0.85}Al_{0.15}N$ and a layered structure outside the stripe portion is an n-type $Ga_{0.85}Al_{0.15}N$/an n-type GaN (0.1 μm)/MQW/a p-type GaN (0.1 μm)/a p-type $Ga_{0.85}Al_{0.15}N$ ($h_{out}$ μm)/an n-type InGaN.

In the figures, MQW is composed in two ways, one of which is a structure having five pairs of an $In_{0.18}Ga_{0.82}N$ well layer (2 nm)/an $In_{0.04}Ga_{0.96}N$ barrier layer (4 nm), and the other is ten pairs thereof.

In order to stabilize a fundamental transverse mode, a difference in loss between the higher order and fundamental mode is desirably set large. As seen from the figures, an $h_{out}$ should be selected larger from this viewpoint. However, if the $h_{out}$ is too large, $\Delta n_{eq}$ gets smaller. A change in refractive index of the order of $10^{-4}$ arises even by a plasma effect with carrier injection and, therefore, a waveguide structure in this region gets unstable. Accordingly a value of $h_{out}$ should be set 0.3 μm or less, or more preferably 0.2 μm or less.

FIG. 3A is a graph showing dependency of the threshold current density $J_{th}$ on the width of a stripe in the case where $h_{out}$=0.2 μm. FIG. 3B is a graph showing dependency of $\alpha_0$ and $\Delta \alpha$ on the width of a stripe in the case where $h_{out}$=0.2 μm.

When the width of a stripe is larger, $\Delta \alpha$ is smaller and, therefore, a higher order mode is easier to occur. On the other hand, when the width of a stripe is smaller, $\alpha_0$ in a fundamental mode is increased and a threshold current density $J_{th}$ is also increased. Accordingly, the width of a stripe should desirably be set 3 μm or more.

Figure 4A:
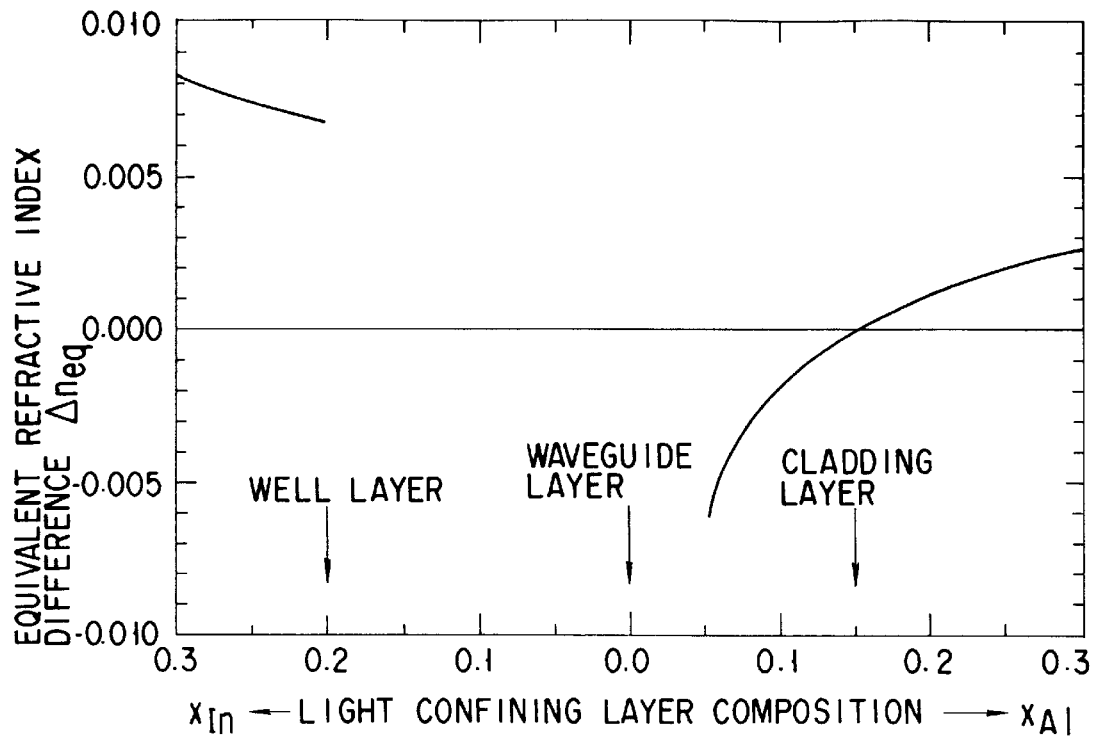
FIG. 4A is a graph showing a relationship between the equivalent refractive index difference $\Delta n_{eq}$ between inside and outside a stripe and the composition of a light confining layer.
Figure 4B:
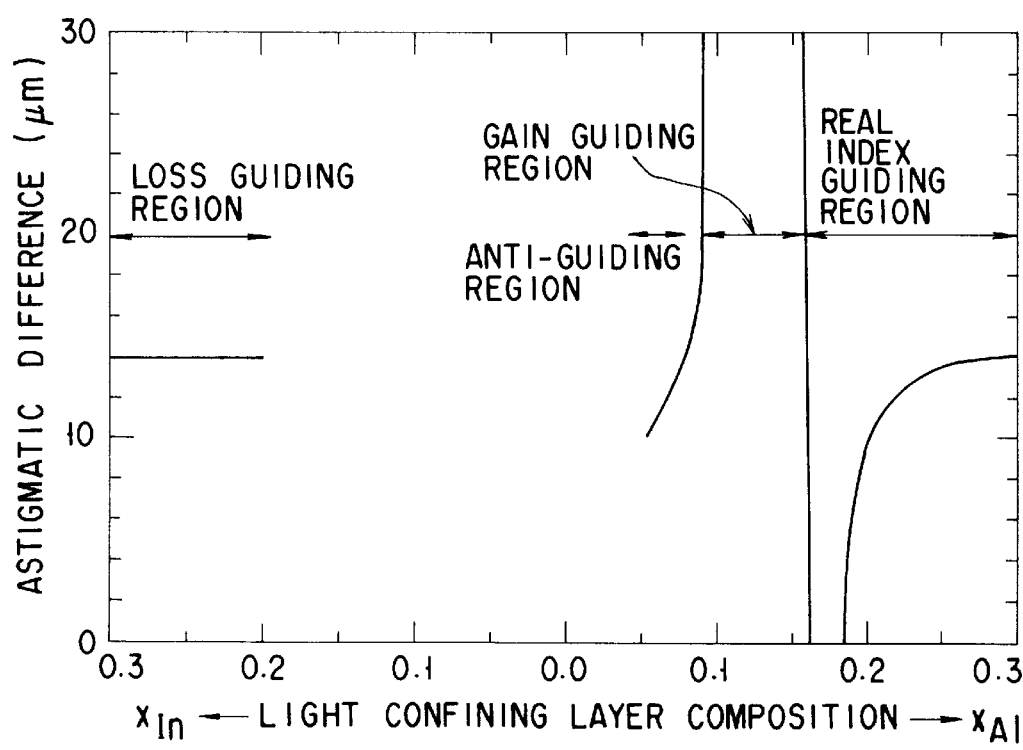
FIG. 4B is a graph showing a relationship between the astigmatic difference of a beam and the composition of a light confining layer.

As shown in FIGS. 4A and 4B, a composition of the light confining layer has a great influence on a waveguide mechanism. In theses figures, a wave guide mechanism is analyzed in the case where a layered structure of the stripe portion is an n-type $Ga_{0.85}Al_{0.15}N$/an n-type GaN (0.1 μm)/MQW/a p-type GaN (0.1 μm)/a p-type $Ga_{0.85}Al_{0.15}N$ and a layered structure outside the stripe portion is an n-type $Ga_{0.85}Al_{0.15}N$/an n-type GaN (0.1 μm)/MQW/a p-type GaN (0.1 μm)/a p-type $Ga_{0.85}Al_{0.15}N$ (0.05 μm)/an n-type InGaAlN. The n-type InGaAlN layer outside the stripe portion corresponds to the light confining layer.

In this case, MQW has a structure comprising five pairs of an $In_{0.2}Ga_{0.8}N$ well layer (2 nm)/an $In_{0.05}Ga_{0.95}N$ barrier layer (4 nm).

In FIG. 4A, a relationship between the difference in effective refractive index $\Delta n_{eq}$ between inside and outside the stripe portion and the composition is shown in the case where the light confining layer is $In_xGa_{1-x}N$ or $Ga_{1-x}Al_xN$.

A region wherein $x_{In} \geq 0.2$ corresponds to a loss guiding type of this embodiment. This loss guiding region has, as shown in FIG. 4B, a small astigmatic difference (when the width of a stripe is 5 μm) and, therefore, beam characteristics suitable for an optical disc application can be obtained.

A region wherein $0 \leq x_{In} \leq 0.2$ is a region where a guided mode in a vertical direction cannot be formed outside the stripe portion and, accordingly, an oscillation mode is unstable.

On the other hand, the light confining layer can be classified into three regions in regard to a waveguide mechanism, as shown in FIG. 4B, when $Ga_{1-x}Al_xN$ having a smaller refractive index than that of a waveguide layer is used as a material of the light confining layer.

A first region has an Al compositional ratio of the light confining layer larger than that of the stripe portion, that is, a refractive index of the light confining layer is in the range smaller than that of the cladding layer. The first region has a so-called real refractive index guiding structure.

A second region has an Al compositional ratio of the light confining layer in the range close to that of the cladding layer, is of a gain guiding structure due to a small $\Delta n_{eq}$ and has a extremely large astigmatic difference as shown in the figure. A beam having a large astigmatic difference of this kind is not suitable for an optical disc application.

A third region has a characteristic to be worthy of attention in FIG. 4B. In the region, an Al compositional ratio of the light confining layer is smaller than that of the cladding layer but larger than that of the waveguide layer. That is, the third region is in the range wherein a refractive index is larger than that of the cladding layer, but smaller than that of the waveguide layer and has an anti-guiding region where it has a smaller astigmatic difference. This anti-guiding region has a negative $\Delta n_{eq}$ and an effective refractive index outside the stripe portion is larger than that inside the stripe portion. An embodiment using this anti-guiding region will be described later.

FIG. 4B shows that a small astigmatic difference can be obtained even in a real index guiding region wherein an Al compositional ratio of the light confining layer is larger than that of the cladding layer.

Next, it will be described that a loss guiding or anti-guiding structure of the present invention is excellent in stabilization of a fundamental transverse mode.

FIG. 5A shows dependency of astigmatic differences in a gain guiding type, a real index guiding type, a loss guiding type and an anti-guiding type on the width of a stripe. FIG. 5B shows dependency of the difference in guiding loss $\Delta \alpha$ between the first-order mode and the fundamental mode in respective guiding types on the width of a stripe. As a beam characteristic, it is preferable that an astigmatic difference is small. From a viewpoint of stabilization of a fundamental transverse mode, it is desirable that a difference in modal loss is large.

As shown in the figure, a gain guiding type has a large difference in modal loss, but it is hard to be used in application of an optical disc and the like, since an astigmatic difference is extremely large. A real index guiding type is easy to produce a higher-order mode, if the width of a stripe is larger, since it has a small astigmatic difference but has a small difference in modal loss as well.

To the contrary, loss guiding and anti-guiding types each have a small astigmatic difference and can secure a larger difference in modal loss even with a large width of the stripe. The large width of a stripe makes a fabrication process easier and a freedom in design larger and, therefore, it is understood that a semiconductor laser of the present invention is excellent in both aspects of a characteristics and easiness of fabrication.

The Transverse Mode Control in a Vertical Direction

What is problematic in crystal growth of an InGaAlN based material is that, for example, when a thick layer having Al such as a GaAlN layer is grown, cracks are sometimes generated in an Al containing layer such as GaAlN, since there is a difference in lattice constant between an underlying GaN and the Al containing layer. In order to prevent the cracks of this kind, it is required to decrease an Al compositional ratio or reduce a thickness of the GaAlN layer. On the other hand, when a layer including Al is used as a cladding layer of a laser, there is a need for the presence of a difference in refractive index (that is a difference in Al compositional ratio) and a thickness of the cladding layer $H_{clad}$ respectively larger than certain values. Relationships between the total thickness of an active layer d, the thickness of a cladding layer $H_{clad}$, the difference in Al compositional ratio $\Delta X_{Al}$ between the cladding and active layers and the loss $\alpha$ in a guided mode are shown in FIGS. 6A and 6B.

As can be seen from the figures, the larger $\Delta X_{Al}$ is, or the larger $H_{clad}$ is, the smaller $\alpha$ is and, in a practical sense, it is enough, if $\alpha$ can be as small as on the order of 20 cm$^{-1}$. A range in which $\alpha$ is smaller than 100 cm$^{-1}$ and larger than 20 cm$^{-1}$ is obtained according to the following relation (1):

$$0.18(\Delta X_{Al} d/\lambda)^{-1/2} \leq H_{clad}/\lambda \leq 0.27(\Delta X_{Al} d/\lambda)^{-1/2} \quad (1)$$

Accordingly, if a thickness $H_{clad}$ of the cladding layer is set in the range, a laser structure having a small loss and a thickness which does not cause cracks in crystal growth can be produced.

What is to be further considered in an InGaAlN based laser related to the relation (1) is that a contact layer or the like disposed outside a cladding layer has a larger refractive index than that of the cladding layer and is transparent against an oscillation wavelength. For this reason, when a thickness $H_{clad}$ of the cladding layer is not sufficiently large, a waveguide structure in the direction of a layer (a vertical direction) becomes of anti-guiding and, depending on circumstances, a threshold value becomes extremely large or a state of no guided mode can be brought up.

FIG. 7 shows an example of an relationship between the thickness $H_{clad}$ of a cladding layer and the thickness $H_{guide}$ of a waveguide layer, and the boundary of a guided mode in a SCH-MQW structure. The layered structure is shown as an example of computation which is an n-type GaN/an n-type $Ga_{0.85}Al_{0.15}N$ ($H_{clad}$ μm)/an n-type $In_{0.06}Ga_{0.94}N$ ($H_{guide}$ μm)/MQW/a p-type $In_{0.06}Ga_{0.94}N$ ($H_{guide}$ μm)/a p-type $Ga_{0.85}Al_{0.15}N$ ($H_{clad}$ μm)/a p-type GaN. MQW has a structure having ten pairs of an $In_{0.2}Ga_{0.8}N$ well layer (2 nm)/an $In_{0.05}Ga_{0.95}N$ barrier layer (4 nm). An absorption coefficient of the outermost layer GaN is set 500 $cm^{-1}$.

A region hatched with oblique lines in FIG. 7 is a region of no guided mode. In regions where guided modes are available, an upper region above a downward oblique curve portion, which is drawn toward the right, is an anti-guiding region and a lower region under an upward oblique curve portion, which is drawn toward the right, is a common index guiding region. On the curve of a boundary, a optical confinement factor $\Gamma$ is 0 and a threshold current density $J_{th}$ is infinity. This situation is shown in FIGS. 8A and 8B.

In FIGS. 9A and 9B, dependency of the intensity distribution of a far-field pattern on the width of a cladding layer is shown.

Figure 10:
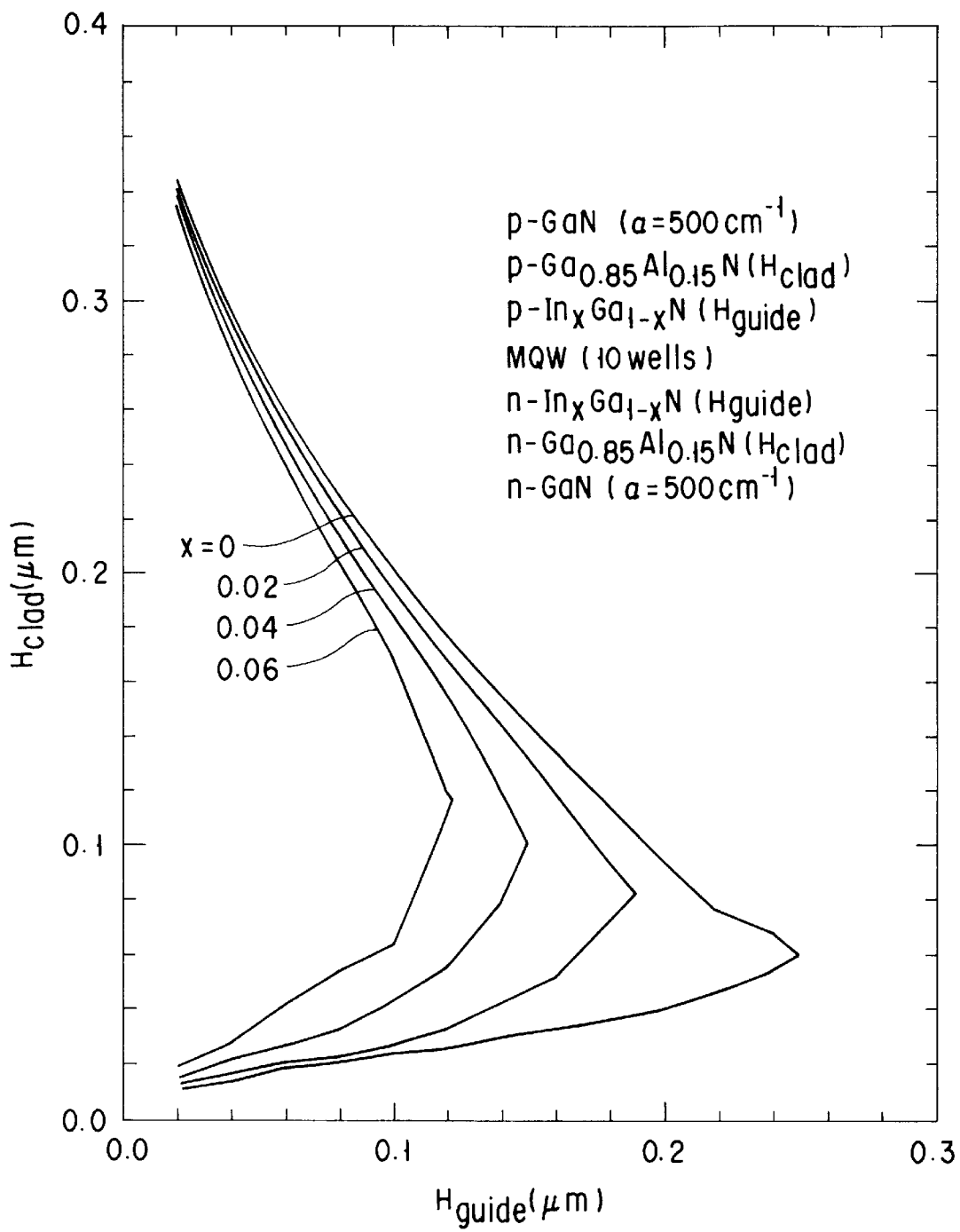

FIG. 9A is of the case where $H_{guide}$=0.1 μm, FIG. 9B is of the case where $H_{guide}$=0.2 μm. It is seen from a figure that, at parameters of an anti-guiding region, the far-field pattern has a double peak. FIG. 10 shows a boundary of a region where a guided mode is present.

Figure 8A:
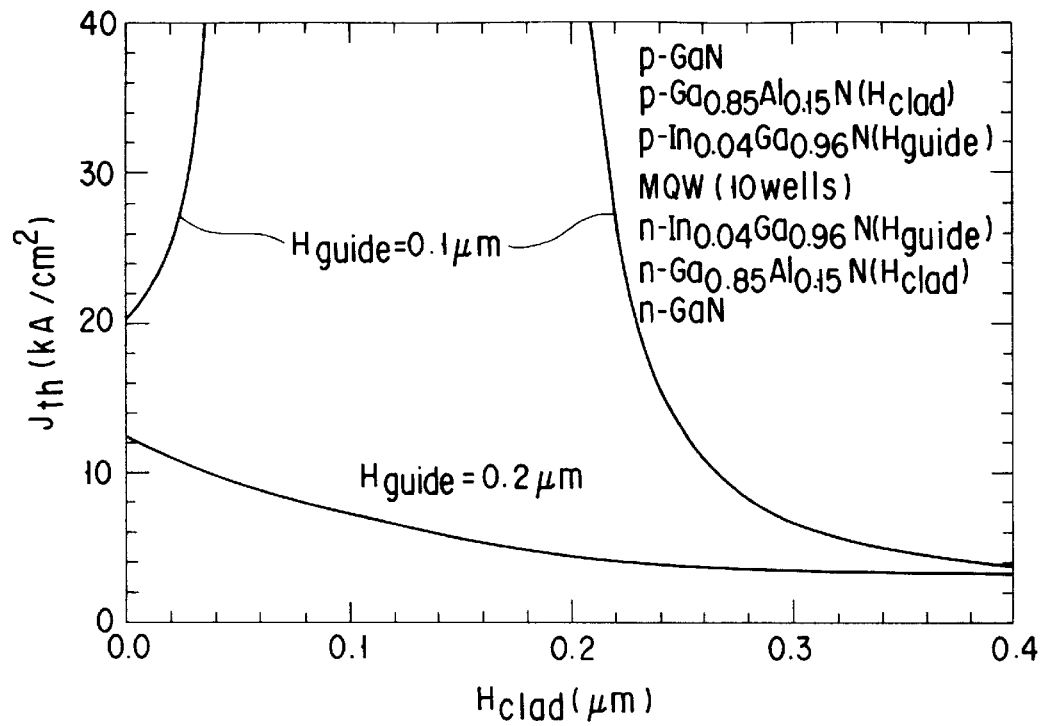
FIG. 8A is a graph showing a relationship of the threshold current density $J_{th}$ with the thickness $H_{clad}$ of a cladding layer and the thickness $H_{guide}$ of a guide layer.
Figure 8B:
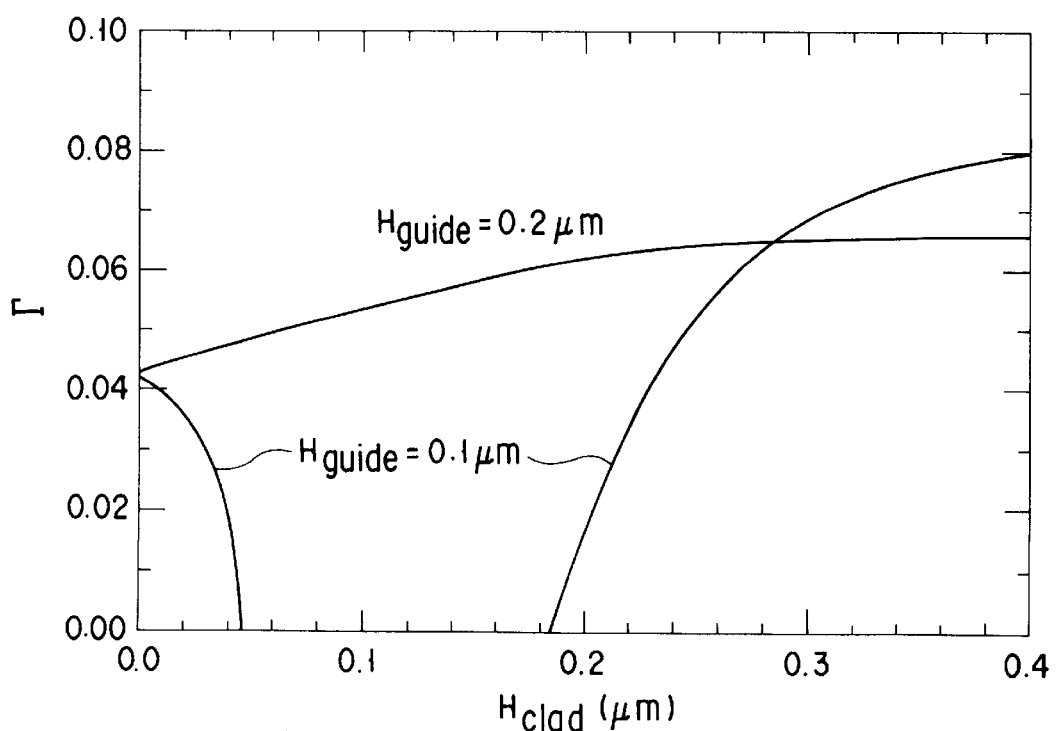
FIG. 8B is a graph showing a relationship of an optical confinement factor $\Gamma$ with the thickness $H_{clad}$ of a cladding layer and the thickness $H_{guide}$ of a guide layer.

As can be seen from FIGS. 8A and 8B, in order to reduce a threshold value to an extent, it is necessary to set a thickness $H_{clad}$ of the cladding layer at a value sufficiently remote from the boundary of a region of no guided modes. In the computation conducted here, an absorption coefficient of the outermost GaN layer was set at 500 $cm^{-1}$ but this value is changeable, since it is affected by a concentration of an impurity and the like. If an absorption coefficient is smaller, an anti-guiding property is strengthened and, as a result, a parameter range in which no guided mode is present is broadened.

In FIG. 11, a region where guided modes are present is shown, when an absorption coefficient of the outermost GaN layer is 100 $cm^{-1}$. As can be seen from a comparison with FIG. 10, a region where no guided mode is present is expanded. In each case, it is apparently necessary that a thickness of the cladding layer $H_{clad}$, a thickness $H_{guide}$ of a guided layer and the like are set in a specified ranges. Conditions for this $H_{clad}$ and the like can be designated with an equation like the relation (1). The conditions expressed by the relation (1) is an approximation in the case where a thickness of an active layer d is small and, therefore, since a light confining region covers a thick region including a waveguide layer in a SCH structure, $(\Delta X_{Al} d/\lambda)^{-1/2}$ of the relation (1) should preferably be replaced with $(\Delta x_{Al} d/\lambda)^{-\frac{1}{2}}$.

In a concrete manner, a second relation (2) describing the conditions is as an approximation obtained from FIGS. 7, 10 and the like as below:

$$\Delta x \cdot (H_{core}/\lambda) \cdot (H_{clad}/\lambda) \geq 0.08 \quad (2)$$

wherein $H_{core}$ is a total thickness including guided layers (MQW+guided layers) and $\Delta x$ is a difference in composition between the core region and cladding layers, which is approximately proportional to a difference in refractive index between the core region and cladding layer.

In the example of a layered structure shown here, $\Delta x$ is defined with the following equation (3):

$$\Delta x = x_{Al} + y_{In} \quad (3)$$

wherein $x_{Al}$ is an Al compositional ratio in a cladding layer and $y_{In}$ is an average In compositional ratio in a core region. In the case where In is included in the cladding layer, it is only required that $x_{Al}$ is replaced with $x_{Al}$-$x_{In}$ ($x_{In}$ is an In compositional ratio in the cladding layer). When Al is included in the core region, it is only required that $y_{In}$ is replaced with $y_{In}$-$y_{Al}$ ($y_{Al}$ is an average Al compositional ratio in the core region).

In the example as above mentioned of an n-type GaN/an n-type $Ga_{0.85}Al_{0.15}N$ ($H_{clad}$ μm)/an n-type $In_{0.06}Ga_{0.94}N$ ($H_{guide}$ μm)/MQW/a p-type $In_{0.06}Ga_{0.94}N$ ($H_{guide}$ μm)/a p-type $Ga_{0.85}Al_{0.15}N$ ($H_{clad}$ μm)/a p-type GaN, $x_{Al}$=0.15, $y_{In}$=0.069 (in the case of $H_{guide}$=0.1 μm, and MQW with ten wells). In this case, where $\lambda$=420 μm, a condition for a thickness of the cladding layer given by the relation (2) is $H_{clad}$>0.244 μm. The left side of the relation (2) corresponds to a value showing a degree of an optical confinement to the core region.

FIG. 12 shows dependency of a threshold value on the above mentioned parameter $\Delta x \cdot (H_{core}/\lambda) \cdot (H_{clad}/\lambda)$. In this figure, an axis of ordinate represents a value which is obtained by dividing a threshold value by a total thickness of the active layer $J_{th}/d_{act}$. In the MQW structure case, $d_{act}$ corresponds to a total thickness of the well layers. In the same way, $d_{act}$ is a thickness of a quantum well for SQW structure, and $d_{act}$ is the active layer thickness for bulk active layer case. As shown in the figure, $J_{th}/d_{act}$ is greatly dependent on $\Delta x \cdot (H_{core}/\lambda) \cdot (H_{clad}/\lambda)$. This dependency is changed by a different magnitude of an absorption coefficient of a contact layer which is the outermost layer and the like. The contact layer has actually a extremely high concentration of an impurity as a common case and, therefore, an absorption coefficient can be also changed.

$J_{th}$ can be naturally dependent on $d_{act}$. In order to reduce a threshold value, it is better to decrease $d_{act}$. For example, in FIG. 12, when $\Delta x \cdot (H_{core}/\lambda) \cdot (H_{clad}/\lambda)$ is sufficiently large, $J_{th}/d_{act} \neq 2 \times 10^9$ $cm^{-3}$. In this case, in order that $J_{th}$<10 $kA/cm^2$, it is necessary that $d_{act}$<0.05 μm. According to another computation, it has been found that when a total thickness of an active layer is 0.05 μm or more, an influence of a carrier overflow becomes larger.

From the above discussion, in an InGaAlN based laser, oscillation at a low threshold value can be obtained, as far as the laser is fabricated under the condition expressed in the relation (2) and in the following ranges of a total thickness of an active layer:

$$d_{act} < 0.05 \text{ μm} \quad (4)$$

Or, more preferably, $$d_{act} < 0.045 \text{ μm} \quad (5)$$

As can been seen from FIG. 12, if $\Delta x \cdot (H_{core}/\lambda) \cdot (H_{clad}/\lambda)$ is set in the following range, a low threshold can be realized regardless of an absorption coefficient of a contact layer and the like:

$$\Delta x \cdot (H_{core}/\lambda) \cdot (H_{clad}/\lambda) \geq 0.1 \qquad (6)$$

The relations (2) and (5) are relations which give the lower limit of a thickness $H_{clad}$ of the cladding layer. On the other hand, when $H_{clad}$ is larger in excess, there arise problems that a voltage drop becomes larger, cracks are generated. In order to avoid theses problem, it is desirable to set $H_{clad}$ in the following range:

$$x_{Al} \cdot H_{clad} \leq 0.1 \ \mu m \qquad (7)$$

Or, more preferably, $$x_{Al} \cdot H_{clad} \leq 0.06 \ \mu m \qquad (8)$$

In a fact, as understood from FIG. 12, the thickness $H_{clad}$ of the cladding layer is not necessary to be thick, and a voltage drop in the cladding layer can be decreasing setting an upper limit of $H_{clad}$ as shown in the following relation (9) provided relation (2) or (6) is satisfied.

$$\Delta x \cdot (H_{core}/\lambda) \cdot (H_{clad}/\lambda) \leq 0.2 \qquad (9)$$

Further, as can be understood from FIG. 12 a sufficiently lower threshold value can be obtained by setting the upper limit of $H_{clad}$ as shown in the following relation (10).

$$\Delta x \cdot (H_{core}/\lambda) \cdot (H_{clad}/\lambda) \leq 0.15 \qquad (10)$$

To summarize an above description a lower limit of the thickness $H_{clad}$ of the cladding layer, can be set based on the relation (2), or more preferably, can be set based on the relation (6). The upper limit of the thickness $H_{clad}$ of the cladding layer, can be set based on the relation (8) or (9), or more preferably, can be set by the relation (10).

In addition, by setting of the total thickness of the active layer as shown in the relation (4) or more preferably as shown in the relation (5), the oscillation in the low threshold value can be realized.

What is further to be worthy of attention is in FIGS. 7 to 11 that, in the case where an In compositional ratio of a waveguide layer is large to some extent and a thickness thereof is also large, there are some cases that a threshold value does not become infinity regardless of a thickness of the cladding layer. In such a case, a threshold value does not change a lot even in a region where a waveguide structure changes from a common index guiding type to an anti-guiding type (see FIGS. 8A and 8B). Accordingly, if a laser is fabricated in such a range of a structural parameter, the fabrication can be efficiently carried out because of a large allowance for the parameter. The range are given in the following approximations:

$$(y_{In})^{1/2} \cdot (H_{core}/\lambda) \geq 0.15 \qquad (11)$$

Or, more desirably, $$(y_{In})^{1/2} \cdot (H_{core}/\lambda) \geq 0.2 \qquad (12)$$

That is, if the waveguide layer includes In, and the parameters are set so as to satisfy the equations (11) or (12), a laser with a low threshold value and a large allowance in fabrication can be realized.

An example for designing a layered structure to realize a low threshold value as mentioned above, is shown in FIG. 13. In the examples, as a structure of MQW, the case where the well layer is an $In_{0.2}Ga_{0.8}N$ (2 nm) and the barrier layer is an $In_{0.05}Ga_{0.95}N$ (4 nm) is cited, but other structures than this are applicable instead. The examples described in FIG. 13 all satisfy the relations (2) and (5). Examples [2] to [8] satisfy further a condition of the relation (11). An example [6] satisfy still further satisfy the relation (12). A layered structure is not necessarily symmetrical, but, as in the examples [7] and [8], it may be asymmetrical.

As seen from a comparison between FIGS. 10 and 11, when a refractive index of a contact layer and the like outside a cladding layer is larger than that of the cladding layer, it is desirable that an absorption coefficient is large. A value of absorption coefficient is given in the following relation (13) based on FIG. 12:

$$\alpha \geq 100 \ cm^{-1} \qquad (13)$$

Or, more preferably, $$\alpha \geq 500 \ cm^{-1} \qquad (14)$$

As methods to increase an absorption coefficient, it is effective to use an InGaN contact layer, other than to increase a concentration of an impurity. Especially it is effective to use InGaN having a smaller bandgap than that of a well layer.

Reduction in Threshold Current

A multi-quantum-well structure (MQW) is effective to reduce a threshold current of a laser. A semiconductor laser of the present invention shows a conspicuous threshold current reducing effect by using this MQW structure together with a transverse mode control structure. The reason why is that a threshold current reducing effect by a transverse mode control structure is added to a threshold current reducing effect by MQW and, besides, a contact resistance which is a great problem in an InGaAlN system can be much reduced.

Figure 14A:
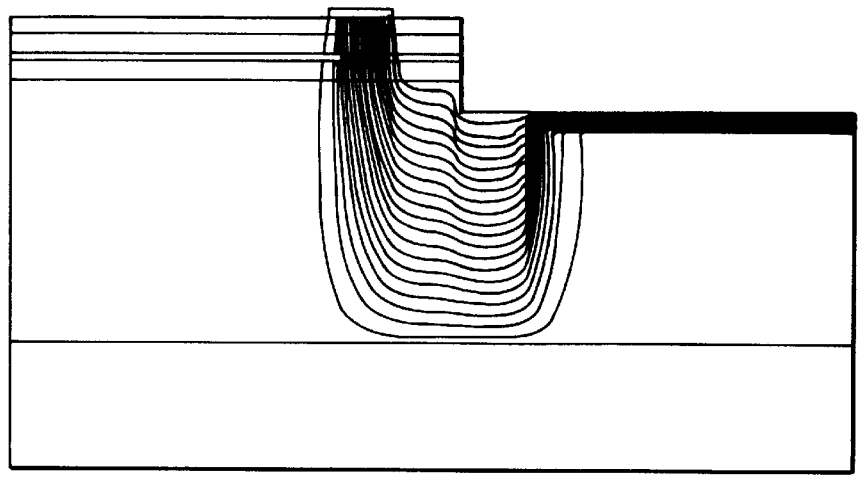
FIGS. 14A to 14C are graphs showing models for explaining the threshold value reducing effect of the present invention.
Figure 14B:
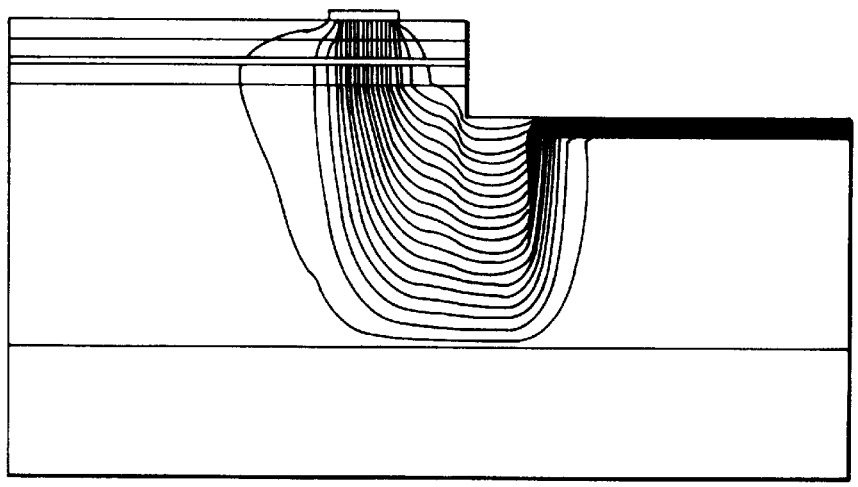
Figure 14C:
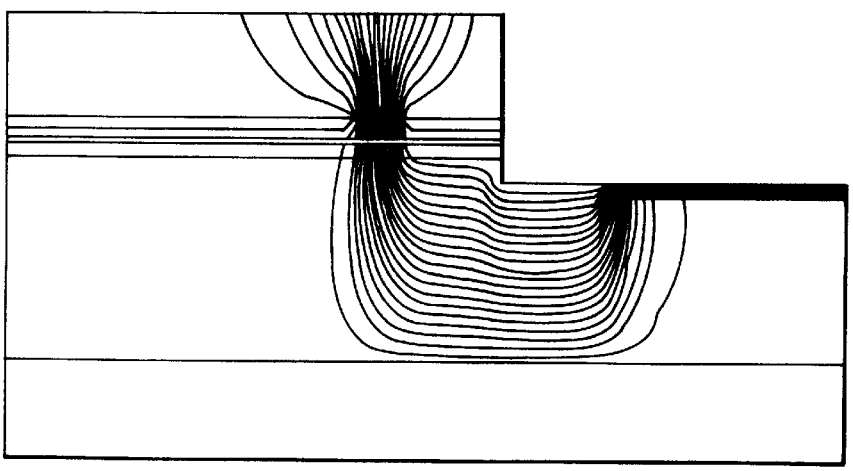

These effects are described in reference to FIGS. 14A to 14C. FIG. 14A shows a current distribution in an InGaAlN laser with a conventional electrode stripe structure. In this structure, in order to realize a fundamental transverse mode oscillation by gain guiding, it is necessary to reduce a width of the electrode stripe to a very small value on the order of several $\mu$m. However, when the stripe width is reduced to a very small value, a p-type contact resistance is greatly increased, so that a heat generation in this portion makes it almost impossible to operate continuous oscillation at room temperature.

In order to prevent the heat generation, there are two solutions, one of which is to broaden the width of a stripe, and the other is to reduce a threshold current. However, in the former case, a fundamental transverse mode oscillation cannot be obtained and, in the latter case, a current density is reduced and, thereby, a current spreads in a core region, as shown in FIG. 14B, so that a fundamental transverse oscillation cannot be obtained either.

In contrast, in a transverse mode control structure of the present invention, since an oscillation mode is determined by a light confining layer, no influence of the magnitude of a current on a mode is effected. Moreover, since the light confining layer additionally works as a current confining layer, the magnitude of the current can be diminished. A threshold current reducing effect by MQW greatly decreases a operating current. Besides, a current spreads in a p-type contact layer, as shown in FIG. 14C, thereby a contact resistance is also reduced by a large current path and, as a result, no heat generation occurs. Accordingly, with this structure, a continuous oscillation at room temperature is, for the first time, made practically possible.

Carrier Overflow Blocking

In an InGaAlN system, there is a problem, in addition to a problem of cracking during crystal growth as mentioned above, that it is difficult to produce a p-type crystal with a high carrier concentration. If a carrier concentration in a p-type cladding layer is low, an overflow of electrons from an active layer to the p-type cladding layer occurs to increase a threshold current at a great rate. Especially, when a carrier concentration in the cladding layer is lower than $10^{17}$ cm$^{-3}$, this inclination is tremendous. In an actual crystal, since it is difficult to obtain a crystal with a high carrier concentration and a high Al compositional ratio, which is used as a cladding layer, a problem in crystal growth is still left unsolved.

To prevent a carrier overflow even in a low carrier concentration, in the embodiment of the present invention, carrier blocking layers 15, 17 made of GaAlN are disposed between an MQW active layer 16 and waveguide layers 14, 18. Since the overflow blocking layers 15, 17 are very thin layers with a thickness in the range of 5 nm to 500 nm, a shape of a guided mode distribution is not almost affected, but they can effectively prevent a carrier overflow by the help of a heterobarrier effect between themselves and the active layer.

This overflow blocking layer is especially effective, when a carrier concentration in the cladding layer is low. In an InGaAlN system, since an n-type GaAlN layer with a comparatively high carrier concentration can be formed, there is no need for an overflow blocking layer on the n side. However, when a low carrier concentration is adopted in order to improve morphology, it is better to have an overflow blocking layer on the n side. This is held true in the case of an overflow blocking layer on the p side but when a p-type cladding layer with a carrier concentration of $10^{17}$ cm$^{-3}$ or more is used, an overflow blocking layer is unnecessary.

Figure 15A:
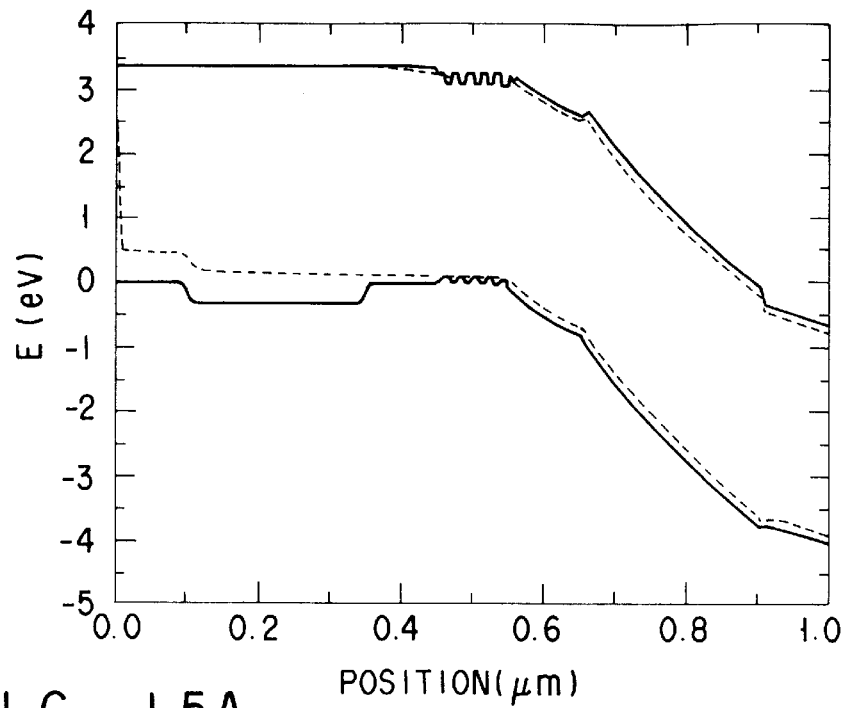
FIGS. 15A and 15B are graphs showing band structures and distributions of electrons and holes without an overflow blocking layer.
Figure 15B:
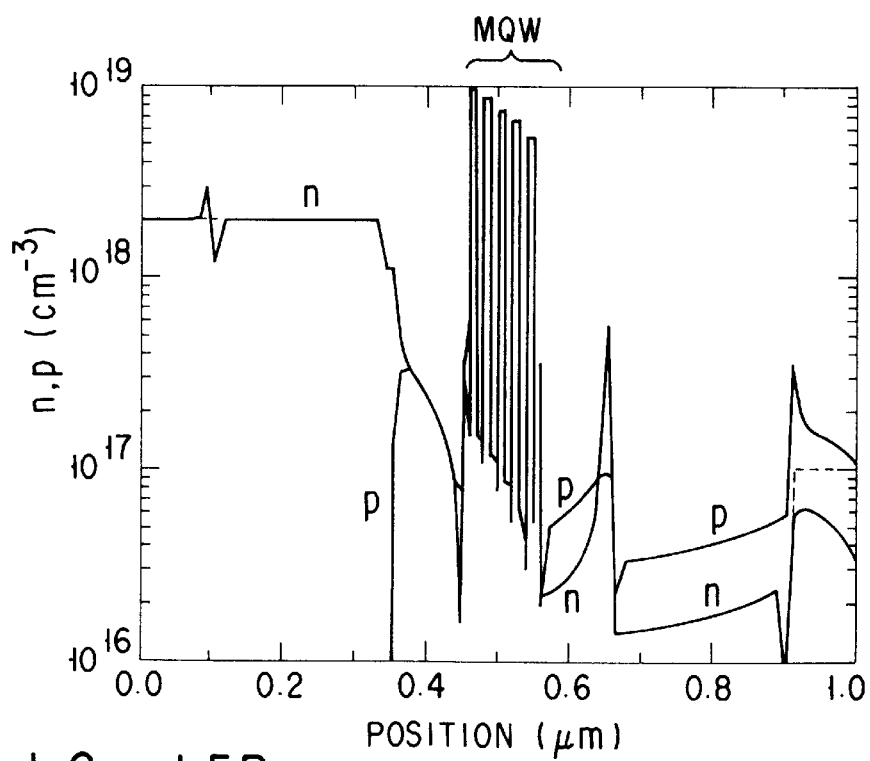

An effect of an overflow blocking layer 17 on the p side when a carrier concentration in a p-type cladding layer 19 is low are shown in FIGS. 15A, 15B, 16A and 16B. FIGS. 15A and 15B are to show a band structure and distributions of electrons and holes in the case where a carrier concentration in the p-type cladding layer 19 is $1 \times 10^{16}$ cm$^{-3}$ and an overflow blocking layer is not included. As clearly seen from the figures, a conspicuous overflow of electrons occurs from an active layer to a p-type cladding layer side.

Figure 16A:
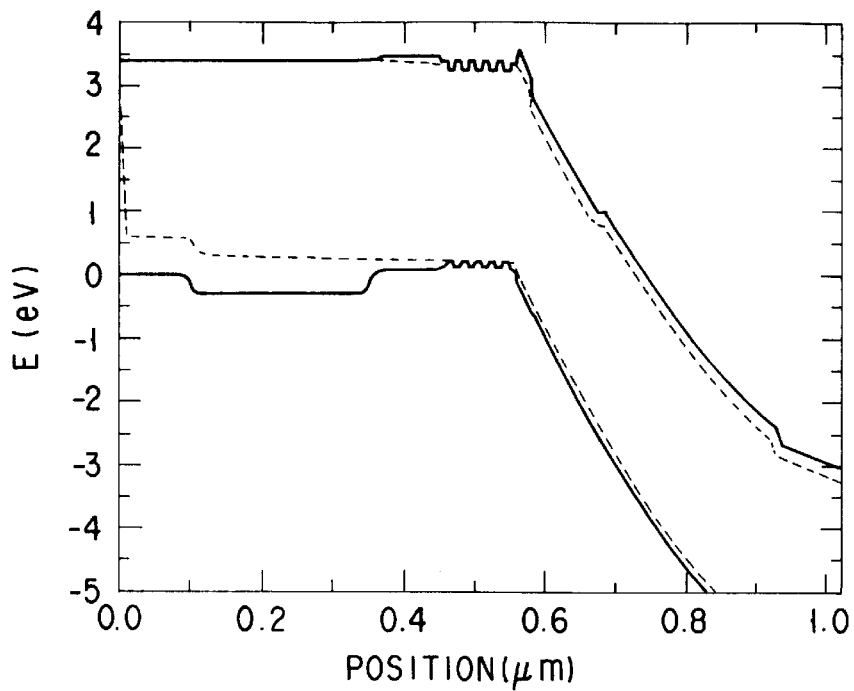
FIGS. 16A and 16B are graphs showing band structures and distributions of electrons and holes with an overflow blocking layer.
Figure 16B:
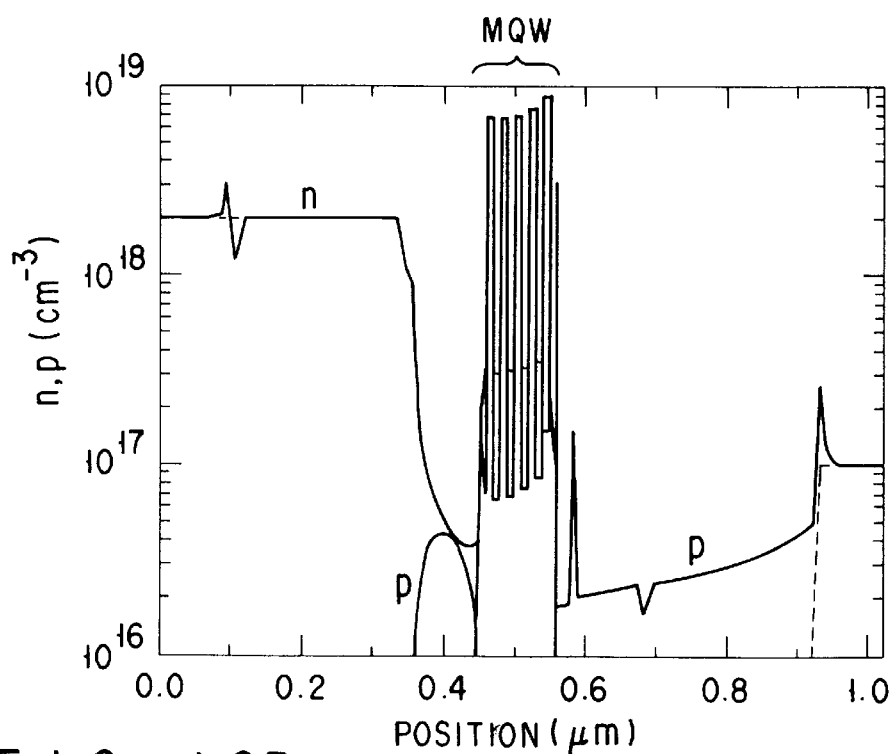

FIGS. 16A and 16B is to show the case where a Ga$_{0.85}$Al$_{0.15}$N overflow blocking layer is disposed between a MQW active layer 16 and a p-type waveguide layer 18. It is understood that an overflow of electrons to the p side is almost prevented by this layer 17. In the figure, a p-type waveguide layer 18 is undoped and the overflow blocking layer 17 is also undoped. Even with the undoped overflow blocking layer, it has an great effect, as shown in the figure, but, if doped the layer 17 with a p-type impurity, the effect is further improved.

An effect of a carrier overflow blocking is more conspicuous with an increase in Al compositional ratio in an overflow blocking layer made of Ga$_{1-h}$Al$_h$N, but, if h is too large, injection of holes from a p side to an active layer is prevented, which is a cause for increase in an operating voltage. Especially, when h is increased beyond 0.2, increase in operating voltage is conspicuous. Accordingly, an Al compositional ratio h in an overflow blocking layer is desirably in the following range:

$$0 < h < 0.2 \tag{15}$$

A carrier overflow blocking layer is not restricted to GaAlN, but a material including further In or including still further B may be used. That is, it is only required that a carrier blocking layer is made of In$_s$Ga$_t$Al$_h$B$_{1-s-t-h}$N ($0 \leq s$, t, h, s+t+h$\leq$1) and has a bandgap energy larger than that of a waveguide layer. The overflow blocking layer is not necessarily located in contact with an MQW layer and may be located in the middle of a waveguide layer. Moreover, a single layer may be used and a plurality of layers may be used, too.

As described above, according to the embodiment, in an InGaAlBN based semiconductor laser, a ridge portion of a cladding layer is formed in a double heterostructure region, a light confining, buried layer with a higher refractive index than that of the cladding layer is disposed on sides of the ridge portion and, thereby, not only reduction in threshold current density but also realization of a continuous oscillation in a fundamental transverse mode are achieved. Besides, a good quality output beam with small astigmatism suitable for a light source in an optical disc system and the like is obtainable.

The Second Embodiment

Figure 17:
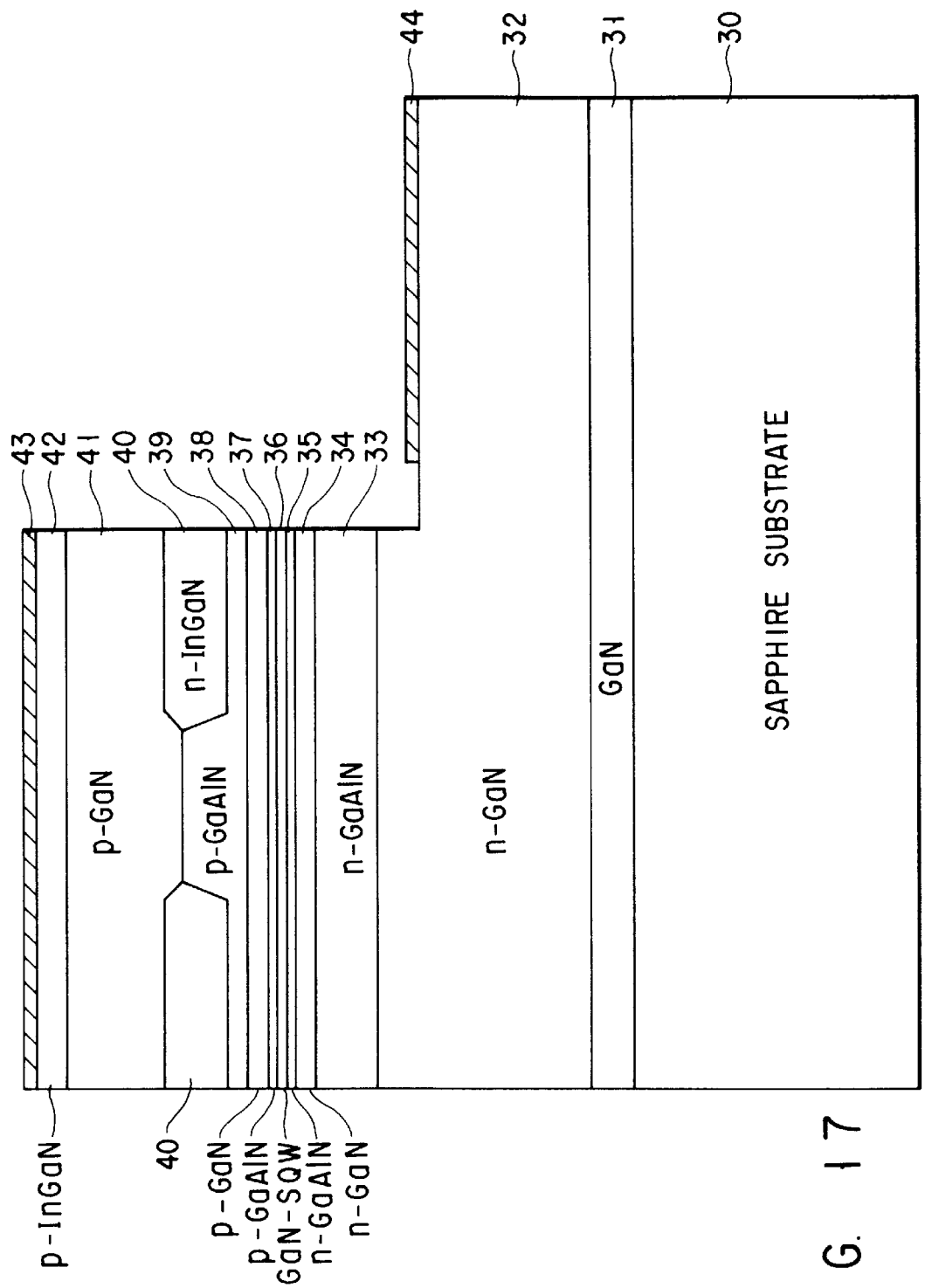
FIG. 17 is a sectional view of a structure of a semiconductor laser according to a second embodiment.

FIG. 17 is a sectional view showing a structure of a semiconductor laser according to the second embodiment of the present invention.

In the figure, 30 indicates a sapphire substrate and, on the substrate 30, a GaN buffer layer 31, an n-type GaN contact layer 32, an n-type GaAlN cladding layer 33, an n-type GaN waveguide layer 34, an n-type GaAlN overflow blocking layer 35, a single-quantum-well (SQW) active layer 36 made of InGaN, a p-type GaAlN overflow blocking layer 37, a p-type GaN waveguide layer 38 and a p-type GaAlN cladding layer 39 are formed by growth, wherein the crystal growth of these layers is conducted by means of an MOCVD method or an MBE method.

The p-type GaAlN cladding layer 39 is etched of half way except for a stripe portion to form a ridge portion in the shape of a stripe therein. In a region other than the ridge portion on the p-type GaAlN cladding layer 39, an n-type InGaN light confining layer 40 is selectively formed in a buried manner and, thereafter, a p-type GaN layer 41, and a p-type InGaN contact layer 42 are grown on the cladding layer 39 and the light confining layer 40. The crystal growth is also conducted by means of an MOCVD method or an MBE method.

The layers from the p-type InGaN contact layer 42 to the n-type GaAlN cladding layer 33 are partly etched off to partly expose the n-type contact layer 32. A p side electrode 43 is formed on the p-type GaN contact layer 42 and an n side electrode 44 is formed on the exposed portion of the n-type contact layer 32.

A different point of the embodiment from the first embodiment, as shown in FIGS. 1, is that an active layer portion is not a multi-quantum-well, but a single-quantum-well made of InGaN. A design which makes a threshold current reduced becomes possible by the use of a single-quantum-well. In this case, since the optical confinement effect is diminished, a threshold current is usually increased due to increase in guiding loss, but a guiding loss can be reduced and a threshold current is also decreased by optimization of a thickness of a waveguide layer.

Besides, in this embodiment, a p-type InGaN is used as the contact layer 42. The p-type InGaN has a smaller bandgap, as compared with a p-type GaN and, thereby, a schottky barrier between the laser and the electrode can be reduced, so that a contact resistance can be further decreased.

The Third Embodiment

Figure 18:
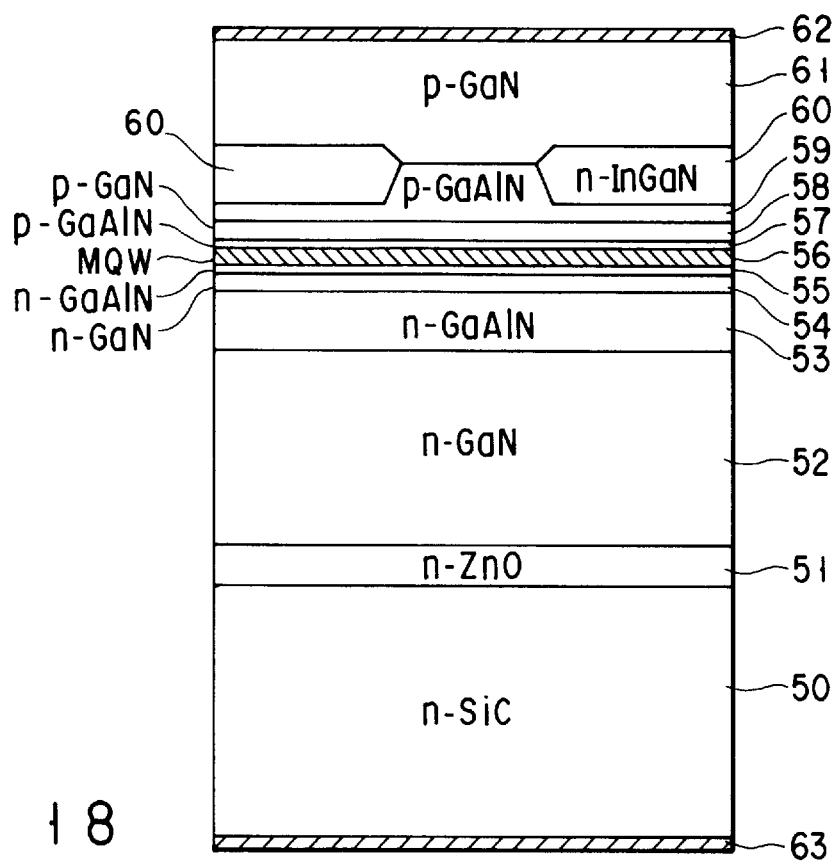
FIG. 18 is a sectional view of a structure of a semiconductor laser according to a third embodiment.

FIG. 18 is a sectional view showing a structure of a semiconductor laser according to the third embodiment of the present invention.

In the figure, 50 indicates an n-type SiC substrate and on this substrate 50, the following layers are formed in the order: an n-type ZnO buffer layer 51, an n-type GaN layer 52, an n-type GaAlN cladding layer 53, an n-type GaN waveguide layer 54, an n-type GaAlN overflow blocking layer 55, an InGaN multi-quantum-well (MQW active layer) 56, a p-type GaAlN overflow blocking layer 57, a p-type GaN waveguide layer 58 and a p-type GaAlN cladding layer 59, wherein an MOCVD method and/or an MBE method is used for growth of the layers.

The p-type GaAlN cladding layer 59 is etched off half way except for a stripe portion and, thereby, a ridge portion in the shape of a stripe is formed in the cladding layer 59. An n-type InGaN light confining layer 60 is selectively formed in a buried manner in a region other than the ridge potion on the p-type GaAlN cladding layer 59 and a p-type GaN contact layer 61 is formed on the cladding layer 59 and the light confining layer 60. A p side electrode 62 is formed on the p-type GaN contact layer 61 and an n side electrode 63 is formed on the backside surface of the n-type SiC substrate 50.

In the embodiment, a conductive n-type SiC substrate is used as a substrate 50. With the conductance of the substrate, a current can flow in both direction, upward or downward, and thereby mounting or the like is easy to be performed and thermal resistance to a heat flow is also reduced.

In the embodiment, as a light confining layer, the case where InGaN is used is shown, but the present invention is not intended to be restricted to this. That is, The light confining layer may be an $In_pGa_qAl_rB_{1-p-q-r}N$ ($0<p\leq1$, $0\leq q$, $r<1$, $0<p+q+r\leq1$) based material which has a small bandgap energy than that of the active layer. As materials of the cladding layer, not only GaAlN but $In_xGa_yAl_zB_{1-x-y-z}N$ ($0\leq x$, $y$, $z$, $x+y+z\leq1$) can be used.

The Fourth Embodiment

Figure 19:
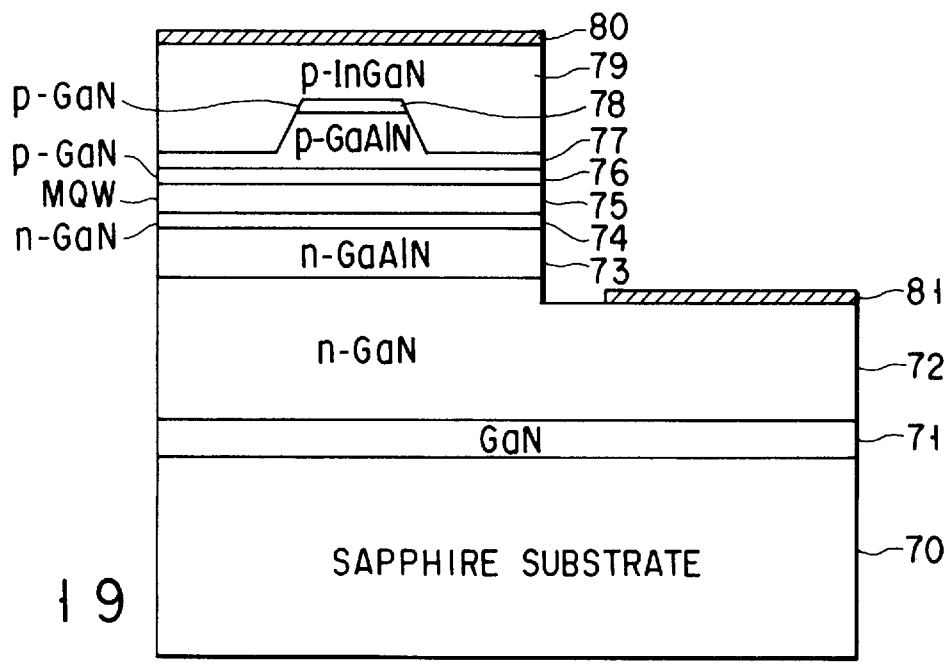
FIG. 19 is a sectional view of a structure of a semiconductor laser according to a fourth embodiment.

FIG. 19 is a sectional view showing a structure of a semiconductor laser according to the fourth embodiment of the present invention.

In the figure, 70 indicates a sapphire substrate and on this substrate 70, the following layers are formed in the order: a GaN buffer layer 71, an n-type GaN contact layer 72, an n-type GaAlN cladding layer 73, an n-type GaN waveguide layer 74, an InGaN multi-quantum-well 75, a p-type GaN waveguide layer 76, a p-type GaAlN cladding layer 77, a p-type GaN cap layer 78, a p-type InGaN light confining layer 79, wherein the p-type InGaN light confining layer 79 plays a roll of a p-type contact layer at the same time and an MOCVD method or an MBE method is used for growth of the layers.

The entire p-type GaN cap layer 78 and part of p-type GaAlN cladding layer 77 are etched off except for a stripe portion of both layers and, thereby, a ridge portion in the shape of a stripe is formed in the cladding layer 77. An p-type InGaN light confining/contact layer 79 is formed on the ridge portion and the etched region of the p-type GaAlN cladding layer 77. The crystal growth of the layers is also conducted by means of an MOCVD method or an MBE method.

The layers from the p-type InGaN light confining/contact layer 79 to the n-type GaAlN cladding layer 73 are partly removed and part of the n-type GaN contact 72 is exposed. Thereafter, a p side electrode 80 is formed on the p-type InGaN light confining/contact layer 79 and an n side electrode 81 is formed on the exposed portion of the n-type GaN contact layer 72. As a material of the p side electrode, for example, a layered structure of Pt/TiN/Ti/Pt/Au is used and as that of the n side electrode, for example, a layered structure of Ti/Au is used.

An active region of this laser has an SCH structure which comprises a multi-quantum-well composed of an $In_aGa_{1-a}N$ well layer/an $In_eGa_{1-e}N$ barrier layer ($a>e$), and a GaN waveguide layer.

A feature of the structure shown FIG. 19 is that the p-type InGaN light confining layer 79 additionally plays a role of a contact layer. For this reason, the number of crystal growing steps is only two and the second step of crystal growth, which is regrowth after the etching-off, is not required to be selective crystal growth. Accordingly, the process of fabricating the laser, which comprises a transverse-mode-stabilized structure, becomes extremely simple. With this structure, since an InGaN layer having a large absorption coefficient against an oscillation wavelength is disposed at a position close to the active layer outside the strip, a real part of a effective refractive index outside the stripe portion becomes smaller than that of the stripe portion, so that a transverse mode confinement in the horizontal direction is realized.

Figure 20A:
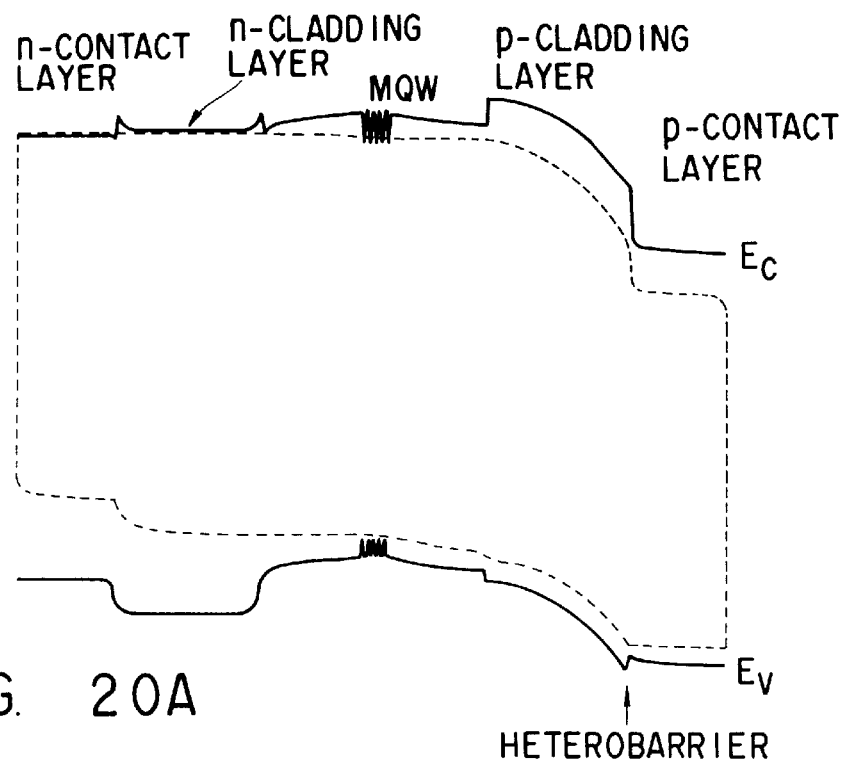
FIGS. 20A and 20B are graphs showing a principle of the current blocking effect by a heterobarrier.

On the other hand, current confinement in this structure is realized by a heterobarrier between the p-type GaAlN cladding layer 77 and the p-type InGaN light confining layer 79. That is, as shown in FIG. 20A, because of the presence of a heterobarrier which is created by a valence-band discontinuity at the interface between the p-type GaAlN cladding layer and the p-type InGaN contact layer, almost no current flows at this interface. In the stripe portion, the p-type GaN cap layer 78, which has an intermediate bandgap energy between those of the p-type GaAlN cladding layer 77 and p-type InGaN contact layer 79, is disposed and, thereby, a height of a heterobarrier is reduced, as shown in FIG. 20B, so that a current flows with ease.

Another advantage of the use of the p-type GaAlN cladding/contact layer is that a high carrier density in the cladding layer on the lower side is realized. According to experiments conducted by the inventors, it has been made clear that in the structure wherein an InGaAlN based material with a higher In compositional ratio of over 0 is used as a layer, a cladding layer which is disposed on a lower side of the material, has a high carrier density. For example, when the GaN contact layer was singly used, a carrier density in the p-type cladding layer was $1\times10^{16}$ cm$^{-3}$ or less, but, with the use of the InGaN layer, it was able to be increased to $5\times10^{16}$ cm$^{-3}$ or more. This is caused by the phenomenon that passivation of Mg acceptors by hydrogen or the like is retarded. From the above findings and consideration thereon by the inventors, it has been understood that, when the InGaAlN light confining layer is used, a carrier overflow is by a great margins reduced, as compared with no presence of the same light confining layer.

Figure 20B:
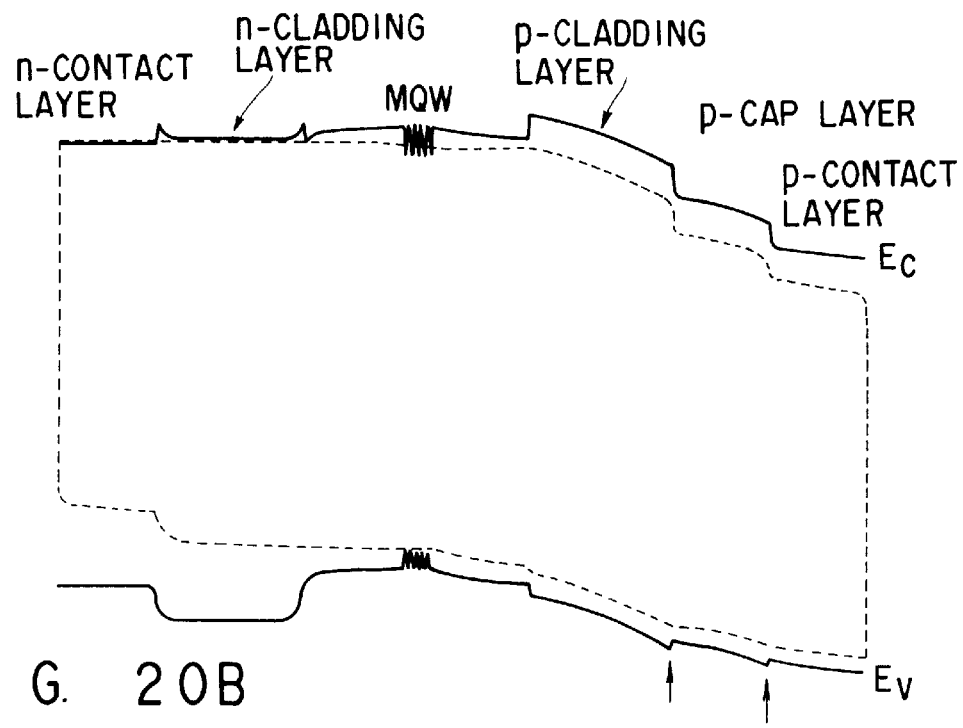

In examples of computations of FIGS. 20A and 20B, a case is shown, where a p-type cladding layer is made of $Ga_{0.85}Al_{0.15}N$ with a carrier density of $5\times10^{16}$ cm$^{-3}$, a p-type contact layer is made of $In_{0.15}Ga_{0.85}N$ with a carrier density of $1\times10^{17}$ cm$^{-3}$ and a p-type cap layer is made of GaN with a carrier density of $1\times10^{17}$ cm$^{-3}$. A combination of layers is not restricted to this, but any of combinations of layers may substitute, as long as a heterobarrier between p-type cladding and p-type contact layers in the combinations has a sufficiently large current blocking capacity.

FIG. 21 shows characteristic curves of the current density vs. voltage in the case where p-type cladding and p-type contact layers are respectively p-type $Ga_{0.85}Al_{0.15}N$ (carrier density $5\times10^{16}$ cm$^{-3}$) and p-type $In_xGa_{1-x}N$ (carrier density $1\times10^{17}$ cm$^{-3}$). The cap layer of FIG. 20B is made of GaN of $x=0$ and in this case a laser oscillation can be obtained at a voltage of about 3.7V (this voltage does not include a contact resistance and the like). On the other hand, it is understood that a current is harder to flow, as an In compositional ratio x is larger. A current at a operating voltage of about 3.7V is decreased to a value less than half when x is larger than 0.1. That is, a sufficient current confining effect is achieved in the structure shown in FIG. 19.

This current blocking effect by this heterobarrier is dependent not only on difference in bandgap between p-type cladding and p-type contact layers, but on carrier densities in the two layers. For example, as a carrier density in the p-type cladding layer is larger than $1\times10^{17}$ cm$^{-3}$, a current blocking effect is reduced. Therefore, to achieve a sufficient current blocking effect by a heterobarrier in the structure shown in FIG. 19, it is desirable that a carrier density in the p-type cladding layer is set $1\times10^{17}$ cm$^{-3}$ or less and that a sum of an Al compositional ratio of the p-type cladding layer and an In compositional ratio of the p-type contact layer is set 0.25 or larger. From a viewpoint of reduction of carrier overflow, it is preferable that a carrier density in the p-type cladding layer is not too low and is especially $5\times10^{16}$ cm$^{-3}$ or more.

A current blocking effect by a heterobarrier is not limited to a case of a combination of p-type GaAlN/p-type InGaN. In this material system, difference in bandgap can be increased according to compositions and, therefore, discontinuity in a band on the conduction band side is also increased in a similar manner to that on the valence band side. FIG. 22 shows a current density vs. voltage characteristic when cladding and contact layers are respectively made of an n-type $Ga_{0.85}Al_{0.15}N$ (carrier density $5\times10^{17}$ cm$^{-3}$) and an n-type $In_xGa_{1-x}N$ (carrier density $1\times10^{18}$ cm$^{-3}$). It is apparent that as an In compositional ratio x is larger, a current is harder to flow. In this case, a sufficient current blocking effect can be attained at $x \geq 0.15$.

The Fifth Embodiment

FIG. 23 is a sectional view showing a structure of a semiconductor laser according to the fifth embodiment of the present.

In the figure, 90 indicates a sapphire substrate and, on this substrate 90, the following layers are formed in the order: an GaN buffer layer 91, a p-type GaN contact layer 92, a p-type GaAlN cladding layer 93, a p-type GaN waveguide layer 94, an InGaN multi-quantum-well 95, an n-type GaN waveguide layer 96 and an n-type GaAlN cladding layer 97, an n-type GaN cap layer 98 and an n-type InGaN light confining layer 99, wherein the n-type InGaN light confining layer 99 additionally plays a role as an n-type contact layer.

The entire n-type GaN cap layer 98 and part of the n-type GaAlN cladding layer 97 are etched off except a ridge portion and the ridge portion in the shape of a stripe is formed in the cladding layer 97. The n-type InGaN light confining/contact layer 99 is formed on the ridge portion and the exposed portion of the n-type GaAlN cladding layer 97.

The layers from the n-type InGaN light confining/contact layer 99 to the p-type GaAlN cladding layer 93 are partly removed to expose part of the p-type GaN contact layer 92. Thereafter, an n side electrode 100 is formed on the n-type InGaN light confining/contact layer 99 and a p side electrode 101 is formed on the exposed portion of the p-type GaN contact layer 92.

In the structure shown in FIG. 23, the n-type InGaN light confining layer 99 additionally plays a role of contact layer. Accordingly, crystal growth can be complete in two steps in a similar manner to the case of FIG. 19. A principle of a transverse mode control is the same as the case of FIG. 19 and current blocking is realized by a heterobarrier between the n-type GaAlN cladding layer 97 and the n-type InGaN light confining layer 99. This current blocking effect of the heterobarrier is as shown in FIG. 22.

The current blocking effect by a heterobarrier is more conspicuous, as difference in bandgap between two kinds of material is larger and, therefore, a combination of materials with larger difference in composition is desirable. However, in the stripe portion, if difference in bandgap is large in excess, a current is sometimes hard to flow, even though a cap layer with an intermediate bandgap lies between the two materials. In order to improve this situation, it is recommended that a plurality of cap layers with different intermediate bandgaps are disposed therebetween.

The Sixth Embodiment

FIG. 24 is a sectional view showing a structure of a semiconductor laser according to the sixth embodiment of the present invention.

In the figure, 110 indicates a sapphire substrate and, on this substrate 110, the following layers are formed in the order: a GaN buffer layer 111, an n-type GaN contact layer 112, an n-type $Ga_{0.85}Al_{0.15}N$ cladding layer 113, an n-type GaN waveguide layer 114, an InGaN multi-quantum-well 115, a p-type GaN waveguide layer 116 and a p-type $Ga_{0.85}Al_{0.15}N$ cladding layer 117, a p-type GaN first cap layer 118 and a p-type $In_{0.07}Ga_{0.93}N$ second cap layer 119 and a p-type $In_{0.15}Ga_{0.85}N$ light confining layer 120, wherein the p-type InGaN light confining layer 120 additionally plays a role as a p-type contact layer and, in the figure, 121 indicates a p side electrode and 122 indicates an n side electrode.

In the structure shown in this figure, difference in composition between the p-type $Ga_{0.85}Al_{0.15}N$ cladding layer 117 and the p-type $In_{0.15}Ga_{0.85}N$ light confining layer 120 is large and thereby a bandgap therebetween is also large, so that a current blocking effect by a heterobarrier is large. On the other hand, two kinds of cap layer, which respectively have bandgaps between those of the p-type $Ga_{0.85}Al_{0.15}N$ cladding layer 117 and the p-type $In_{0.15}Ga_{0.85}N$ light confining layer 120 are disposed on the cladding layer of the stripe portion. In terms of bandgap, the layers are decreased in the order of the p-type cladding layer, first cap layer, second cap layer and light confining layer with the smallest light confining layer and, thereby, the heterobarrier is reduced stepwise to attain a structure in which a current is easy to flow.

In the embodiment of FIG. 24, two cap layers having intermediate bandgaps are used. It is needless to say that the number is not limited to two, but more cap layers in a multi-step manner can be used according to difference in bandgaps between cladding and light confining layers.

The Seventh Embodiment

Figure 25:
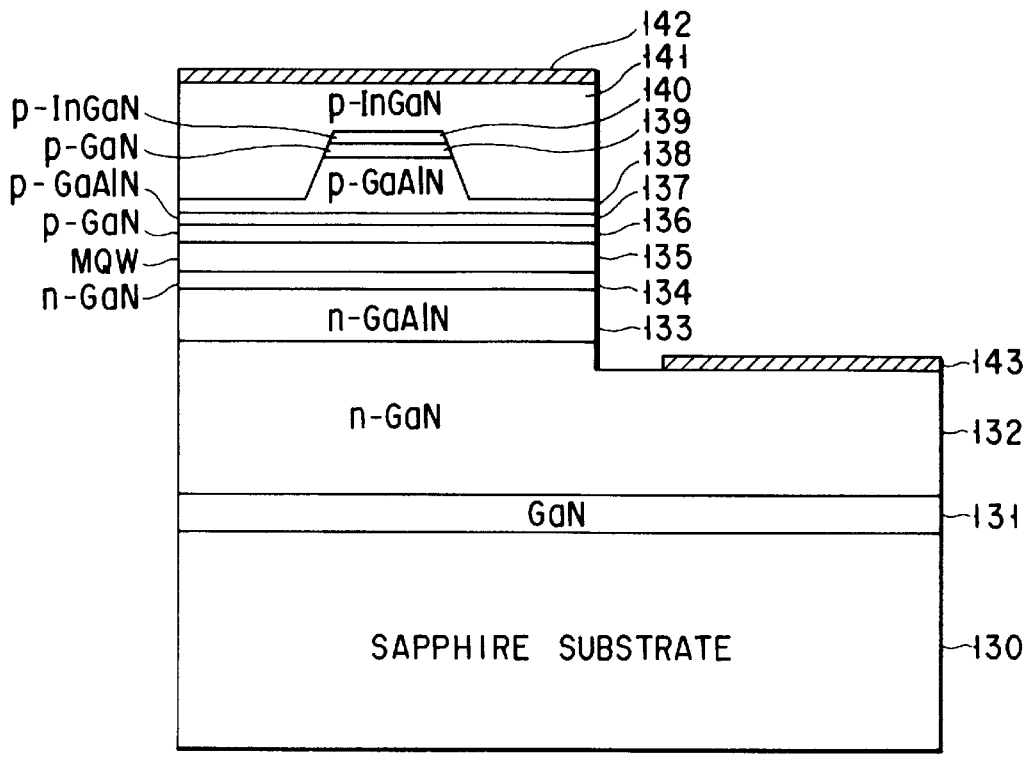
FIG. 25 is a sectional view showing a structure of a semiconductor laser according to a seventh embodiment.

FIG. 25 is a sectional view showing a structure of a semiconductor laser according to the seventh embodiment of the present invention.

In the figure, 130 indicates a sapphire substrate and, on this substrate 130, the following layers are formed in the order: a GaN buffer layer 131, an n-type GaN contact layer 132, an n-type $Ga_{0.85}Al_{0.15}N$ cladding layer 133, an n-type GaN waveguide layer 134, an InGaN multi-quantum-well 135, a p-type GaN waveguide layer 136, a p-type $Ga_{0.85}Al_{0.15}N$ first, p-type cladding layer 137, a p-type $Ga_{0.85}Al_{0.15}N$ second, p-type cladding layer 138, a p-type GaN first cap layer 139 and a p-type $In_{0.07}Ga_{0.93}N$ second cap layer 140 and a p-type $In_{0.15}Ga_{0.85}N$ light confining layer 141, wherein the p-type InGaN light confining layer 141 additionally plays a role as a p-type contact layer and, in the figure, 142 indicates a p side electrode and 143 indicates an n side electrode.

Carrier densities of layers above mentioned in this embodiment are $5 \times 10^{17}$ cm$^{-3}$ for the first, p-type cladding layer 137, $5 \times 10^{16}$ cm$^{-3}$ for the second, p-type cladding layer 138 and $1 \times 10^{17}$ cm$^{-3}$ commonly for the first cap layer 139, second cap layer 140 and light confining/contact layer 141.

The structure shown in the figure has a feature that a carrier density in the first, p-type cladding layer 137 on the side of the active layer is increased to reduce a carrier overflow in an operating condition, besides, a carrier density in the second, p-type cladding layer adjoining the light confining layer 141 is comparatively decreased and, as a result, a current blocking effect by a heterobarrier is secured. A principle in which a current flows in the stripe is similar to the cases of FIG. 19, FIGS. 23 and 24.

The Eighth Embodiment

Figure 26:
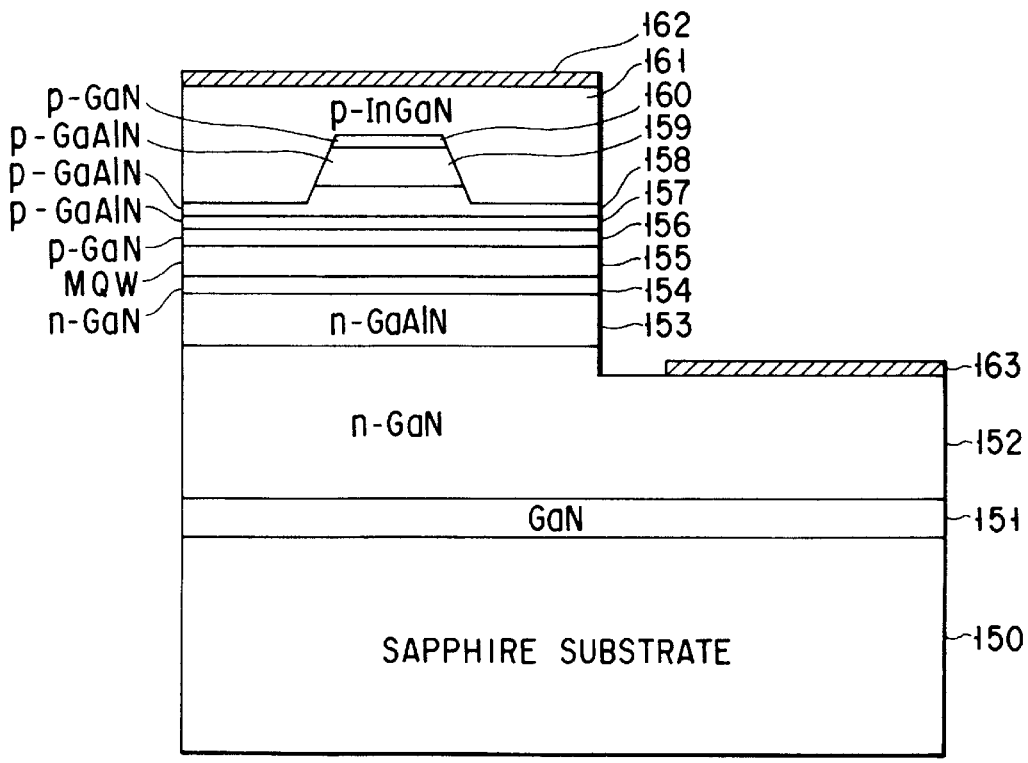
FIG. 26 is a sectional view showing a structure of a semiconductor laser according to a eighth embodiment.

FIG. 26 is a sectional view showing a structure of a semiconductor laser according to the eighth embodiment of the present invention.

In the figure, 150 indicates a sapphire substrate and, on this substrate 150, the following layers are formed in the order: a GaN buffer layer 151, an n-type GaN contact layer 152, an n-type Ga$_{0.85}$Al$_{0.15}$N cladding layer 153, an n-type GaN waveguide layer 154, an InGaN multi-quantum-well 155, a p-type GaN waveguide layer 156, a p-type Ga$_{0.85}$Al$_{0.15}$N first, p-type cladding layer 157, a p-type Ga$_{0.85}$Al$_{0.15}$N second, p-type cladding layer 158, a p-type Ga$_{0.85}$Al$_{0.15}$N third, p-type cladding layer 159, a p-type GaN cap layer 160, and a p-type In$_{0.1}$Ga$_{0.9}$N light confining layer 161, wherein the p-type InGaN light confining layer 161 additionally plays a role as a p-type contact layer and, in the figure, 162 indicates a p side electrode and 163 indicates an n side electrode.

Carrier densities of layers as above mentioned in this embodiment are $5 \times 10^{17}$ cm$^{-3}$ for the first, p-type cladding layer 157, $5 \times 10^{16}$ cm$^{-3}$ for the second, p-type cladding layer 158, $5 \times 10^{17}$ cm$^{-3}$ for the third, p-type cladding layer and $1 \times 10^{17}$ cm$^{-3}$ commonly for the cap layer 160 and light confining/contact layer 161.

The structure shown in the figure has features that, firstly, a carrier density in the first, p-type cladding layer 157 on the side of the active layer is increased to reduce a carrier overflow in an operating condition, besides, a carrier density in the second, p-type cladding layer adjoining the light confining layer 161 is comparatively decreased and, as a result, a current blocking effect by a heterobarrier is secured, and, secondly, a carrier density in the third, p-type cladding layer adjoining the cap layer 160 is increased so that a current may with more ease flow in the stripe portion.

The Ninth Embodiment

FIG. 27 is a sectional view showing a structure of a semiconductor laser according to the ninth embodiment of the present invention.

In the figure, 170 indicates a sapphire substrate and, on this substrate 170, the following layers are formed in the order: a GaN buffer layer 171, an n-type GaN contact layer 172, an n-type Ga$_{0.85}$Al$_{0.15}$N cladding layer 173, an n-type GaN waveguide layer 174, an InGaN multi-quantum-well 175, a p-type GaN waveguide layer 176, a p-type Ga$_{0.85}$Al$_{0.15}$N first, p-type cladding layer 177, a p-type Ga$_{0.85}$Al$_{0.15}$N second, p-type cladding layer 178, a p-type Ga$_{0.85}$Al$_{0.15}$N third, p-type cladding layer 179, a p-type GaN cap layer 180, a p-type In$_{0.1}$Ga$_{0.9}$N light confining layer 181 and a p-type In$_{0.1}$Ga$_{0.9}$N contact layer 182. And in the FIG. 183 indicates a p side electrode and 184 indicates an n side electrode.

Carrier densities of layers above mentioned in this embodiment are $5 \times 10^{17}$ cm$^{-3}$ for the first, p-type cladding layer 177, $5 \times 10^{16}$ cm$^{-3}$ for the second, p-type cladding layer 178, $5 \times 10^{17}$ cm$^{-3}$ for the third, p-type cladding layer, $1 \times 10^{17}$ cm$^{-3}$ commonly for the cap layer 180 and light confining layer 181 and $5 \times 10^{17}$ cm$^{-3}$ for the contact layer 182.

The structure shown in this figure has, in addition to the features of the eighth embodiment shown in FIG. 26, a feature that, on the p electrode side, the contact layer with a high carrier density 182 is further disposed, whereby a contact resistance is reduced and, due to the reduction, an operating voltage can be greatly decreased.

Needless to say, such a structure as to dispose a contact layer with a high carrier density is not restricted to this embodiment, but can be applied to a structure of any of the embodiments of the fourth to seventh embodiments.

The Tenth Embodiment

FIG. 28 is a sectional view showing a structure of a semiconductor laser according to the tenth embodiment of the present invention.

In the figure, 190 indicates a sapphire substrate and, on this substrate 190, the following layers are formed in the order: a GaN buffer layer 191, an n-type GaN contact layer 192 and a p-type InGaN light confining layer 193. The entire thickness of the p-type InGaN light confining layer 193 and an upper portion of the n-type GaN contact layer 192 are partly etched off to form a groove in the shape of a reverse ridge. On the groove and the other portion of the light confining layer 193, the following layers are further formed in the order: an n-type GaAlN cladding layer 194, an n-type GaN waveguide layer 195, an InGaN multi-quantum-well 196, a p-type GaN waveguide layer 197, a p-type GaAlN cladding layer 198, a p-type GaN layer 199 and a p-type InGaN contact layer 200. In other words, a ridge convex toward the lower side of the n-type GaAlN cladding layer 194 is formed. And in the FIG. 201 indicates a p side electrode and 202 indicates an n side electrode.

In this embodiment, the light confining layer 193 is disposed on the side of the substrate in reference to the active layer. On both sides of the stripe, the light confining layer 193 and the quantum-well active layer 196 are in a close positional relation to each other and, thereby, a real part of an effective refractive index is reduced under influence of an absorption loss in the light confining layer 193, so that a transverse mode confinement in the horizontal direction is realized by an effective refractive index distribution created. In addition, the light confining layer 193 additionally plays as a current blocking layer.

Crystal growth to fabricate the structure of FIG. 28 is conducted by means of the same one of an MOCVD method and an MBE method in both of first and second steps thereof. This structure has an advantage that the crystal growth is limited to two steps.

The Eleventh Embodiment

Figure 29:
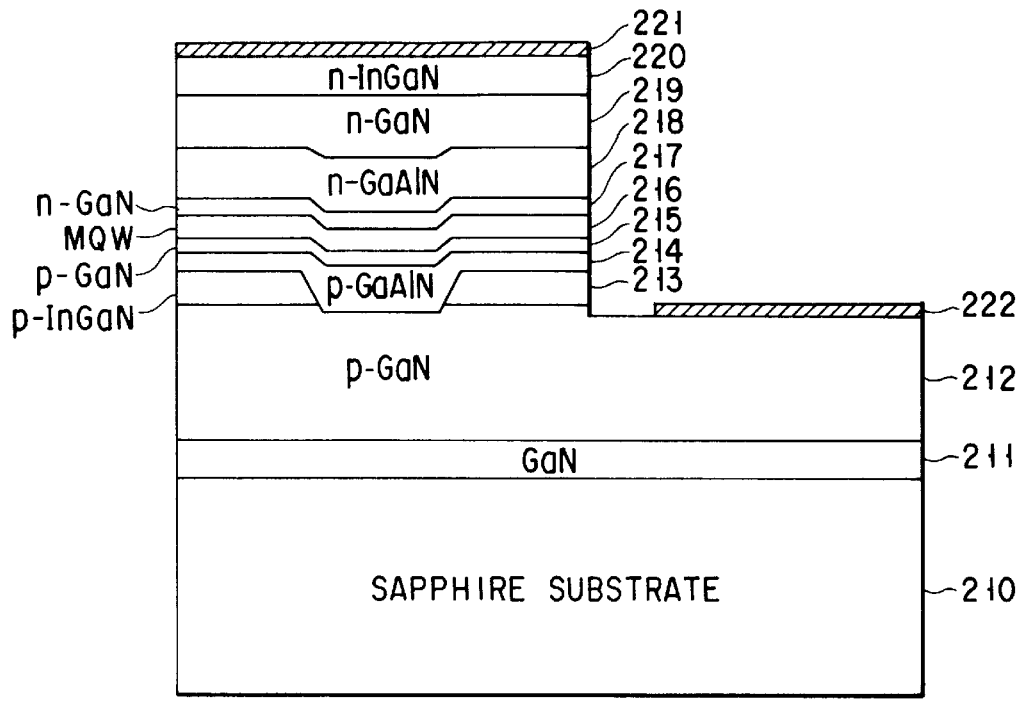
FIG. 29 is a sectional view showing a structure of a semiconductor laser according to a eleventh embodiment.

FIG. 29 is a sectional view showing a structure of a semiconductor laser according to the eleventh embodiment of the present invention.

In the figure, 210 indicates a sapphire substrate and, on this substrate 210, the following layers are formed in the order: a GaN buffer layer 211, a p-type GaN contact layer 212 and a p-type InGaN light confining layer 213. The entire thickness of the p-type InGaN light confining layer 213 and an upper portion of the p-type GaN contact layer 212 are partly etched off to form a groove. On the groove and the other portion of the light confining light confining layer 213, the following layers are further formed in the order: a p-type GaAlN cladding layer 214, a p-type GaN waveguide layer 215, an InGaN multi-quantum-well 216, an n-type GaN waveguide layer 217, an n-type GaAlN cladding layer 218, an n-type GaN layer 219 and an n-type InGaN contact layer 220. And in the FIG. 221 indicates an n side electrode and 222 indicates a p side electrode.

In this embodiment, conductivity types of the layers are reverse to the embodiment shown in FIG. 28 except part of them. It is similar to the case of FIG. 28 that a transverse mode confinement is realized by the presence of the light confining layer 213, whereas a current blocking in the embodiment of FIG. 29 is realized by a heterobarrier between the p-type GaAlN cladding layer 214 and the p-type InGaN light confining layer 213. This principle is similar to that shown in FIGS. 19, 24 to 27 as above mentioned and the like.

In the embodiments described so far, the case where InGaN is used as a contact layer, has been handled but the contact layer is not limited to this material and InGaBN or InGaAlBN is used. Especially, in the case of a p-type contact, a contact layer with a low resistance is obtained by using p-type InGaBN or p-type InGaAlBN. Moreover, each of the other layers can be made of InGaAlBN as long as each satisfies conditions of the present invention.

A substrate is not limited to a sapphire substrate, either, and the following materials can be used instead: SiC, ZnO, $MgAl_2O_4$, $NdGaO_3$, $LiGaO_2$, $Y_3Al_5O_{12}$ (YAG), $Y_3Fe_5O_{12}$ (YIG) and the like.

The Twelfth Embodiment

Figure 30:
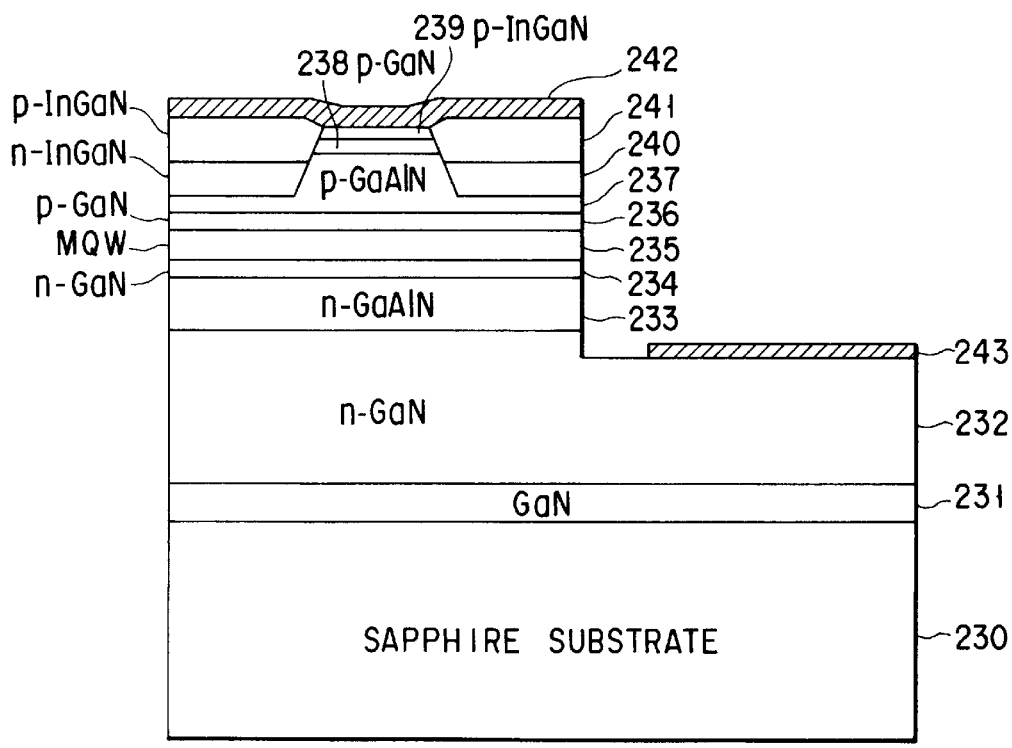
FIG. 30 is a sectional view showing a structure of a semiconductor laser according to a twelfth embodiment.

FIG. 30 is a sectional view showing a structure of a semiconductor laser according to the twelfth embodiment of the present invention.

In the figure, 230 indicates a sapphire substrate and, on this substrate 230, the following layers are formed in the order: a GaN buffer layer 231, an n-type GaN contact layer 232, an n-type $Ga_{0.85}Al_{0.15}N$ cladding layer 233, an n-type GaN waveguide layer 234, an InGaN multi-quantum-well 235, a p-type GaN waveguide layer 236, a p-type $Ga_{0.85}Al_{0.15}N$ cladding layer 237, a p-type GaN cap layer 238, a p-type InGaN contact layer 239, an n-type $In_{0.1}Ga_{0.9}N$ light confining layer 240 and a p-type InGaN contact layer 241. And in the FIG. 242 indicates an p side electrode 1nd 243 indicates an n side electrode.

The laser of this embodiment is fabricated in the following way: Firstly, on the sapphire substrate 230, the following layers are in succession grown: the GaN buffer layer 231, the n-type GaN contact layer 232, the n-type GaAlN cladding layer 233, the n-type GaN waveguide layer 234, the InGaN multi-quantum-well 235, the p-type GaN waveguide layer 236, the p-type GaAlN cladding layer 237, the p-type GaN cap layer 238 and the p-type InGaN contact layer 239. On the p-type InGaN contact layer 239, a $SiO_2$ film is formed, the p-type InGaN contact layer 239, the p-type GaN cap layer 238 and part of the p-type GaAlN cladding layer 237 are removed by etching except for a stripe portion with the help of photolithography and the like to form a ridge in the shape of a stripe.

Next in a second growth step, the n-type InGaN light confining layer 240 and the p-type InGaN contact layer 241 are formed in that order. The second growth is conducted while the $SiO_2$ film is left on the layer and thereby crystal growth does not occur on the $SiO_2$ film, that is the crystal growth is limited on a region outside the stripe. A so-called selective growth is carried out. Etching on the n-electrode side can be effected before or after the second growth.

The embodiment has a feature that the structure superficially looks like complicated, but crystal growth is conducted in two steps only. Another feature is that the contact layer is formed on not only the stripe portion but outside the portion and thereby a whole plane can be used for an electrode structure, so that a contact resistance is lowered, since a current spreads in the interior of the p-type InGaN contact layer 241.

The Thirteenth Embodiment

Figure 31:
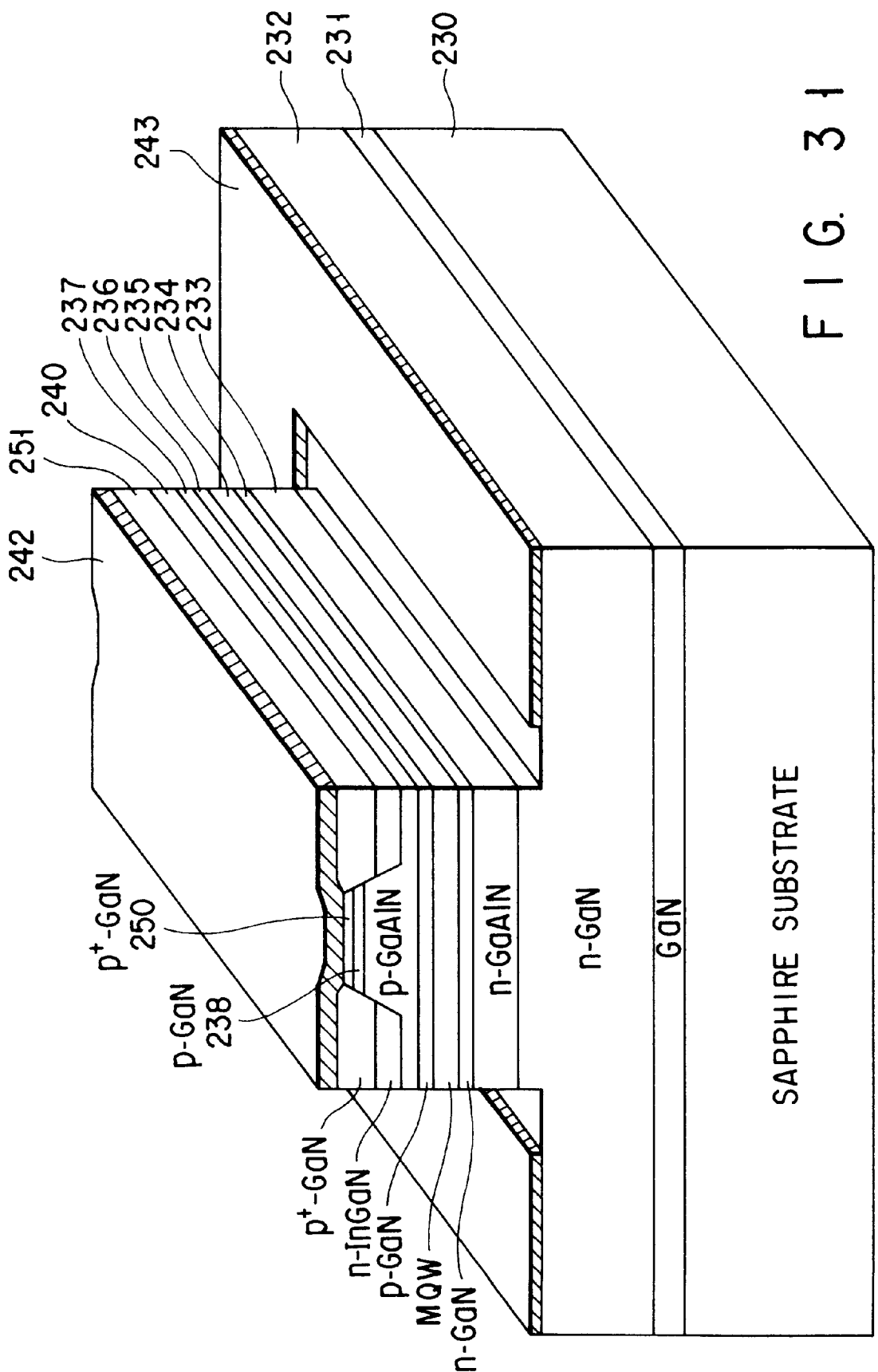
FIG. 31 is a sectional view showing a structure of a semiconductor laser according to a thirteenth embodiment.

FIG. 31 is a sectional view showing a structure of a semiconductor laser according to the thirteenth embodiment of the present invention.

Detailed description on the embodiment is omitted, since a layered structure in the embodiment is almost the same as that of the twelfth embodiment as shown FIG. 30. Different points are that $p^+$-type GaN layers 250 and 251 are respectively used instead of the p-type InGaN contact layers 239 and 241. These layers have a higher carrier density than that of the p-type GaN cap layer 238, for example $7 \times 10^7$ cm$^{-3}$, and thereby a current is easy to spread and a contact resistance is lowered, too.

In the embodiment of FIG. 31, the laser has a symmetrical structure in which n-side electrodes arranged on both sides, whereby a current distribution in the stripe portion has a good symmetry and a stabler fundamental transverse mode oscillation can be realized.

The Fourteenth Embodiment

Figure 32:
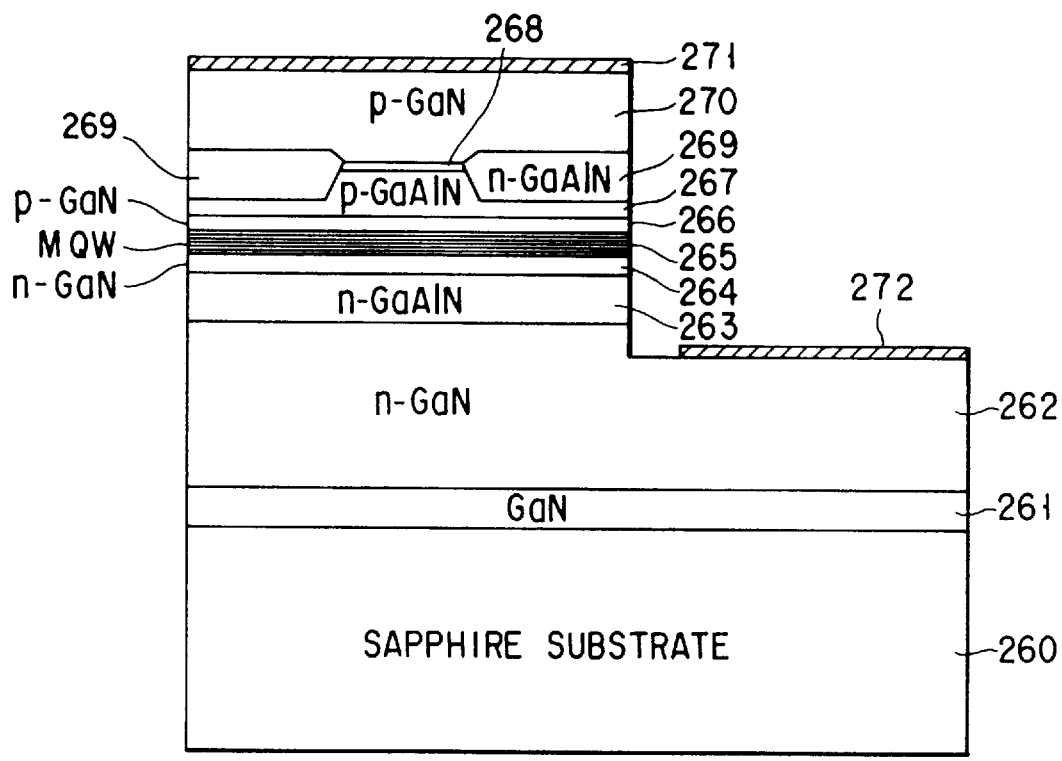
FIG. 32 is a sectional view showing a structure of a semiconductor laser according to a fourteenth embodiment.

FIG. 32 is a sectional view showing a structure of a semiconductor laser according to the fourteenth embodiment of the present invention. In the figure, 260 indicates a sapphire substrate and, on this substrate 260, the following layers are in succession formed in the order: a GaN buffer layer 261, an n-type GaN contact layer 262, an n-type $Ga_{0.85}Al_{0.15}N$ cladding layer 263, an n-type GaN waveguide layer 264, an InGaN multi-quantum-well (MQW) active layer 265, a p-type GaN waveguide layer 266, a p-type $Ga_{0.85}Al_{0.15}N$ cladding layer 267 and a p-type GaN cap layer 268. The p-type GaN cap layer 268 and part of the p-type GaAlN cladding layer 267 is removed by etching except the stripe portion. With this etching a ridge portion is formed in the cladding layer 267. An n-type $Ga_{0.93}Al_{0.07}N$ light confining layer 269 is selectively formed in a buried manner in a region other than the ridge portion of the p-type GaAlN cladding layer 267. A p-type GaN contact layer 270 is formed on or above the cap layer 268, the cladding layer 267 and the light confining layer 269. And 271 indicates a p side electrode and 272 indicates an n side electrode.

The embodiment has a feature that GaAlN with a smaller Al compositional ratio than that of the cladding layer 267 is used as the light confining layer 269, whereby an anti-guiding structure is formed in a horizontal direction and a horizontal transverse mode is stabilized.

An anti-guiding structure is basically realized when an effective refractive index outside the stripe portion is large, but it is important that difference in effective refractive index between inside and outside the stripe portion is set at a value larger than a predetermined one in order to obtain a good beam characteristics. As can be seen from FIGS. 4A and 4B, which have been described, if the difference is set in the range of $|\Delta n_{eq}| \geq 2 \times 10^{-3}$, the characteristic of a small astigmatism can be obtained. In the embodiment of FIG. 32, an anti-guiding structure can be realized by setting an Al compositional ratio in the range of $0.05 \leq x_{Al} \leq 0.1$.

As described, according to the embodiment, an InGaAlBN based semiconductor laser has a ridge portion formed in a cladding layer of one side of a double heterostructure, a light confining layer with a higher refractive index than that of the cladding layer is disposed on sides of the ridge portion, and thereby a threshold current density is reduced and a stable continuous oscillation in a fundamental transverse mode becomes possible.

The Fifteenth Embodiment

Figure 33A:
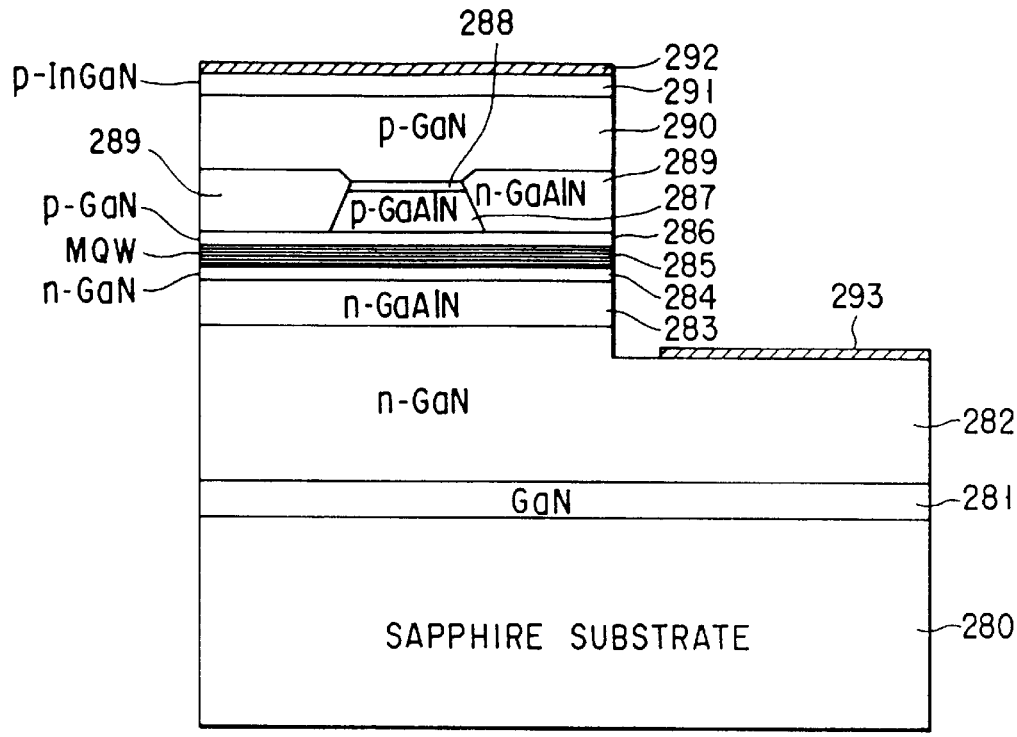
FIG. 33A is a sectional view showing a structure of a semiconductor laser according to a fifteenth embodiment.

FIG. 33A is a sectional view showing a structure of a semiconductor laser according to the fifteenth embodiment of the present invention. In the figure, 280 indicates a sapphire substrate and, on this substrate 280, the following layers are in succession formed in the order: a GaN buffer layer 281, an n-type GaN contact layer 282, an n-type $Ga_{0.85}Al_{0.15}N$ cladding layer 283, an n-type GaN waveguide layer 284, an InGaN multi-quantum-well (MQW) active layer 285, a p-type GaN waveguide layer 286, a p-type $Ga_{0.85}Al_{0.15}N$ cladding layer 287 and a p-type GaN cap layer 2.88. The p-type GaN cap layer 288 and the p-type GaAlN cladding layer 287 is removed by etching except the stripe portion. With this etching a ridge portion in the shape is formed in the cladding layer 287. An n-type $Ga_{0.93}Al_{0.07}N$ light confining layer 289 is selectively formed in a buried manner in a region other than the ridge portion of the p-type GaAlN cladding layer 287. A p-type GaN contact layer 290 and, thereafter, a p-type InGaN contact layer 291 are formed on or above the cap layer 288, the cladding layer 287 and the light confining layer 289. And 292 indicates a p side electrode and 293 indicates an n side electrode.

In the embodiment, it is different from the embodiment of FIG. 32 that the light confining layer 289 is formed on the GaN waveguide layer 286. It is needless to say that even in such a structure an ant-guiding structure can be realized.

Modification

Figure 33B:
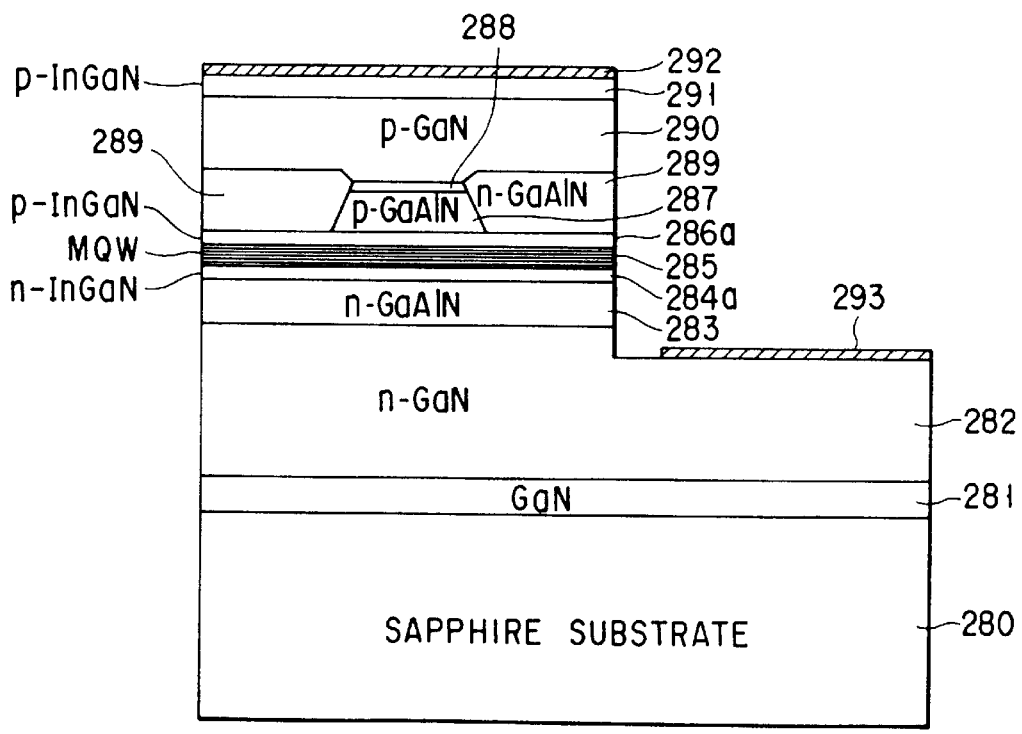
FIG. 33B is a sectional view showing a structure of a modification of the embodiment.

As shown in FIG. 33B, an n-type $In_{0.08}Ga_{0.92}N$ waveguide layer 284a may be used in place of the n-type GaN waveguide layer 284, and an p-type $In_{0.08}Ga_{0.92}N$ waveguide layer 286a may be used in place of the p-type GaN waveguide layer 286. The modification using the InGaN waveguide layers 284a and 286a can form a sufficiently confined structure for the vertical transverse mode which is very effective for the threshold current reduction, as described in FIG. 13.

The Sixteenth Embodiment

FIG. 34 is a sectional view showing a structure of a semiconductor laser according to the sixteenth embodiment of the present invention. In the figure, 300 indicates a sapphire substrate and, on this substrate 300, the following layers are in succession formed in the order: a GaN buffer layer 301, an n-type GaN contact layer 302, an n-type $Ga_{0.85}Al_{0.15}N$ cladding layer 303, an n-type GaN waveguide layer 304, an InGaN multi-quantum-well (MQW) active layer 305, a p-type GaN waveguide layer 306, a p-type InGaN cap layer 307, a p-type GaN layer 308 and a p-type $Ga_{0.85}A_{1.15}N$ cladding layer 309. The p-type GaAlN cladding layer 309 and the p-type GaN layer 308 are removed by etching except the stripe portion. With this etching a ridge portion in the shape of stripe is formed in the cladding layer 309. A p-type $Ga_{0.93}Al_{0.07}N$ light confining layer 310 and, thereafter, a p-type GaN contact layer 311 are formed on or above the p-type InGaN cap layer 307, the p-type GaN layer 308 and the p-type GaAlN cladding layer 309. And 312 indicates a p side electrode and 313 indicates an n side electrode.

In the embodiment, crystal growth is conducted in two steps only, since the light confining layer 310 is of p-type. In the structure, a current blocking is effected by a heterobarrier between the p-type $Ga_{0.93}Al_{0.07}N$ light confining layer 310 and the p-type InGaN cap layer 307. That is, a current does not flows outside the stripe due to the heterobarrier. On the other hand, in the stripe portion, the p-type GaN layer 308 is formed between the p-type InGaN cap layer 307 and the p-type GaAlN cladding layer 309 and thereby the heterobarrier is lowered and a current flows. An optical confinement is realized in an anti-guiding structure, since a refractive index of the p-type $Ga_{0.93}Al_{0.07}N$ light confining layer 310 is larger than that of the p-type $Ga_{0.85}Al_{0.15}N$ cladding layer 309.

The Seventh Embodiment

FIG. 35 is a sectional view showing a structure of a semiconductor laser according to the seventeenth embodiment of the present invention. In the figure, 320 indicates a sapphire substrate and, on this substrate 320, the following layers are formed in the order: a GaN buffer layer 321, an n-type GaN contact layer 322, an n-type $Ga_{0.85}Al_{0.15}N$ cladding layer 323, an n-type GaN waveguide layer 324, an InGaN multi-quantum-well (MQW) active layer 325, a p-type GaN waveguide layer 326, a p-type $Ga_{0.85}Al_{0.15}N$ first cladding layer 327 and a p-type $Ga_{0.9}Al_{0.1}N$ second cladding layer 328. The p-type $Ga_{0.9}Al_{0.1}N$ second cladding layer 328 and the p-type $Ga_{0.85}Al_{0.15}N$ first cladding layer 327 are removed by etching except the stripe portion. With this etching a ridge portion in the shape of stripe is formed. An n-type InGaN light confining layer 329 is selectively formed in a buried manner outside the ridge portion of the cladding layers 327 and 328 and a p-type GaN contact layer 330 is formed on the cladding layer 328 and the light confining layer 329. And 331 indicates a p side electrode and 332 indicates an n side electrode.

A guiding structure of the embodiment is of a loss guiding type, as the first embodiment is, but it is different from the first embodiment that a ridge expands in its upper portion. With this form of the ridge, a current spreads in the second cladding layer 328 and thereby a series resistance of the device can be reduced. Such a geometrical structure can be achieved when the cladding layer is fabricated in a multi-layered structure composed of a plurality of kinds of GaAlN different in Al compositional ratio and a chemistry that a speed of chemical etching is different in a different compositional ratio is taken advantage of.

Figure 36:
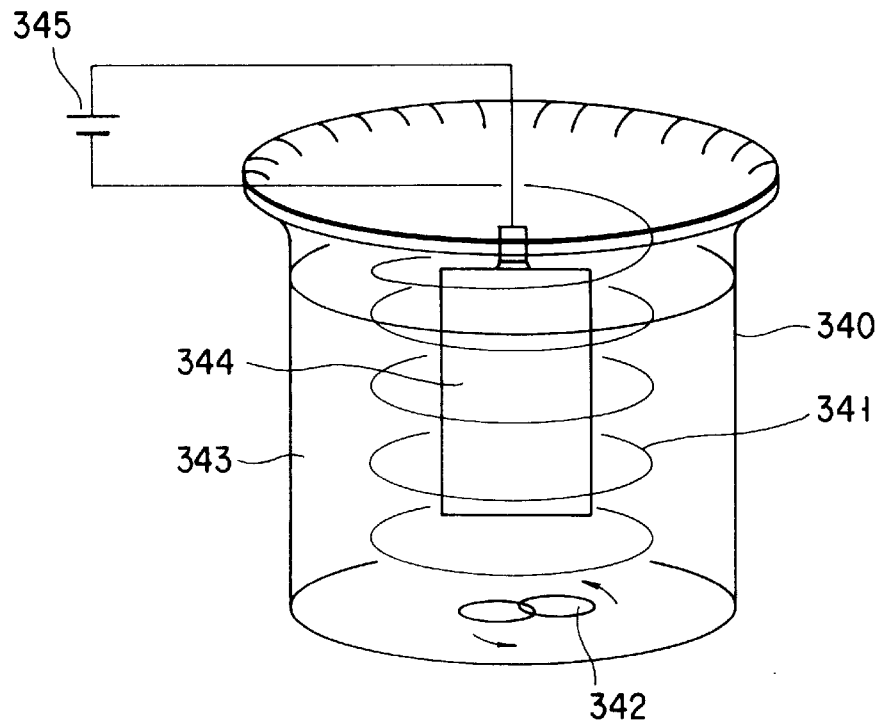
FIGS. 36 and 37 are schematic views for explaining an etching method used in preceding embodiments.

FIG. 36 is a view showing an etching method to fabricate the above mentioned structure of the embodiment. In the figure, a reaction vessel 340 has a metal electrode 341 in the shape of a coil whose wire turns along the inner wall of the vessel and a stirrer 342 and contains an aqueous solution 343 of NaOH. The stirrer 342 is rotatable by a rotating magnetic field applied by a controller, not shown, outside the vessel and with the rotation the aqueous solution 343 of NaOH is stirred. A substrate having a GaN based multi-layered structure 344 is dipped in the NaOH solution.

This substrate 344 is connected to the positive side of a direct current source 344 outside the vessel, while the metal electrode 341 in the vessel is connected to the negative side of the direct current source 345. When the direct current source is in an on state, the substrate is electrochemically etched off.

Figure 37:
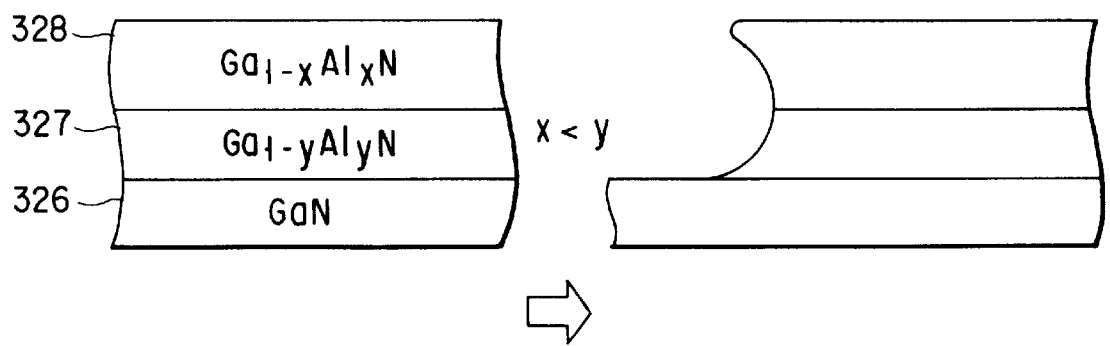

An etched profile can be controlled so as to have a profile as shown in the embodiment of FIG. 35 by such electro-chemical etching. That is, as shown in FIG. 37, a profile shown in FIG. 35 is realized, since the higher an Al compositional ratio in GaAlN, the larger the speed of etching. In this embodiment, the p-type GaN waveguide layer 326 works as a stopper layer of etching.

A layered structure for controlling an etching profile may be a layered structure having three or more layers without limiting to the bi-layered structure. For example a graded layer structure may be used, in the thickness direction of which a chemical composition is gradually changed from $Ga_{0.85}Al_{0.15}N$ to GaN. An etching solution is not limited to NaOH, but a solution of KOH, a HF based solution, a solution of $HPO_3$ or the like can be used instead.

The Eighteenth Embodiment

Figure 38:
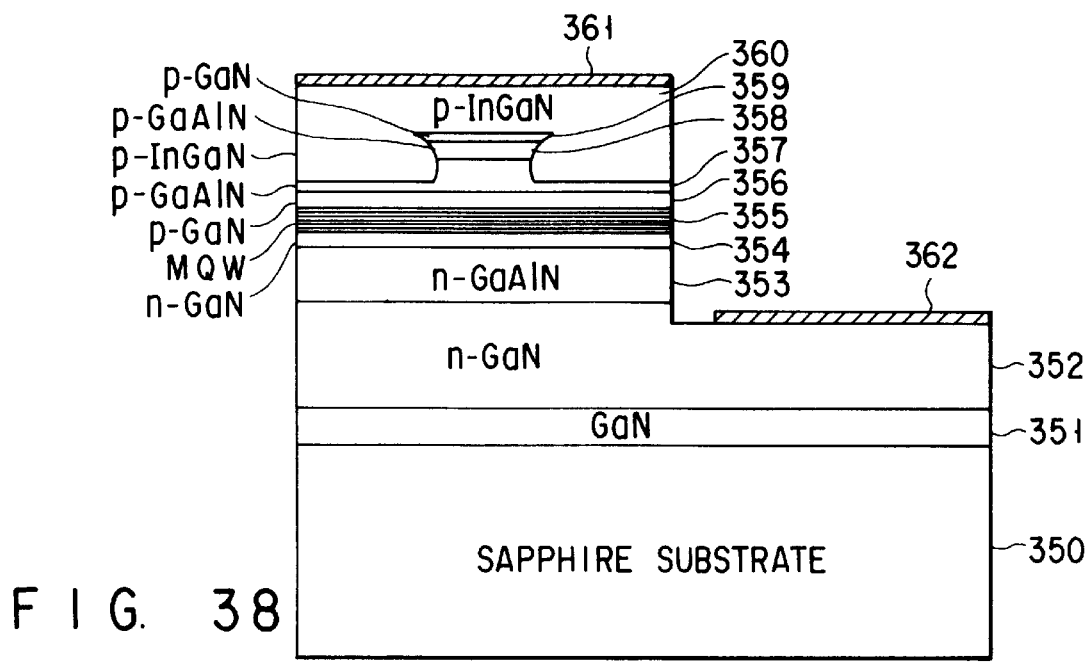
FIG. 38 is a sectional view showing a structure of the semiconductor laser according to an eighteenth embodiment.

FIG. 38 is a sectional view showing a structure of a semiconductor laser according to the eighteenth embodiment of the present invention. In the figure, 350 indicates a sapphire substrate and, on this substrate 350, the following layers are formed in the order: a GaN buffer layer 351, an n-type GaN contact layer 352, an n-type $Ga_{0.85}Al_{0.15}N$ cladding layer 353, an n-type GaN waveguide layer 354, an InGaN multi-quantum-well (MQW) active layer 355, a p-type GaN waveguide layer 356, a p-type $Ga_{0.85}Al_{0.15}N$ first cladding layer 357, a p-type $Ga_{0.9}Al_{0.1}N$ second cladding layer 358 and a p-type GaN cap layer 359. The p-type GaN cap layer 359, the p-type $Ga_{0.9}Al_{0.1}N$ second cladding layer 358 and part of the p-type $Ga_{0.85}Al_{0.15}N$ first cladding layer 357 are removed by etching except the stripe portion. With this etching a ridge portion in the shape of stripe is formed. A p-type InGaN light confining layer 360 is formed in a region outside the ridge portion of the cladding layers 357 and 358. And 361 indicates a p side electrode and 362 indicates an n side electrode.

Current blocking in the embodiment is realized by a hetrobarrier between the p-type $Ga_{0.85}Al_{0.15}N$ first cladding layer 357 and the p-type InGaN light confining layer 360. Etching profile controlling is carried out as described above.

The Nineteenth Embodiment

Figure 39A:
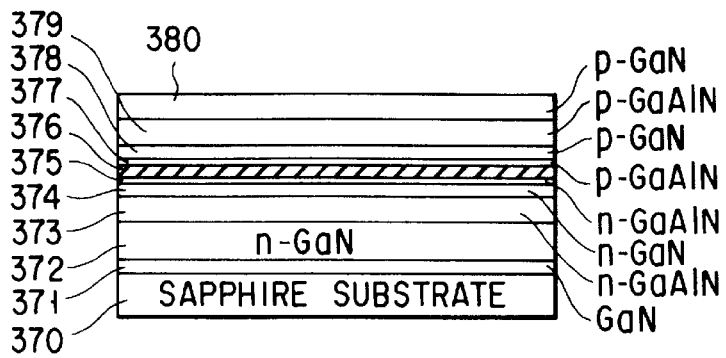
FIGS. 39A to 39E are sectional views of a semiconductor laser in successive steps of fabrication thereof according to a nineteenth embodiment of the present invention.

FIGS. 39A to 39E are sectional views of a semiconductor laser in successive steps of fabrication of the semiconductor laser according to the nineteenth embodiment of the present invention. As shown in FIG. 39A, on a sapphire substrate 370, the following layers are in succession formed by means of a metalorganic chemical vapor deposition method (MOCVD method) in the order: a buffer layer 371 made of GaN with a thickness in the range of 10 to 200 nm, an n-type contact layer 372 made of Si doped n-type GaN with a thickness 4 μm, an n-type cladding layer 373 made of Si doped n-type $Ga_{0.8}Al_{0.2}N$ with a thickness 250 nm, a waveguide layer 374 made of Si doped n-type GaN with a thickness of 200 nm and a Si doped n-type GaAlN overflow blocking layer 375.

Moreover, crystal growth is continued to form an active layer 376 having a multi-quantum-well (MQW) structure composed of repetitions of fifty cycles of two kinds of InGaN layers. Said the two kinds of InGaN layers being respectively an undoped $In_{0.25}Ga_{0.75}N$ layer with a thickness 1.5 nm and an undoped $In_{0.05}Ga_{0.95}N$ layer with a thickness 3 nm.

Moreover, on the active layer 376, the following layers are further in succession formed in the order: a Mg doped p-type GaAlN overflow blocking layer 377, a waveguide layer 378 with a thickness of 200 nm made of Mg doped p-type GaN, a p-type cladding layer 379 made of Mg doped p-type $Ga_{0.8}Al_{0.2}N$ and a cap layer 380 with a thickness of 0.3 μm made of Mg doped p-type GaN.

Next, an inorganic mask layer 381 with a thickness of 400 nm made of a $SiO_2$ film is piled up on the p-type GaN cap layer 380 by means of a thermal CVD method. Subsequently, photoresist (AZ4110) is applied by a thickness of 1 μm on the inorganic layer 381 and a stripe pattern is transferred to the photoresist by means of an optical exposure process. After development, a wafer is held in an oven of a nitrogen atmosphere at 120° C. for 20 min for post baking. The $SiO_2$ film, which is the inorganic layer 381, is etched to form a mask layer composed of two layers of the inorganic and resist layers.

Figure 39B:
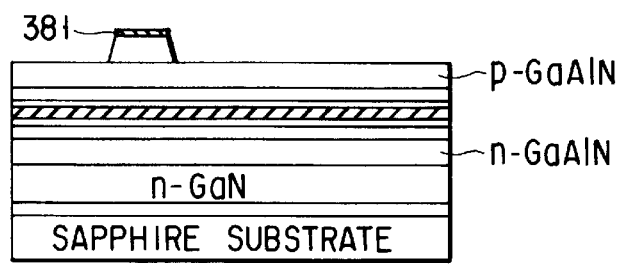

Next, as shown in FIG. 39B, the p-type GaN cap layer 380 is etched until the p-type GaAlN cladding layer 379 is exposed by means of a reactive ion beam etching (RIBE) method so as to effect etching in the shape of a stripe.

On this occasion, over-etching affects an optical confinement effect, even when a thickness of the p-type GaAlN cladding layer is a little thinner than a predetermined value, since the predetermined thickness is as thin as about 0.3 μm. For this reason, it is necessary to minimize a degree of over-etching as much as possible in this etching process. In this embodiment, under consideration of such a situation, a mixture of $Cl_2$ gas and $SF_6$ gas as an etching gas is used to selectively etch GaN and GaAlN.

Figure 40:
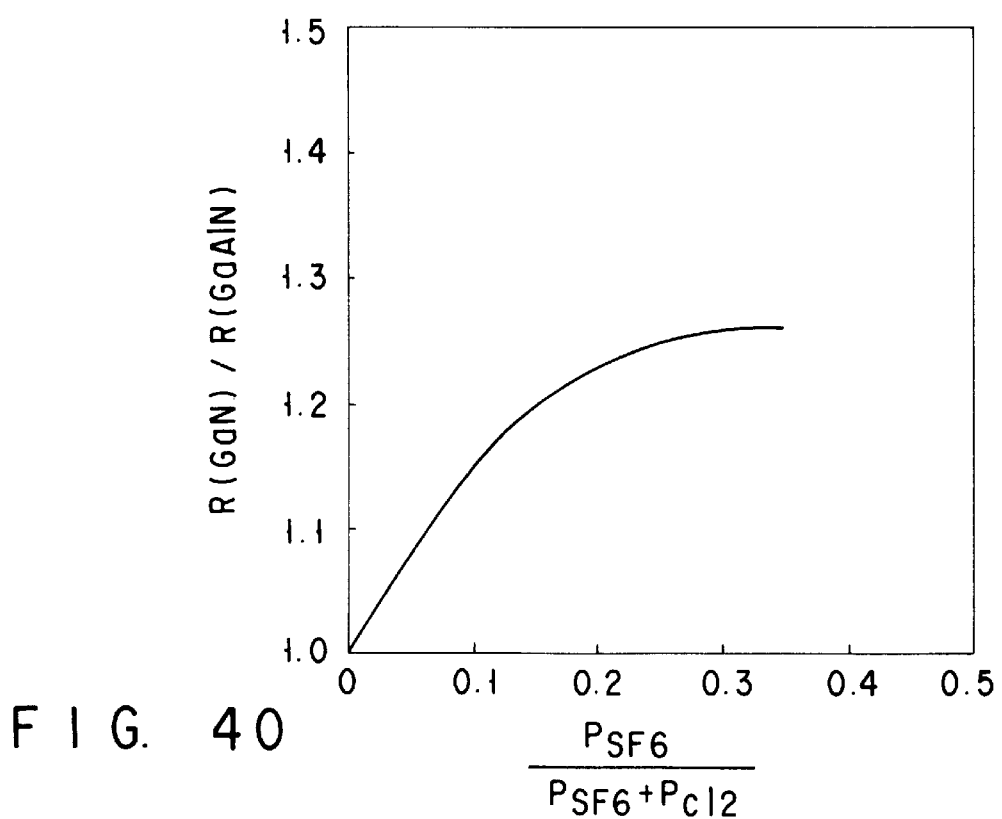
FIG. 40 is a graph showing a relationship of the selectivity ratio and the gas composition in the preceding embodiments.

Changes in selectivity ratio of GaN to $Ga_{1-x}Al_xN$ (x=0.2) are shown in FIG. 40, wherein $SF_6$ gas was added and constant etching conditions of a microwave power at 200W, an ion acceleration voltage at 500V, a gas pressure at 0.4 mTorr were employed. The axis of ordinate shows the selectivity ratio of GaN and the axis of abscissa shows the partial pressure ratio of $SF_6$.

As the pressure of $SF_6$ gas is increased, the selectivity ratio is also increased. The reason why is that with addition of $SF_6$ gas an Al chloride is produced on the surface as a reaction product in etching of the GaAlN layer and the product is hard to be released from the surface.

With such a product on the surface, an etching speed of the GaAlN layer becomes slow and, as a result, a selectivity ratio of GaN grows larger. In the embodiment, as additional gas, $SF_6$ gas is used, but a gas, which includes at least a F ingredient and, for example, $CF_4$ or the like may be used with the same effect. Moreover, selective etching can be practically conducted with a gas, which includes at least 0 as ingredient, for example $O_2$, CO, $CO_2$ or the like. The reason why is that in etching of a GaAlN layer an Al oxide is produced on the surface and the oxide is hard to be released from the surface.

It is preferable to use selective etching and an in-situ observation method for observation of an etching process thereof in order to stop progress of etching in precise timing at the interface between the GaN layer 380 and the GaAlN layer 379. In the embodiment, a depth of etching is monitored by means of laser interferometry. In more detail, laser light with a wavelength of 650 nm is radiated on a surface of an etching specimen and reflected light is detected, wherein the laser light is reflected not only on the surface but on an interface in the interior of the specimen and interference occurs between the two beams, so that intensity of the reflected light oscillates according to the progress of etching. With detection of the oscillation, measurement of etching removal and observation of the hetero-interface can be effected. According to the in-situ observation, when the observation method is used in a selective etching method, great difference between the GaN layer 380 and the GaAlN layer 379 in oscillation cycle time of individual reflection beam intensity in etching is observed, since an etching speed of the GaAlN is slow. Therefore, if the etching is ceased when the oscillation cycle time of the reflection light intensity changes, it requires only a minimum degree of over-etching to finish.

According to the above mentioned method, in the embodiment, etching of the GaAlN layer 379 can be finished with an overetching of 40 nm or less. After the etching, the wafer is dipped in a solution composed of $H_2SO_4:H_2O_2:H_2O$ to remove the photoresist mask and an etching residue. After removal the photoresist mask, the $SiO_2$ mask exposed can be used in a following selective growth as mask as well.

Figure 39C:
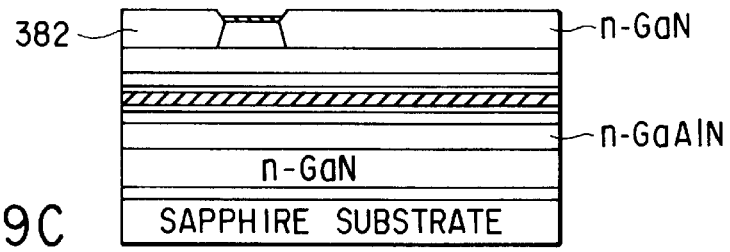

After the above mentioned treatment, as shown in FIG. 39C, a light confining layer (a current confining layer) 382 with a thickness of 0.5 μm, which is made of Si doped n-type GaN, is formed on the p-type GaAlN cladding layer 379 and along sides of the p-type GaN cap layer 380 in a second growth by means of MOCVD. After the second growth, the wafer is dipped in an ammonium fluoride solution to remove the SiO$_2$ mask and then to expose the p-type GaN cap layer 380.

Figure 39D:
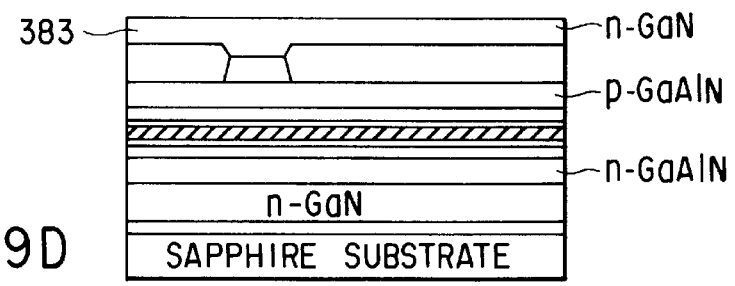

Subsequently, as shown in FIG. 39D, a contact layer 383 with a thickness of 0.5 μm, which is made of Mg doped p-type GaN, is formed on the p-type GaN cap layer 380 and the p-type GaAlN cladding layer 379 in a third growth by means of MOCVD.

Next, part of the wafer is etched until the n-type GaN contact layer 372 is exposed to form a mesa by RIBE with Cl$_2$ gas.

Figure 39E:
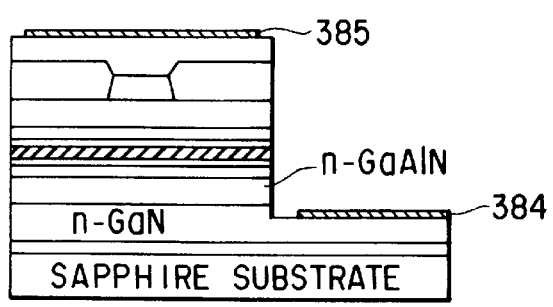

Thereafter, as shown in FIG. 39E, an n side electrode 384 and a p side electrode are formed to complete a semiconductor laser.

Conventionally, a semiconductor laser of a similar kind has been fabricated in the following method: in a first growth, the layers up to the n-type GaN current confining layer 382 are grown, thereafter, a window is formed in the current confining layer 382 by dry etching and in a second growth the p-type GaN contact layer 380 is grown. However, in such a conventional method, there is a problem that incorporation of Mg originating from a region in the vicinity of an MOCVD reactor tube into the n-type GaN current confining layer 382 occurs during the growth and, therefore, it becomes necessary to make the current confining layer 382 thicker, which further requires increase of a thickness of the p-type GaN contact layer in the opening of the current confining layer, which then increases an electric resistance of a device. Besides, again in the conventional method, a dry etching/regrowth interface is created, a current flows along the interface and, as a result, there arises another problem that deterioration of device characteristics, such as leakage in an interface and the like could be a matter of concern.

However, according to the embodiment, the n-type GaN current confining layer 382 is layered in the second growth and thereby incorporation of Mg form a region in the vicinity of an MOCVD reaction tube does not occur, so that the n-type GaN current confining layer 382 can be made thin. Moreover, no current flows along the dry etching/regrowth interface and therefore there arises no problem such as leakage.

As described above, selective etching of a gallium nitride based compound semiconductor layer can be realized according to the embodiment. Besides, removal in the etching can be monitored with good precision and accordingly an etching removal is also precisely controlled in a step where a ridge portion is formed in the cladding layer. In such a manner, a semiconductor laser can be fabricated, in which a threshold current density is decreased, and at the same time a continuous oscillation in a fundamental transverse mode is realized, since a distance between a current confining layer and an active layer can be controlled to a value as designed.

The Twentieth Embodiment

FIGS. 41A to 41E are sectional views of a semiconductor laser in successive steps of fabrication of the semiconductor laser according to the twentieth embodiment of the present invention.

The embodiment is different in the following two points from the nineteenth embodiment. A first point is that a p-type GaAlN cladding layer 390, which has a ridge and a flat region around the ridge, is formed by dry etching as counterpart of the p-type GaAlN cladding layer 379 as shown in FIG. 41B. A second point is that, as shown in FIG.41C, the ridge made of the p-type GaAlN cladding layer 390 is buried in the n-type InGaN current confining layer 382 in a surrounded manner.

In this structure, the current confining layer 382 is disposed in a position close to the active layer 376 on both sides of the ridge and, therefore, an optical confinement is conducted by a distribution of an effective refractive index in a horizontal direction, which is produced under influence of an absorption loss in the InGaN current squeezing layer 382. On this occasion, a thickness of GaAlN around the ridge affects a distance between the current confining layer 382 and the active layer 376 and, thereby, the thickness has to be strictly controlled from a view point of stable oscillation in a transverse mode.

Figure 41A:
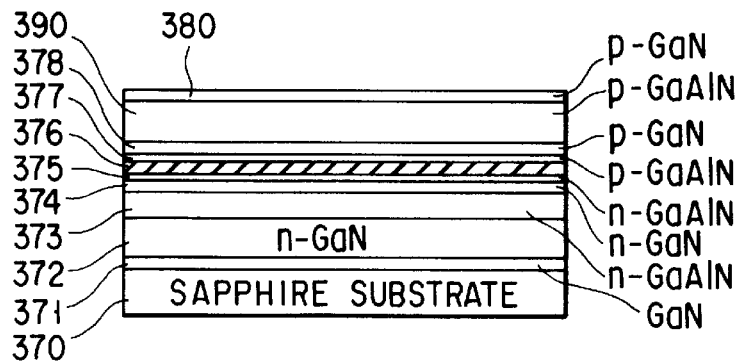
FIGS. 41A to 41E are sectional views of a semiconductor laser in successive steps of fabrication thereof according to a twentieth embodiment of the present invention.
Figure 41B:
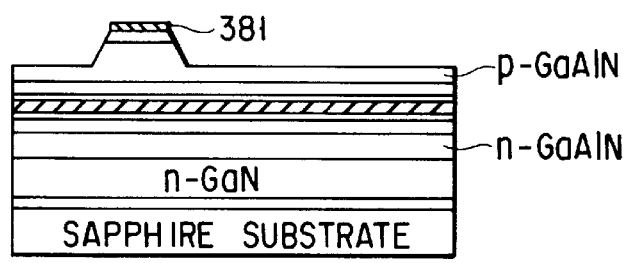
Figure 41C:
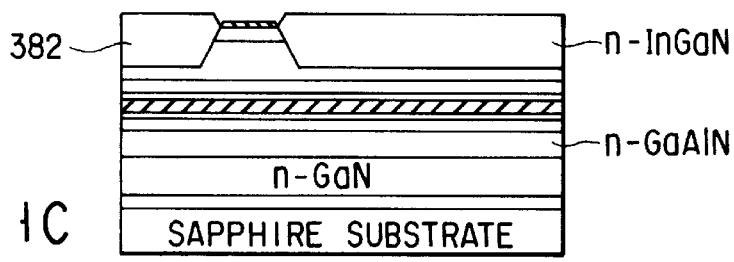

From such a reason, as described above, in a step of formation of the ridge portion after a layer formation process as shown in FIG. 41A, a combination of a selective etching technique and a laser interference monitor is used. Etching is conducted by means of a RIBE method with a mixture gas of Cl$_2$ gas and SF$_6$. Conditions of the etching are that a pressure of Cl$_2$ gas is 0.4 mTorr, a pressure of SF$_6$ is 0.15 mTorr, a micro wave power is 200 W and an ion acceleration voltage is 500V.

A mask is formed on the p-type GaN cap layer 380 and a region, which is not covered by the mask in the p-type GaN cap layer 380, is subjected to the etching. A progress status of the etching is watched by the laser interference monitor. In the above conditions, a selectivity ratio of GaN/GaAlN is on the order of 1.25, an etching speed of the GaAlN is small and, therefore, an oscillation cycle time of reflection intensity of laser light in the laser interference monitor changes at an interface between GaN and GaAlN. When an oscillation cycle time corresponded to 150 nm and oscillation at 1.3 cycle time after detection of the GaN/GaAlN interface was appeared, the etching was ceased. As a result, as shown in FIG. 41B, a residual thickness of the p-type GaAlN cladding layer 390 around the ridge portion was 100 nm as designed, when the etching was ceased.

When Cl$_2$ gas is only used in this etching process, in which selective etching is not applied in a different manner from the embodiment, etching speeds of GaN and GaAlN are almost equal. In this case of the equal etching speed, a change in oscillation cycle time at the GaN/GaAlN interface is very small in the laser interference monitor and thereby detection of the interface is not correct. Accordingly, accuracy in monitoring of etching removal is insufficient.

On the other hand, in a method of the present invention, etching removal can be controlled with sufficient accuracy by using selective etching and, as a result, fabrication of a semiconductor laser of a structure of the present invention can be effected.

Figure 41D:
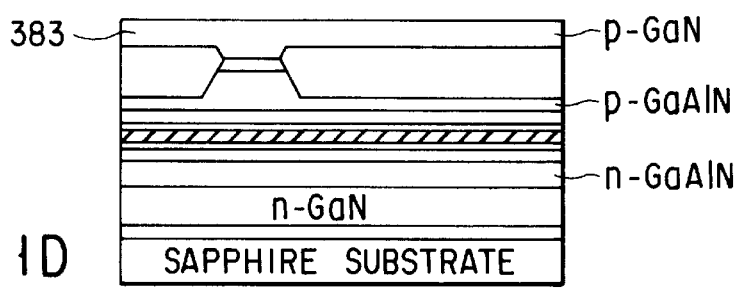
Figure 41E:
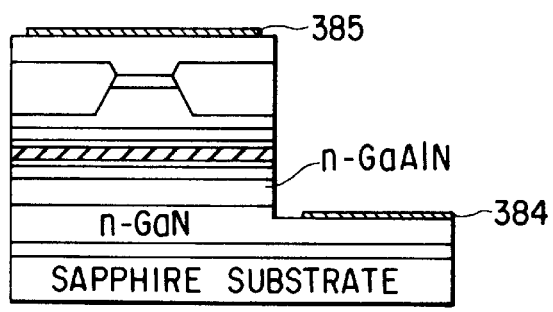

In a second growth step, after formation of the ridge portion as described above, the n-type InGaN current confining layer 382 is selectively formed, as shown in FIG. 41C. After removal of a SiO$_2$ mask, the p-type GaN contact layer 383 is formed in a third growth step, as shown in FIG. 41D. This p-type GaN contact layer 383 is then removed by dry etching until the n-type GaN contact layer 384 is exposed and after the dry etching there is left a mesa. Thereafter, a p side electrode 385 is formed on the p-type GaN contact layer 383 and further an n side electrode 384 is formed on the n-type GaN contact layer 384, as shown in FIG. 41E. In such a manner, a semiconductor laser of the present invention is fabricated.

In the embodiment, the case where the n-type InGaN layer is buried is described as a current confining layer 382, but one of other materials such as n-type GaAlN may be used.

The Twenty-First Embodiment

FIGS. 42A to 42D are sectional views of a semiconductor laser in successive steps of fabrication of the semiconductor laser according to the twenty-first embodiment of the present invention. A different point from the twentieth embodiment is that the whole ridge is buried in the n-type InGaN current confining layer 391 without using a selective growth technique, as shown in FIG. 42C.

Even this laser structure requires that, after the step as shown in FIG. 41A, the p-type GaAlN cladding layer 390 is processed by dry etching to a shape which has a ridge and a flat region around the ridge, as shown in FIG. 42B. On this occasion, thicknesses of GaAlN around the ridge gives an influence on a distance between the current confining layer 391 and the active layer 376 and therefore the thicknesses have to be strictly controlled from a view point of a stable transverse mode oscillation, as is in the twentieth embodiment.

In the embodiment as well, a combination of a selective etching technique and a laser interference monitor of the present invention are used in the same way as in the twentieth embodiment. As a result, a semiconductor laser having a structure, as shown in FIG. 42D, can be fabricated.

The Twenty-Second Embodiment

Figure 43:
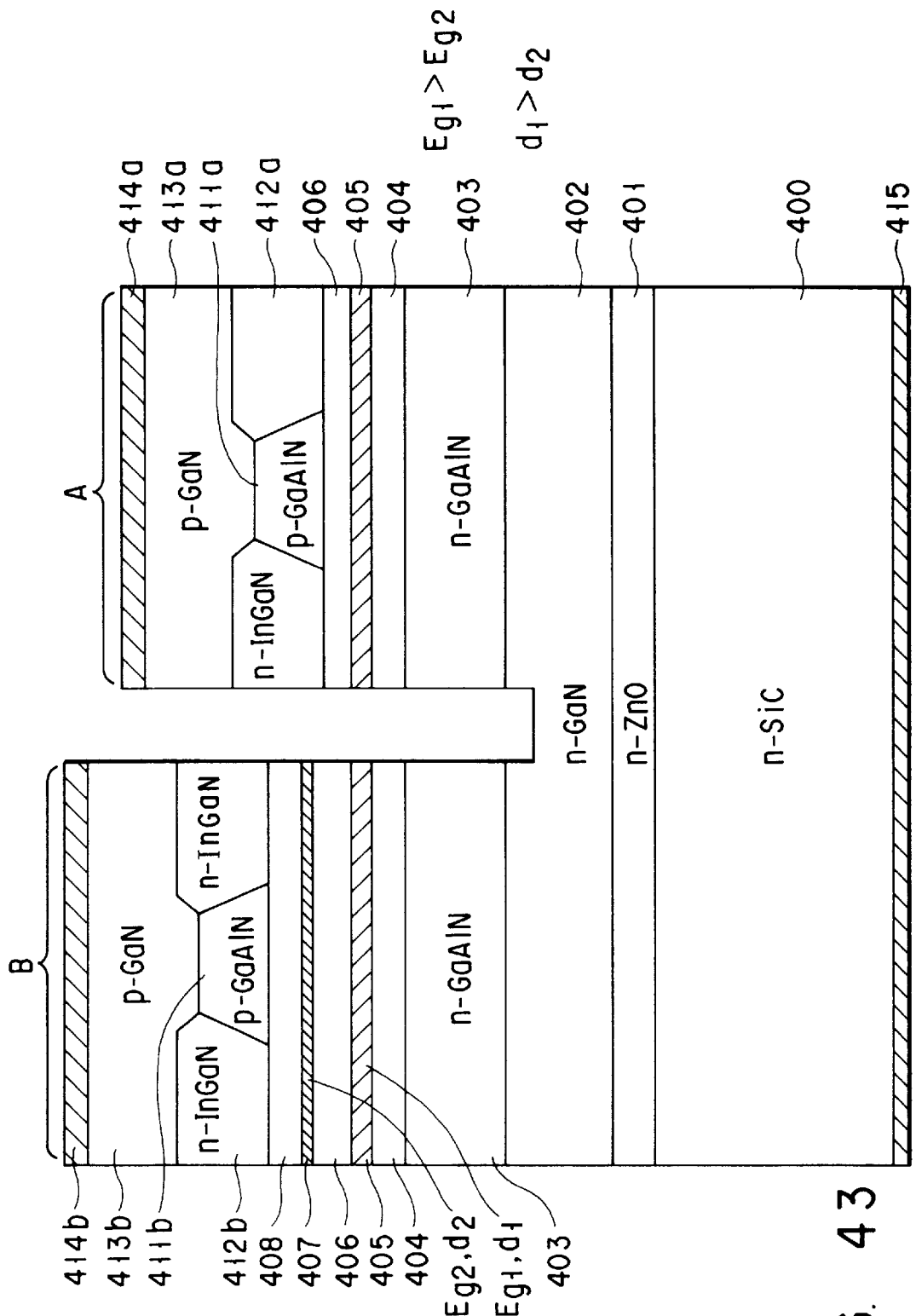
FIG. 43 is a sectional view showing a structure of a semiconductor laser according to a twenty-second embodiment of the present invention.

FIG. 43 is a sectional view showing a structure of the semiconductor laser according to the twenty-second embodiment of the present invention.

In the figure, 400 indicates an n-type SiC substrate 400, on the SiC substrate 400, the following layers are in succession formed in the order: an n-type ZnO layer 401, an n-type GaN layer 402, an n-type GaAlN cladding layer 403, a GaN waveguide layer 404, a first active layer 405 made of $In_jGa_{1-j}N$ and a GaN waveguide layer 406; in a second region B except a first region A further, a second active layer 407 made of $In_kGa_{1-k}N$ and a GaN waveguide layer 408; in the first region A and the second region B still further, a p-type GaAlN cladding layer 411a and b, an n-type InGaN light confining layer 412a and b, and a p-type GaN contact layer 413a and b, wherein crystal growth of the layers are conducted by means of an MOCVD method and an MBE method, singly or in combination, and 414a and b indicate p side electrodes and 415 indicates an n side electrode.

In the embodiment, a bandgap $Eg_1$ and thickness $d_1$ of the first active layer 405 and those $Eg_2$ and $d_2$ of the second active layer are set so as to satisfy the following relations (16) and (17):

$$Eg_1 > Eg_2 \quad (16)$$

$$d1 > d2 \quad (17)$$

In more detail, an In compositional ratio j and a thickness of the first active layer 405 are respectively 0.05 and 100 nm and an In compositional ratio k and a thickness of the second active layer 407 are respectively 0.15 and 10 nm. Theses parameters respectively correspond to $\lambda_1$=380 nm and $\lambda_2$=410 nm for oscillation wavelength.

In the first region A of the laser structure, only the first active layer 405 is included and, therefore, this active layer 405 oscillates at a wavelength of 380 nm. On the other hand, in the second region B, there are included the first active layer 405 and the second active layer 407 but stimulated emission recombination occurs in the second active layer 407 because a bandgap of the second active layer 407 is smaller than that of the first active layer 405. Accordingly, in this region, oscillation occurs at a wavelength of 410 nm.

The active layer 405 in the first region A has a thickness of 100 nm which is comparatively thick and, thereby, its structure is subject to a self-pulsation and has a characteristic that a reflected-light-induced noise is in a low level. On the other hand, in the second region B, an optical power density can be reduced and a high power oscillation can be effected, since it has the active layer 407 with a thickness as thin as 10 nm. Accordingly, this structure of laser can be used in two ways, one of which is use for reading in an optical disc application by a laser in the first region A, and the other of which is use for recording in the same application by another laser in the second region B.

In addition, in the embodiment, the light confining layer 412 having a smaller bandgap energy than that of the active layers 405, 407 is formed in a buried manner on both sides of the cladding layer 411 which forms the ridge and, therefore, values of threshold current densities for a laser oscillation in the A and B regions are reduced and a continuous oscillation in a fundamental transverse mode can be realized.

Figure 44A:
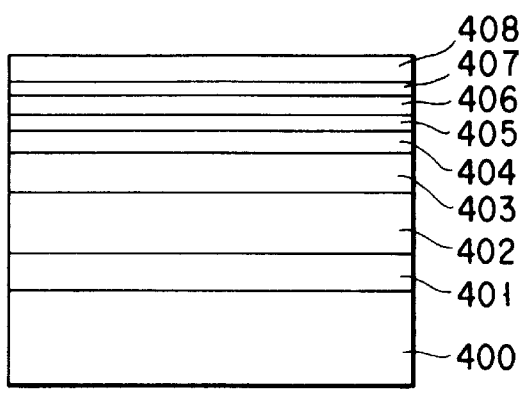
FIGS. 44A to 44F are sectional view of a semiconductor laser in successive steps of fabrication thereof according to the twenty-second embodiment.

The process of fabrication of a semiconductor laser shown in FIG. 43 will be described in reference to FIGS. 44A to 44F. First all, as shown in FIG. 44A, on the n-type SiC substrate 400, the following layers are in succession formed in the order: the n-type ZnO layer 401, the n-type GaN layer 402, the n-type GaAlN cladding layer 403, the GaN waveguide layer 404, the $In_jGa_{1-j}N$ active layer (a first active layer) 405, the GaN waveguide layer 406, the $In_kGa_{1-k}N$ active layer (a second active layer) 407 and the GaN waveguide layer 408.

Figure 44B:
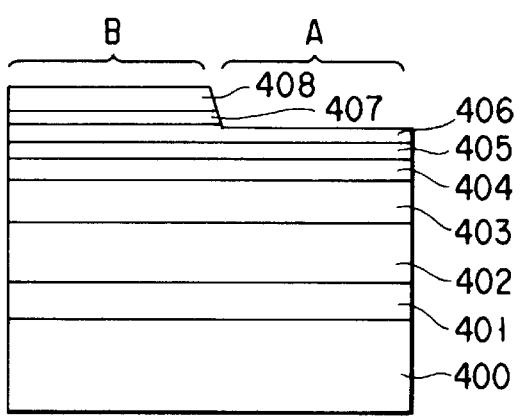

Then, as shown in FIG. 44B, the guide layer 408 and the active layer 407 are removed by etching. On this occasion, the active layer 405 is protected by the guide layer 406 and, thereby, increase of a portion of non-radiative recombination caused by recombination at the interface can be prevented in a final structure.

Figure 44C:
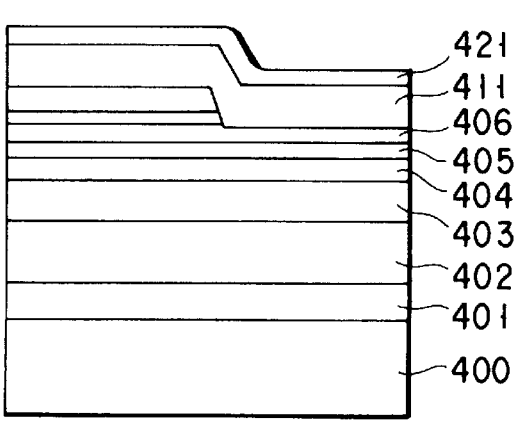

Then, as shown in FIG. 44C, the p-type GaAlN cladding layer 411 is formed across all the surface and an $SiO_2$ film 421 is formed by a spattering method or the like.

Figure 44D:
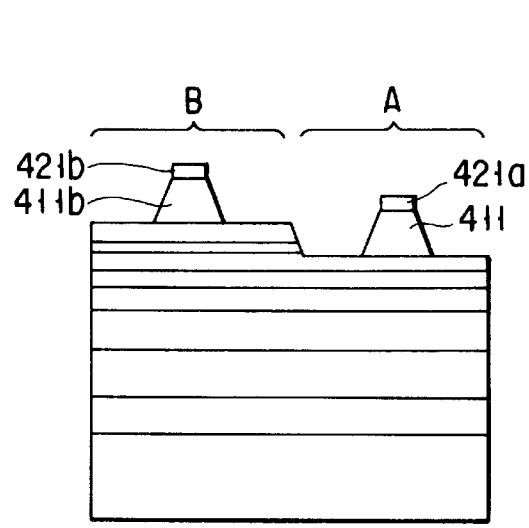

Then, as shown in FIG. 44D, the $SiO_2$ film 421 is patterned and, with a mask thus patterned, ridges are respectively formed in the regions A and B.

Figure 44E:
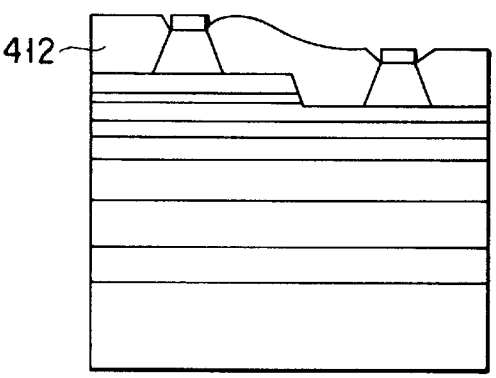

Then, as shown in FIG. 44E, the light confining layer 412, which plays an additional role of current confining, is formed by selective growth, while the $SiO_2$ film is kept in place.

Figure 44F:
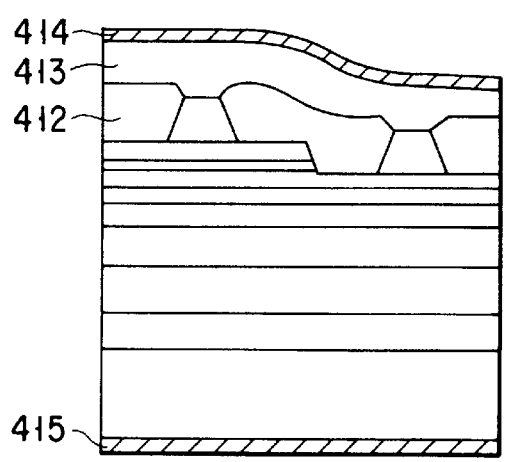

Then, as shown in FIG. 44F, the p-type GaN contact layer 413 is grown after the $SiO_2$ is removed and the p side electrode 414 and the n side electrode 415 are formed. Finally, the groove is formed between the regions A and B for device separation to complete the structure as shown in FIG. 43.

As described above, according to the embodiment, a low power laser of a thick film active layer and a high power laser of a thin film active layer are formed on the same substrate and, thereby, laser performances required for read and erase/record in an optical disc system can be realized without a difficult process such as thickness control of an active layer and the like. Moreover, a problem of non-compatibility from a difference in wavelengths can be solved because of formation of lasers of different wavelengths on the same substrate.

The Twenty-Third Embodiment

Figure 45:
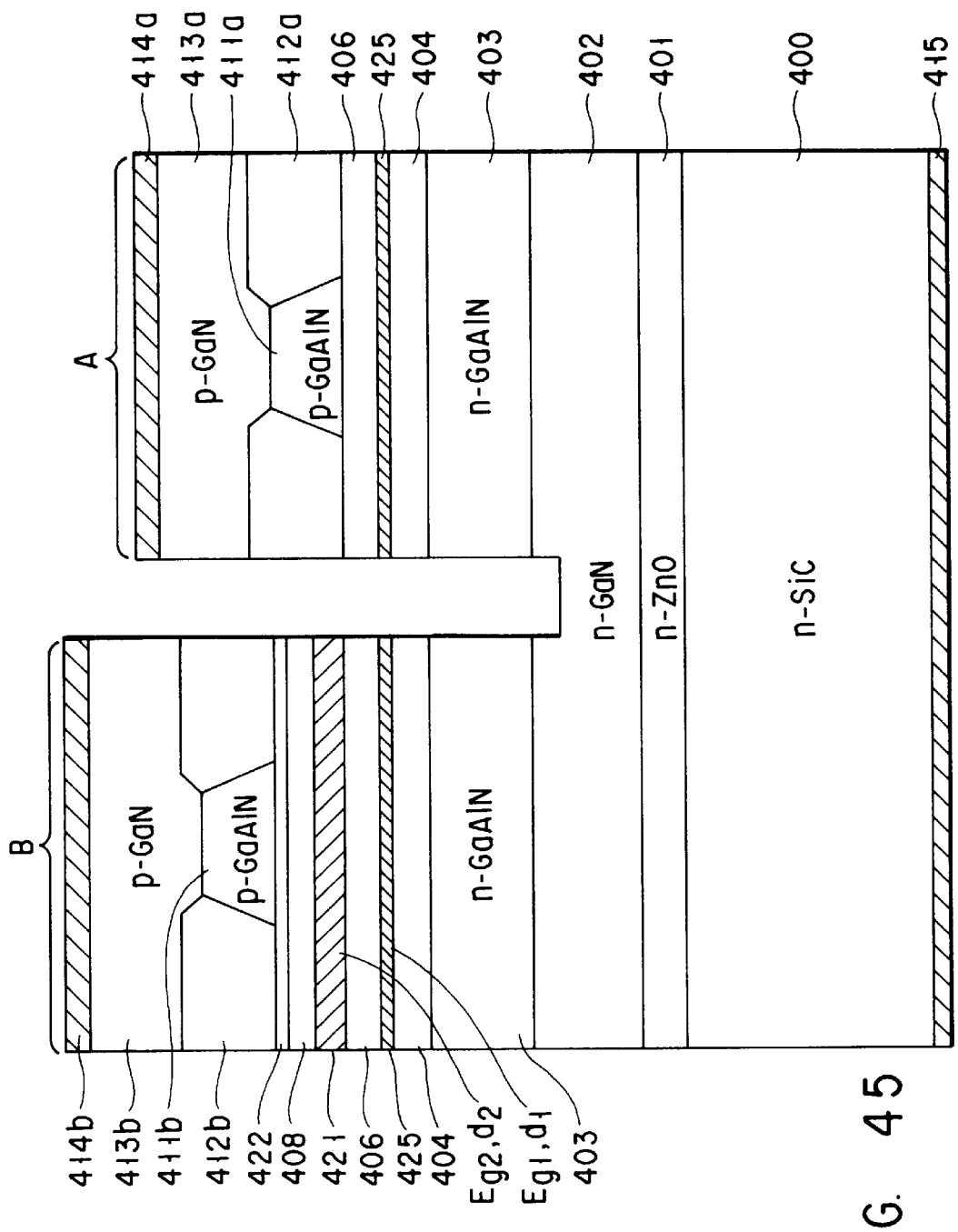
FIG. 45 is a sectional view showing a structure of a semiconductor laser according to a twenty-third embodiment of the present invention.

FIG. 45 is a sectional view showing a structure of the semiconductor laser according to the twenty-third embodiment of the present invention, wherein the same portions as those of FIG. 19 are indicated at the same marks as those of the figure and the detailed description is omitted.

A method and structure of the embodiment are almost the same as those of the twenty-second embodiment but there are different points from those of the twenty-second embodiment: A first active layer 425 with a thickness of d1 is used instead of the first active layer 405 and a second active layer 421 with a thickness of d2 larger than that of the first active layer is used instead of the second active layer 407.

That is, the thicknesses d1 and d2 of the first and second active layers are set to satisfy the following relation (18):

$$d1 < d2 \quad (18)$$

Particularly, they are set d1=10 nm and d2=100 nm. Besides, a p-type InGaN absorption layer 422 is disposed in the second region B. This absorption layer 422 works as a saturable absorber and in a structure with the presence of the layer a self-pulsation is easy to occur. In the case of such a structure, a laser in a first region A is to be used for recording and another laser in a second region B is to be used for reading, in an optical disc application.

The Twenty-Fourth Embodiment

Figure 46:
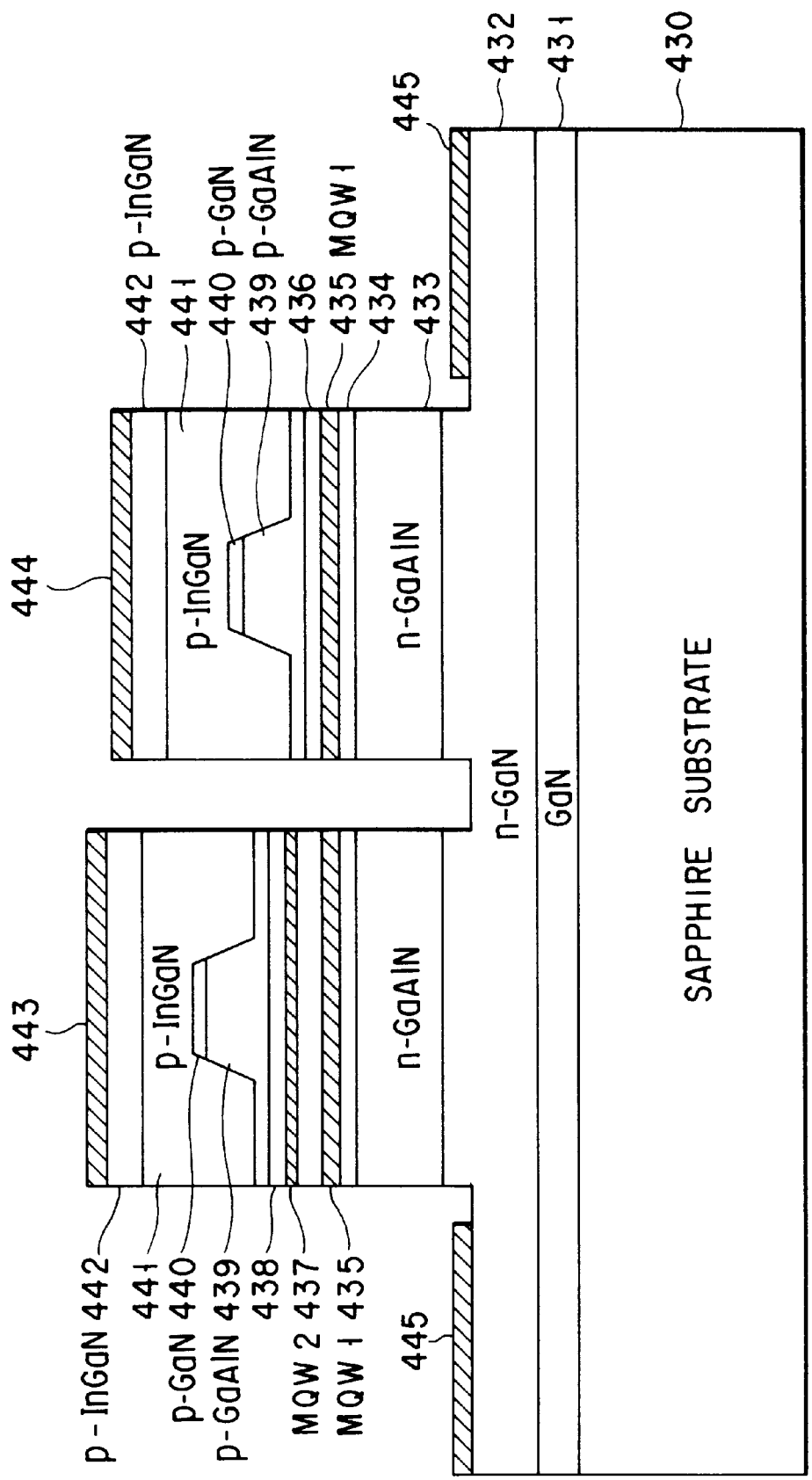
FIG. 46 is a sectional view showing a structure of a semiconductor laser according to a twenty-fourth embodiment of the present invention.

FIG. 46 is a sectional view showing a structure of the semiconductor laser according to the twenty-fourth embodiment of the present invention.

In the figure, 430 indicates a sapphire substrate and, on this substrate 430, the following layers are formed in the order: a GaN buffer layer 431, an n-type GaN contact layer 432, an n-type GaAlN cladding layer 433, an n-type GaN waveguide layer 434, a first active layer 435 made of InGaN multi-quantum-well, an undoped GaN waveguide layer 436, a second active layer 437 made of InGaN multi-quantum-well, a p-type GaN waveguide layer 438, a p-type GaAlN cladding layer 439, a p-type GaN cap layer 440, a p-type InGaN light confining layer 441 and, a p-type InGaN contact layer 442, wherein 443 and 444 indicate a p electrode and 445 indicates an n electrode.

A bandgap $Eg_1$ of the first multi-quantum-well active layer 435 and a bandgap $Eg_2$ of the second multi-quantum-well active layer 437 are set to satisfy the following relation:

$$Eg_1 > Eg_2$$

Particularly, an In compositional ratio of the first multi-quantum-well active layer is set at 0.15 and that of the second multi-quantum-well active layer is set at 0.8. Oscillation wavelengths corresponding to the compositional ratios are respectively blue and red. The In compositional ratio of the second multi-quantum-well active layer is larger, as compared with a common GaN laser, but the In compositional ratio of the layer has a value close to InN and, therefore, the active layer is grown as high quality crystal.

In such a manner, a structure of a laser in which lasers of blue and red are integrated in one, which makes the structure very useful in an optical disc application. In other words, in the case of a system in which a laser of a different wavelength is used under a need for a high density, compatibility with a conventional system is easily achieved with the use of a laser as described in the embodiment.

FIG. 47 is a perspective view in section showing a configuration of electrodes of the embodiment shown in FIG. 46. According to the embodiment, as is in this example of FIG. 47, n-electrodes are used in common and, thereby, bonding wires are restricted to three in number.

The Twenty-Fifth Embodiment

Figure 48:
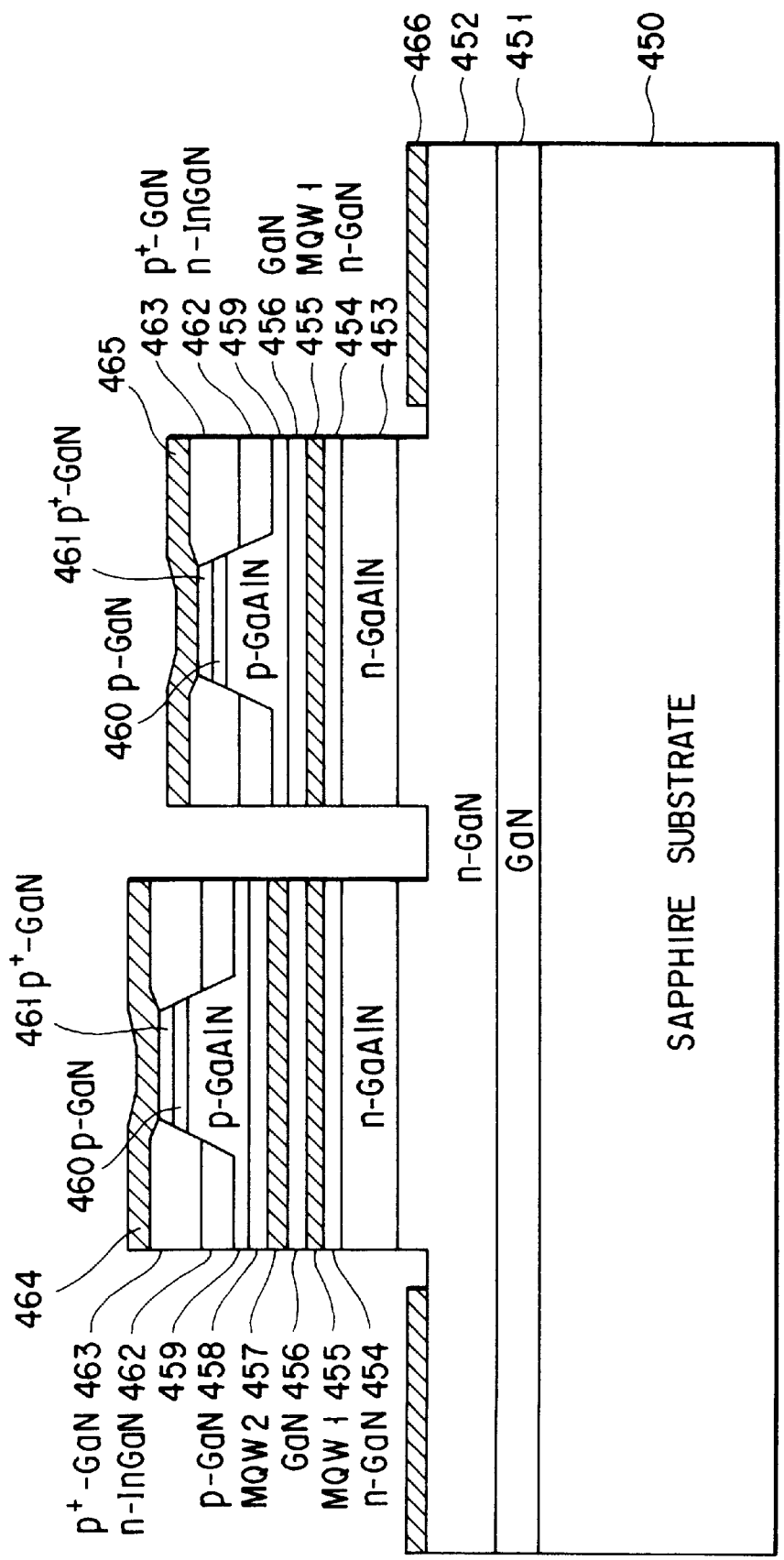
FIG. 48 is a sectional view showing a structure of a semiconductor laser according to a twenty-fifth embodiment of the present invention.

FIG. 48 is a sectional view showing a structure of the semiconductor laser according to the twenty-fifth embodiment of the present invention.

In the figure, 450 indicates a sapphire substrate and, on this substrate 450, the following layers are formed in the order: a GaN buffer layer 451, an n-type GaN contact layer 452, an n-type GaAlN cladding layer 453, an n-type GaN waveguide layer 454, a first active layer 455 made of InGaN multi-quantum-well, an undoped GaN waveguide layer 456, a second active layer 457 made of InGaN multi-quantum-well, a p-type GaN waveguide layer 458, a p-type GaAlN cladding layer 459, a p-type GaN cap layer 460, p⁺-type GaN contact layer 461, an n-type InGaN light confining layer 462 and a p⁺-type GaN contact layer 463, wherein 464 and 465 indicate a p side electrode and 466 indicates an n side electrode.

A bandgap $Eg_1$ of the first multi-quantum-well active layer 455 and a bandgap $Eg_2$ of the second multi-quantum-well active layer 457 are set to satisfy the following relation:

$$Eg_1 > Eg_2$$

With this relation, two kinds of oscillation occur; in the laser on the left hand side of the figure, oscillation of a wavelength corresponding to an bandgap of $Eg_2$ occurs and in the laser on the right hand, that of $Eg_1$ occurs.

The Twenty-Sixth Embodiment

Figure 49:
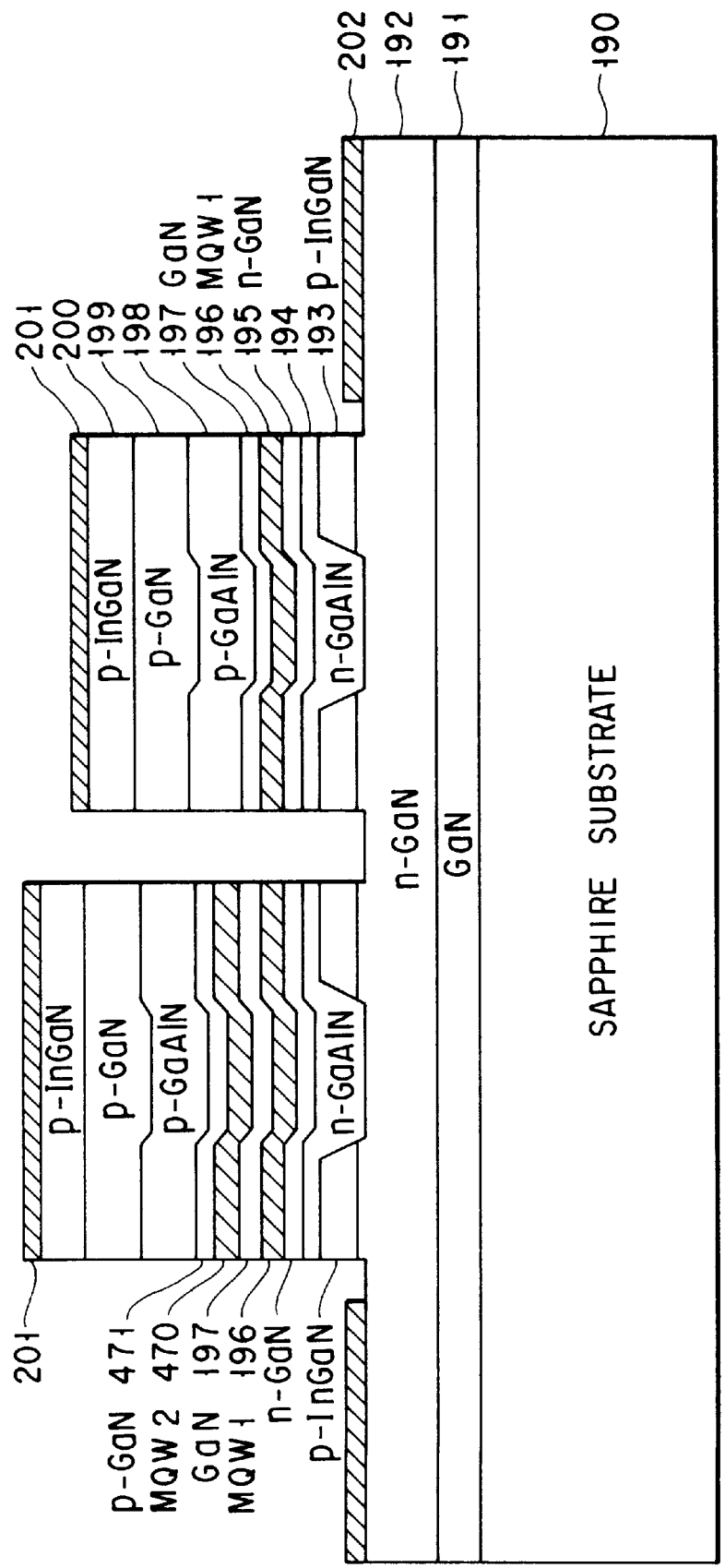
FIG. 49 is a sectional view showing a structure of a semiconductor laser according to a twenty-sixth embodiment of the present invention.

FIG. 49 is a sectional view showing a structure of the semiconductor laser according to the twenty-sixth embodiment of the present invention.

A fundamental structure of a laser is the same as shown in the tenth embodiment and, thereby, a detailed description is omitted. In the embodiment, too, a relation between a bandgap $Eg_1$ of a first multi-quantum-well active layer 196 and a bandgap $Eg_2$ of a second multi-quantum-well active layer 470 are set in the way as mentioned above and, thereby, both lasers can differently oscillate in respective wavelengths.

The Twenty-Seventh Embodiment

Figure 50:
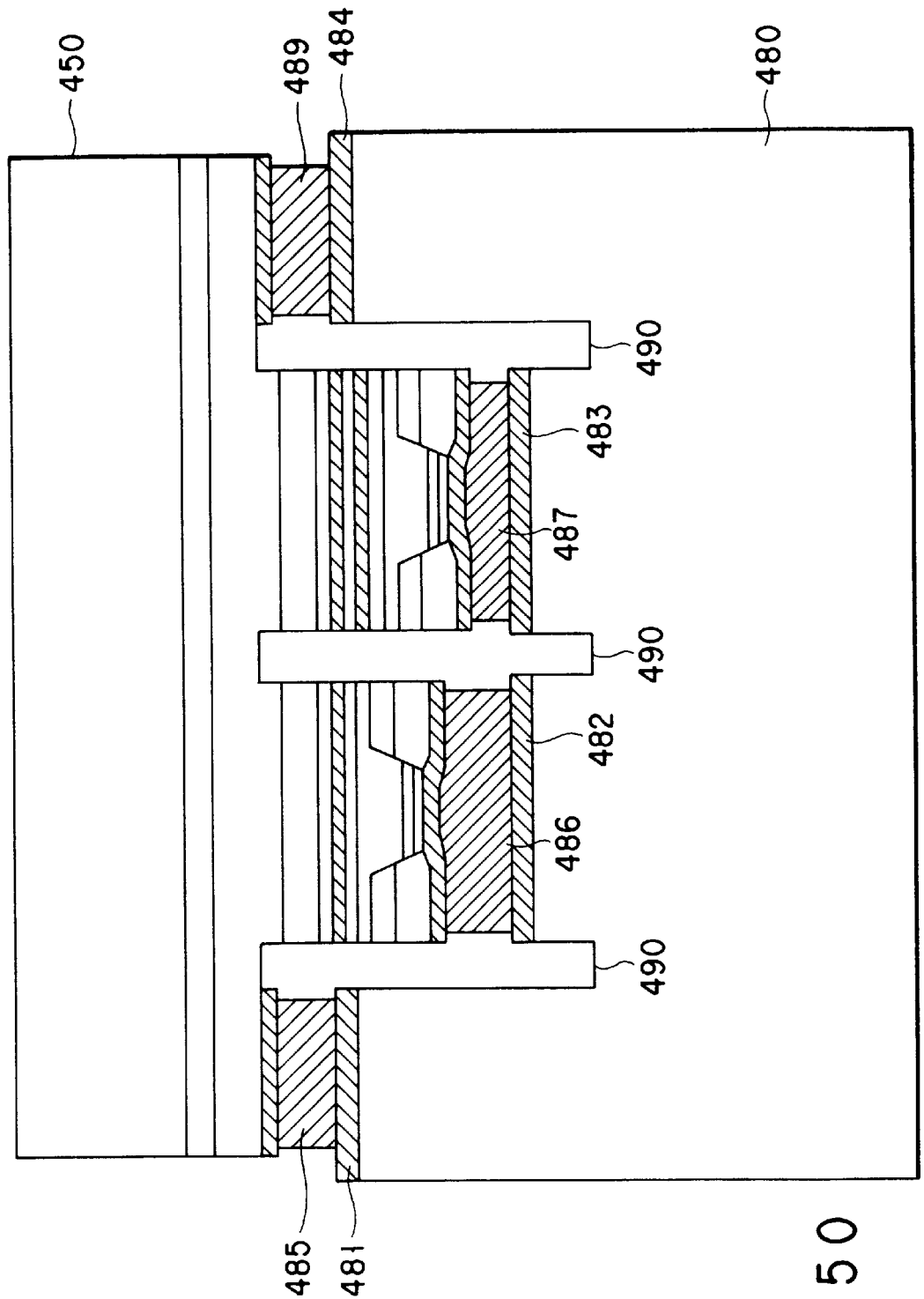
FIG. 50 is a sectional view showing a structure of a semiconductor laser according to a twenty-seventh embodiment of the present invention.

FIG. 50 is a sectional view showing a structure of the semiconductor laser according to the twenty-seventh embodiment of the present invention.

A fundamental structure of a semiconductor laser in the embodiment is similar to the embodiment shown in FIG. 48 and, thereby, a detailed description of the structure is omitted. In the embodiment, an example of a junction face down mounting is shown.

In the figure, 480 indicates a heat sink. As the heat sink 480, a material having a high thermal conductivity, such as Cu, BN, diamond or the like, is effectively used. The heat sink 480 has steps as shown in the figure and metal layers (for example, Ti/Pt/Au layer) 481 to 484 is formed on the steps in metallization. 490 indicates a separation groove. Respective metallized layers and electrodes of the semiconductor laser are bonded by compression with the use of a solder (485 to 489) such as AuSn or the like.

A thermal resistance of a device is reduced and oscillation at higher temperature becomes possible by adopting a junction face down mounting as is in the embodiment.

The present invention is not intended to be restricted to the respective embodiments already described above, but changes in and modifications of the embodiments can be executed without any departures from the scope of the appended claims of the present application.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A semiconductor laser made of a III–V compound semiconductor including nitrogen, comprising:

a substrate;

a first-conductivity-type cladding layer made of $In_xGa_yAl_zB_{1-x-y-z}N$ ($0 \leq x, y, z, x+y+z \leq 1$) formed on or above the substrate;

a core region formed on the first-conductivity-type cladding layer, said core region including at least an active layer;

a second-conductivity-type cladding layer made of $In_xGa_yAl_zB_{1-x-y-z}N$ ($0 \leq x, y, z, x+y+z \leq 1$) formed on the core region;

a double heterostructure composed of the first-conductivity-type cladding layer, the core region and the second-conductivity-type cladding layer;

a second-conductivity-type contact layer formed on or above the second-conductivity-type cladding layer;

a first electrode formed on the second-conductivity-type contact layer which is arranged on the second-conductivity-type cladding layer side; and a second electrode arranged on the first-conductivity-type cladding layer side, wherein a total thickness of the active layer is less than 0.05 µm and an Al compositional ratio $x_{Al}$ of each of the cladding layers, an average In compositional ratio $y_{In}$ of a core region, a sum of both compositional ratios $\Delta x$ ($=x_{Al}+y_{In}$), a total thickness $H_{core}$ of the core region and a thickness $H_{clad}$ of each of the cladding layers satisfy the following relation in reference to an oscillation wavelength λ:

$$\Delta x \cdot (H_{core}/\lambda) \cdot (H_{clad}/\lambda) \geq 0.08.$$

2. A semiconductor laser according to claim 1, wherein active layer in the core region is a single-quantum-well or a multi-quantum-well at least composed of: a well layer made of $In_aGa_bAl_cB_{1-a-b-c}N$ ($0 \leq a, b, c, a+b+c \leq 1$); and a barrier layer made of $In_e Ga_fAl_gB_{1-e-f-g}N$ ($0 \leq e, f, g, e+f+g \leq 1$).

3. A semiconductor laser according to claim 1, wherein a total thickness of the active layer is 0.045 µm or less.

4. A semiconductor laser according to claim 1, wherein an Al compositional ratio $x_{Al}$ of each of the cladding layers, an average In compositional ratio $y_{In}$ of a core region, a sum of both compositional ratios $\Delta x$ ($=x_{Al}+y_{In}$), a total thickness $H_{core}$ of the core region and a thickness $H_{clad}$ of each of the cladding layers satisfy the following relation in reference to an oscillation wavelength λ:

$$\Delta x \cdot (H_{core}/\lambda) \cdot (H_{clad}/\lambda) \geq 0.1.$$

5. A semiconductor laser according to claim 1, wherein an Al compositional ratio $x_{Al}$ of each of the cladding layers, an average In compositional ratio $y_{In}$ of a core region, a sum of both compositional ratios $\Delta x$ ($=x_{Al}+y_{In}$), a total thickness $H_{core}$ of the core region and a thickness $H_{clad}$ of each of the cladding layers satisfy the following relation in reference to an oscillation wavelength λ:

$$\Delta x \cdot (H_{core}/\lambda) \cdot (H_{clad}/\lambda) \leq 0.2.$$

6. A semiconductor laser according to claim 1, wherein an Al compositional ratio $x_{Al}$ of each of the cladding layers, an average In compositional ratio $y_{In}$ of a core region, a sum of both compositional ratios $\Delta x$ ($=x_{Al}+y_{In}$), a total thickness $H_{core}$ of the core region and a thickness $H_{clad}$ of each of the cladding layers satisfy the following relation in reference to an oscillation wavelength λ:

$$\Delta x \cdot (H_{core}/\lambda) \cdot (H_{clad}/\lambda) \leq 0.15.$$

7. A semiconductor laser according to claim 1, wherein an Al compositional ratio $x_{Al}$ of each of the cladding layers and a thickness $H_{clad}$ of thereof satisfy the following relation:

$$x_{Al}H_{clad} \leq 0.1 \text{ µm}.$$

8. A semiconductor laser according to claim 1, wherein an Al compositional ratio $x_{Al}$ of each of the cladding layers and a thickness $H_{clad}$ of thereof satisfy the following relation:

$$x_{Al}H_{clad} \leq 0.06 \text{ µm}.$$

9. A semiconductor laser according to claim 1, wherein the core region includes a plurality of waveguide layers made of $In_uGa_vAl_wB_{1-u-v-w}N$ ($0<u \leq 1$, $0 \leq v<1$, $0 \leq w<1$) formed in such a manner that the active region lies between the waveguide layers.

10. A semiconductor laser according to claim 1, wherein an absorption coefficient of the contact layer is 100 cm$^{-1}$ or more.

11. A semiconductor laser according to claim 1, wherein an absorption coefficient of the contact layer is 500 cm$^{-1}$ or more.

* * * * *